US011769705B2

(12) United States Patent
Matsuura et al.

(10) Patent No.: US 11,769,705 B2
(45) Date of Patent: Sep. 26, 2023

(54) CHIP COMPONENT AND METHOD OF MANUFACTURING THE SAME

(71) Applicant: ROHM Co., LTD., Kyoto (JP)

(72) Inventors: Katsuya Matsuura, Kyoto (JP); Yasuhiro Kondo, Kyoto (JP); Hideaki Yamaji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 126 days.

(21) Appl. No.: 17/091,031

(22) Filed: Nov. 6, 2020

(65) Prior Publication Data

US 2021/0143074 A1 May 13, 2021

(30) Foreign Application Priority Data

Nov. 7, 2019 (JP) .............................. JP2019-202436

(51) Int. Cl.
*H01L 23/31* (2006.01)
*H01L 21/78* (2006.01)
*H01L 21/56* (2006.01)
*H01L 29/866* (2006.01)
*H01L 49/02* (2006.01)

(52) U.S. Cl.
CPC ........ *H01L 23/3185* (2013.01); *H01L 21/561* (2013.01); *H01L 21/78* (2013.01); *H01L 23/3192* (2013.01); *H01L 23/3178* (2013.01); *H01L 28/20* (2013.01); *H01L 28/60* (2013.01); *H01L 29/866* (2013.01)

(58) Field of Classification Search
None
See application file for complete search history.

(56) References Cited

U.S. PATENT DOCUMENTS

| 2012/0025354 A1* | 2/2012 | Sasaki | H01L 21/561 |
| | | | 257/E23.179 |
| 2014/0048926 A1* | 2/2014 | Wang | H01L 24/94 |
| | | | 257/737 |
| 2015/0137341 A1* | 5/2015 | Liu | H01L 27/14618 |
| | | | 257/692 |
| 2019/0006614 A1* | 1/2019 | Kuroki | H05B 33/28 |

FOREIGN PATENT DOCUMENTS

JP 2008115840 5/2008

* cited by examiner

*Primary Examiner* — Jay C Chang
(74) *Attorney, Agent, or Firm* — CHIP LAW GROUP

(57) ABSTRACT

Disclosed is a chip component including a substrate having a first surface and a second surface on an opposite side from the first surface, and a third surface connecting the first surface and the second surface to each other, an external surface resin configured to cover at least the third surface of the substrate, and a terminal electrode formed on the first surface of the substrate and exposed from the external surface resin. A recessed portion is formed in an end portion of the third surface of the substrate, the end portion being on the first surface side. The external surface resin is embedded in the recessed portion.

16 Claims, 40 Drawing Sheets

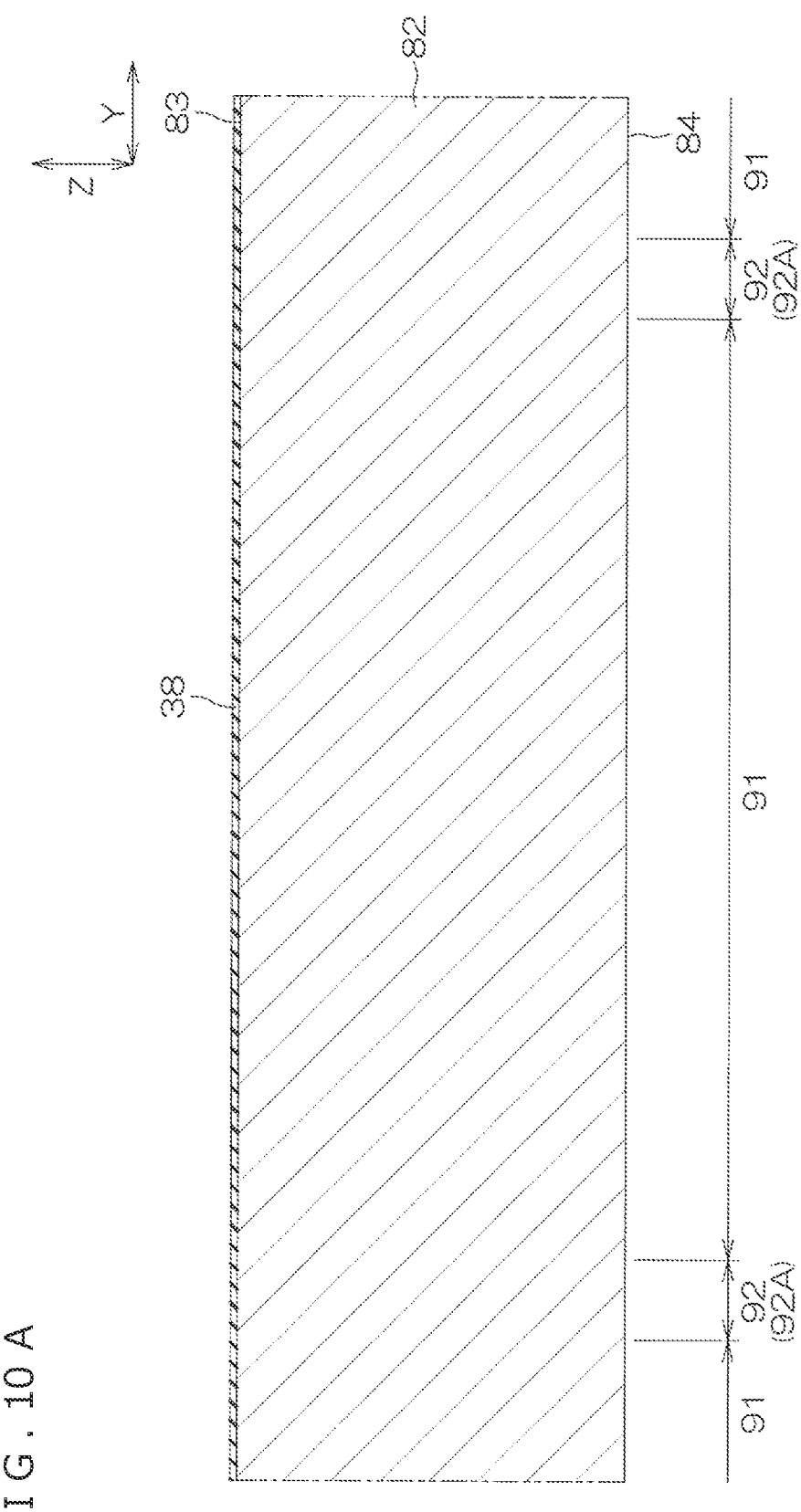

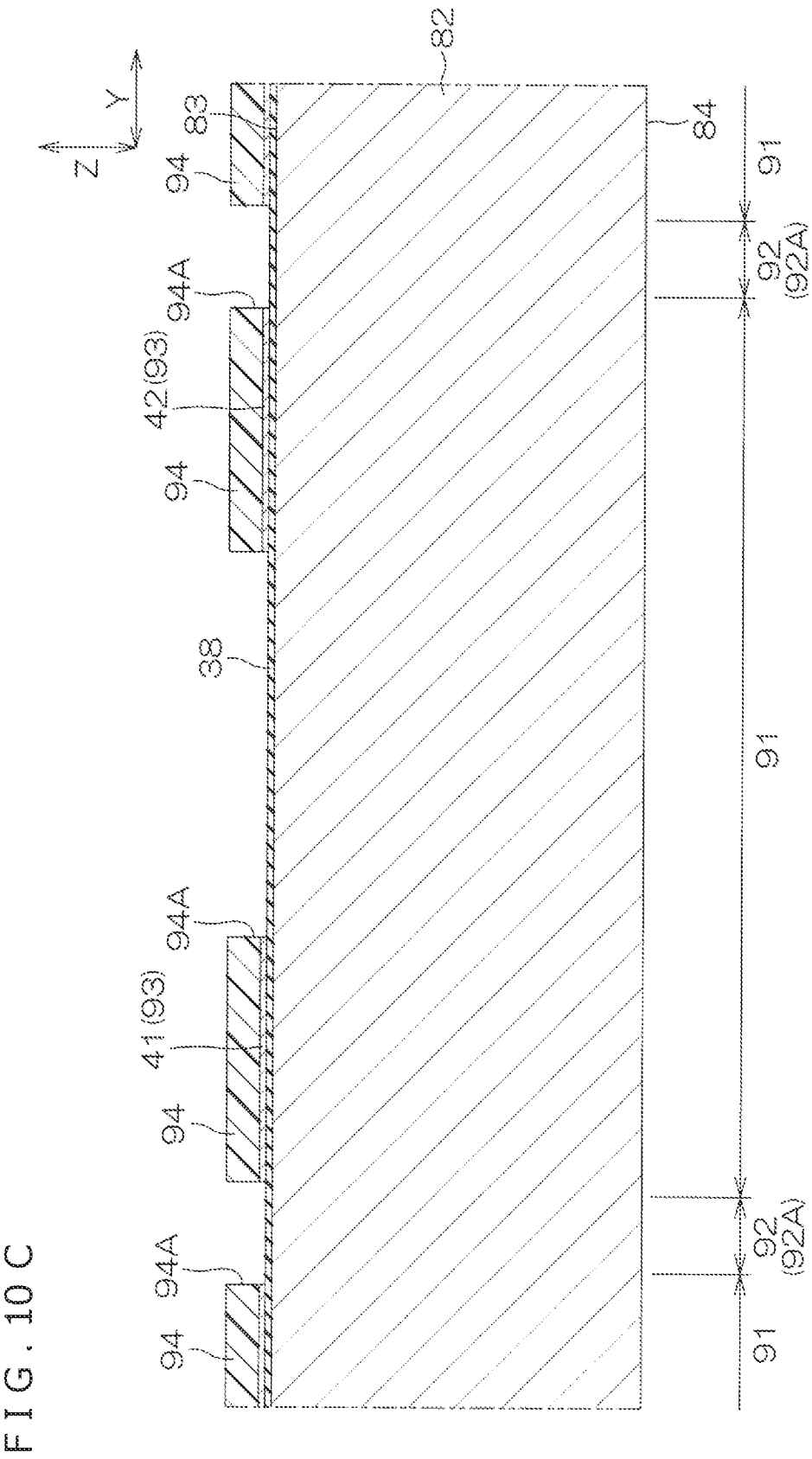

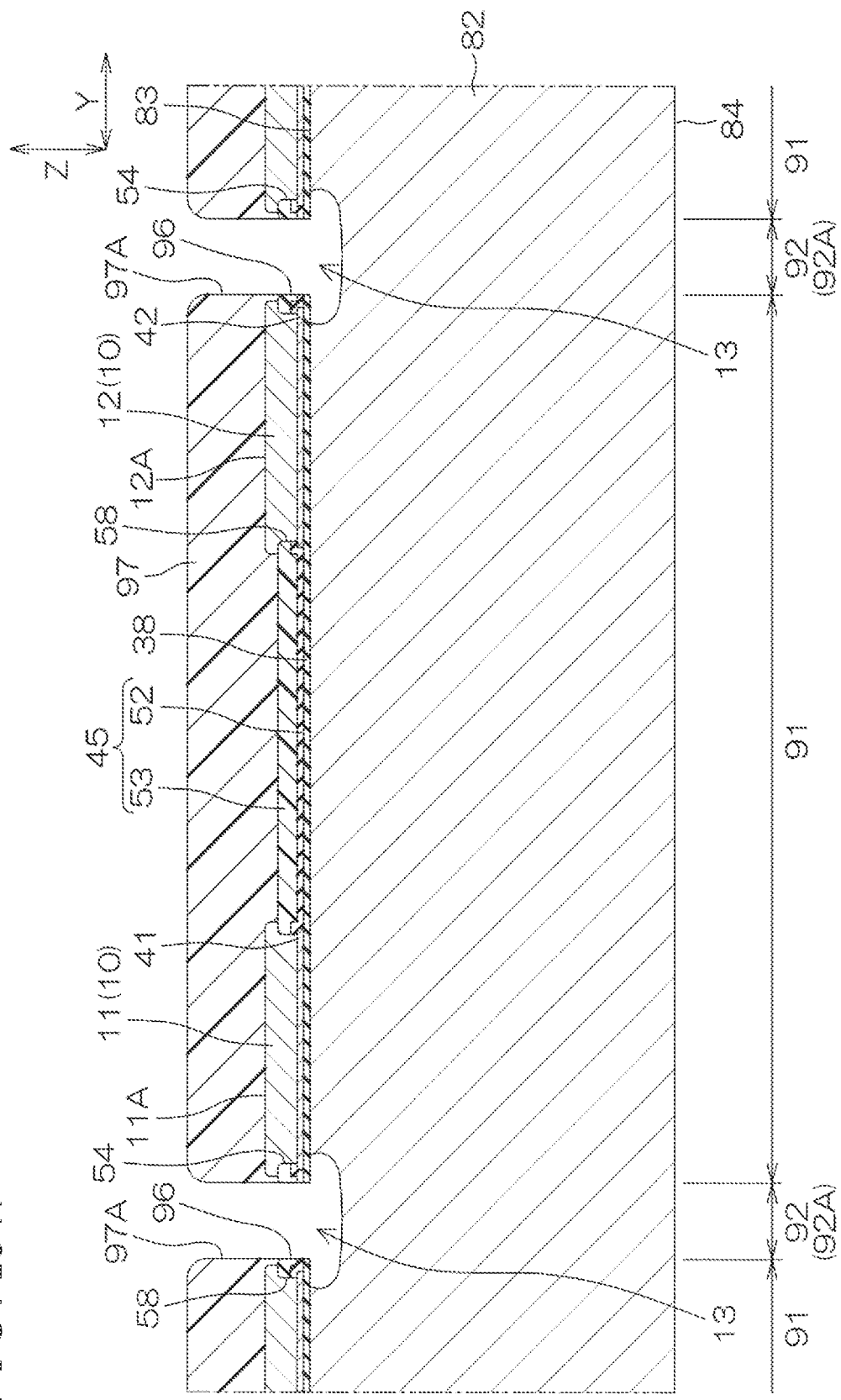

CHIP COMPONENT AND METHOD OF MANUFACTURING THE SAME

CROSS REFERENCE TO RELATED APPLICATIONS

This application claims priority benefit of Japanese Patent Application No. JP 2019-202436 filed in the Japan Patent Office on Nov. 7, 2019. Each of the above-referenced applications is hereby incorporated herein by reference in its entirety.

BACKGROUND

The present disclosure relates to a chip component and a method of manufacturing the same.

Japanese Patent Laid-Open No. Hei 08-115840 discloses a chip inductor. This chip inductor includes a substrate made of an inorganic substance. An inductor conductor layer is formed on the principal surface of the substrate. Terminal electrodes are individually connected to both end portions of the inductor conductor layer.

SUMMARY

In order to utilize advantages as a small electronic component, a chip component is mounted on a connection target in what is generally called a bare chip state in which a chip main body is exposed on the outside. In the case of such a structure, it is difficult to protect the chip main body appropriately from an external force.

On the other hand, even when the chip main body is protected appropriately, it may be necessary to take a measure against a short circuit between solder as a joining material and the substrate of the chip main body at a time of the mounting.

Accordingly, one embodiment of the present disclosure provides a chip component that can protect a chip main body appropriately and improve reliability while utilizing advantages as a small electronic component, and a method of manufacturing the chip component.

According to one example of the present disclosure, there is provided a chip component including a substrate having a first surface and a second surface on an opposite side from the first surface, and a third surface connecting the first surface and the second surface to each other, an external surface resin configured to cover at least the third surface of the substrate, and a terminal electrode formed on the first surface of the substrate and exposed from the external surface resin, a recessed portion being formed in an end portion of the third surface of the substrate, the end portion being on the first surface side, the external surface resin being embedded in the recessed portion.

According to another example of the present disclosure, there is provided a chip component including a substrate having a first surface and a second surface on an opposite side from the first surface, and a third surface connecting the first surface and the second surface to each other, an external surface resin configured to cover at least the third surface of the substrate, and a terminal electrode formed on the first surface of the substrate and exposed from the external surface resin, a recessed portion being formed in an end portion of the third surface of the substrate, the end portion being on the first surface side, an embedding resin being embedded in the recessed portion, the embedding resin being formed of a same material as the external surface resin and being separated from the external surface resin.

According to one example of the present disclosure, there is provided a chip component manufacturing method including in a chip forming region of a base substrate having a first surface in which the chip forming region is set and a second surface on an opposite side from the first surface, forming a terminal electrode on the first surface, forming, in the first surface of the base substrate, a recessed portion bulging outward more than a line demarcating the chip forming region by selectively etching the base substrate from the first surface along the line, forming a groove integrated with the recessed portion by digging down a bottom portion of the recessed portion with a width smaller than the recessed portion in a thickness direction of the base substrate, forming a base resin layer that fills the groove and the recessed portion and covers the chip forming region, removing an unnecessary part of the base resin layer, the unnecessary part covering the chip forming region, such that a part embedded in the groove and the recessed portion remains, grinding the second surface of the base substrate until the base resin layer is exposed, and cutting out a chip component from the base substrate by cutting the base resin layer such that a part of the base resin layer, the part covering an inner surface of the groove, remains.

BRIEF DESCRIPTION OF THE DRAWINGS

FIG. 10A is a sectional view taken along a line X-X illustrated in FIG. 9 and is a sectional view for explaining an example of a method of manufacturing the chip component illustrated in FIG. 1;

FIG. 10C is a sectional view for explaining a process after FIG. 10B;

FIG. 10H is a sectional view for explaining a process after FIG. 10G;

DETAILED DESCRIPTION OF THE PREFERRED EMBODIMENTS

Figure 1:
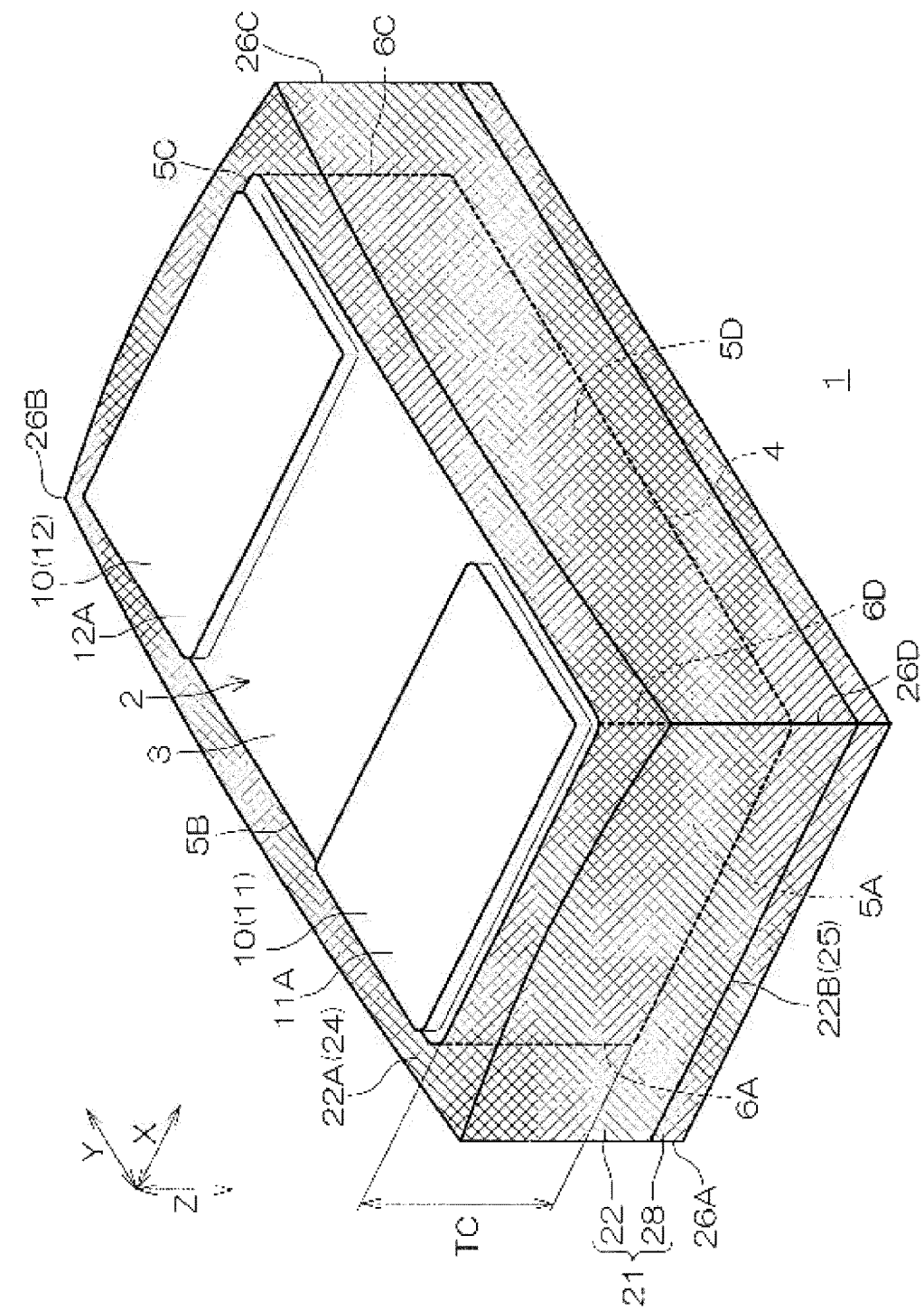
FIG. 1 is a perspective view of a chip component according to a first embodiment as viewed from one angle.

Embodiments will first be listed and described.

A chip component according to an embodiment of the present disclosure includes a substrate having a first surface and a second surface on an opposite side from the first surface, and a third surface connecting the first surface and the second surface to each other, an external surface resin configured to cover at least the third surface of the substrate, and a terminal electrode formed on the first surface of the substrate and exposed from the external surface resin, a recessed portion being formed in an end portion of the third surface of the substrate, the end portion being on the first surface side, the external surface resin being embedded in the recessed portion.

According to this constitution, a chip main body can be protected by the external surface resin while connecting portions of the chip component for a connection target are secured. It is thereby possible to provide the chip component that can protect the chip main body appropriately while utilizing advantages as a small electronic component.

In addition, the recessed portion is formed in the end portion on the first surface side in the third surface of the substrate, and the external surface resin is embedded in the recessed portion. Thus, even when a joining material such as solder or other joining material wets up to the third surface of the substrate during mounting of the chip component, the external surface resin embedded in the recessed portion can prevent contact between the substrate and the joining material. It is thereby possible to provide the chip component having improved reliability.

A chip component according to an embodiment includes a substrate having a first surface and a second surface on an opposite side from the first surface, and a third surface connecting the first surface and the second surface to each other, an external surface resin configured to cover at least the third surface of the substrate, and a terminal electrode formed on the first surface of the substrate and exposed from the external surface resin, a recessed portion being formed in an end portion of the third surface of the substrate, the end portion being on the first surface side, an embedding resin being embedded in the recessed portion, the embedding resin being formed of a same material as the external surface resin and being separated from the external surface resin.

According to this constitution, the external surface resin protects the chip main body while the connecting portions of the chip component for coupling to a connection target are secured. It is thereby possible to provide the chip component that can protect the chip main body appropriately while utilizing advantages as a small electronic component.

In addition, the recessed portion is formed in the end portion in the third surface of the substrate, where the end portion is closer to the first surface than to the second surface. It is preferable for the embedding resin that is embedded in the recessed portion to be formed of the same material as the external surface resin, but optionally, they can be different materials. Thus, even when a joining material such as solder or other joining material wets up to the third surface of the substrate during mounting of the chip component, the embedding resin can prevent contact between the substrate and the joining material. It is thereby possible to provide the chip component with improved reliability.

The chip component according to an embodiment may further include an insulating layer that is formed on the first surface of the substrate and covers the recessed portion. The recessed portion may be demarcated by a recessed surface continuous from the first surface of the substrate and the insulating layer.

In the chip component according to an embodiment, the recessed surface may bulge toward an inside of the substrate from an end edge of the first surface of the substrate according to a sectional view and may have a vertex portion located in a more inward region of the substrate than the end edge of the first surface. In the chip component, the recessed surface may concave toward an inside of the substrate from an end edge of the first surface of the substrate according to a sectional view.

In the chip component according to an embodiment, the recessed portion may be formed in an annular shape enclosing the first surface of the substrate as viewed in plan.

According to this constitution, even when the joining material wets up in any direction from the periphery of the chip component, contact between the substrate and the joining material due to the wetting up can be prevented or hindered.

In the chip component according to an embodiment, the external surface resin may be formed in a film shape that is in direct contact with the third surface of the substrate.

In the chip component according to an embodiment, the first surface of the substrate may be a connecting surface that faces a connection target when the chip component is connected to the connection target.

In the chip component according to an embodiment, the external surface resin may include a first part that covers the third surface of the substrate.

In the chip component according to an embodiment, the first part of the external surface resin may have an end surface located on the second surface side of the substrate with respect to a surface of the terminal electrode.

In the chip component according to an embodiment, the external surface resin may include a second part that covers the second surface of the substrate.

In the chip component according to an embodiment, the second surface of the substrate may be a ground surface having a grinding trace, and the second part of the external surface resin may fill the grinding trace and cover the second surface of the substrate.

A chip component manufacturing method according to an embodiment includes a step of, in a chip forming region of a base substrate having a first surface in which the chip forming region is set and a second surface on an opposite side from the first surface, forming a terminal electrode on the first surface, a step of forming, in the first surface of the base substrate, a recessed portion bulging outward more than a line demarcating the chip forming region by selectively etching the base substrate from the first surface along the line, a step of forming a groove integrated with the recessed portion by digging down a bottom portion of the recessed portion with a width smaller than the recessed portion in a thickness direction of the base substrate, a step of forming a base resin layer that fills the groove and the recessed portion and covers the chip forming region, a step of removing an unnecessary part of the base resin layer, the unnecessary part covering the chip forming region, such that a part embedded in the groove and the recessed portion remains, a step of grinding the second surface of the base substrate until the base resin layer is exposed, and a step of cutting out a chip component from the base substrate by cutting the base resin layer such that a part of the base resin layer, the part covering an inner surface of the groove, remains.

The chip component can be manufactured by this method.

In the chip component manufacturing method according to an embodiment, the step of removing the unnecessary part of the base resin layer may remove the unnecessary part of the base resin layer by wiping away the unnecessary part of the base resin layer.

In the chip component manufacturing method according to an embodiment, the step of grinding the second surface of the base substrate may be performed after the step of removing the unnecessary part of the base resin layer.

The chip component manufacturing method according to an embodiment may further include a step of forming a second base resin layer covering the second surface of the base substrate after the step of grinding the second surface of the base substrate and before the step of cutting out the chip component, and the step of cutting out the chip component may cut the base resin layer and the second base resin layer.

DETAILED DESCRIPTION OF EMBODIMENTS OF PRESENT DISCLOSURE

Embodiments will next be described in detail with reference to the accompanying drawings.

Figure 2:
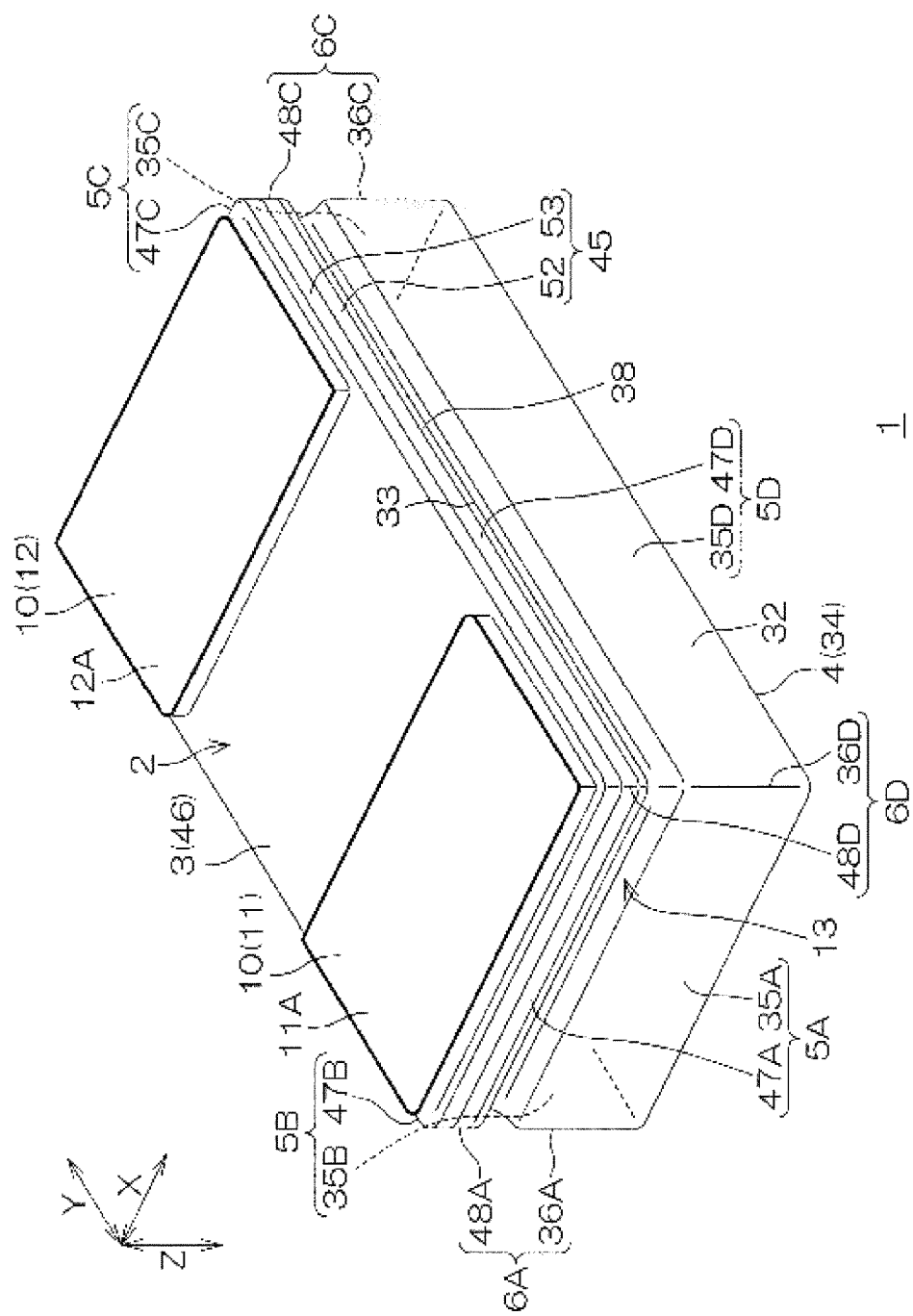
FIG. 2 is a perspective view illustrating a chip main body with an external surface resin removed from FIG. 1.
Figure 3:
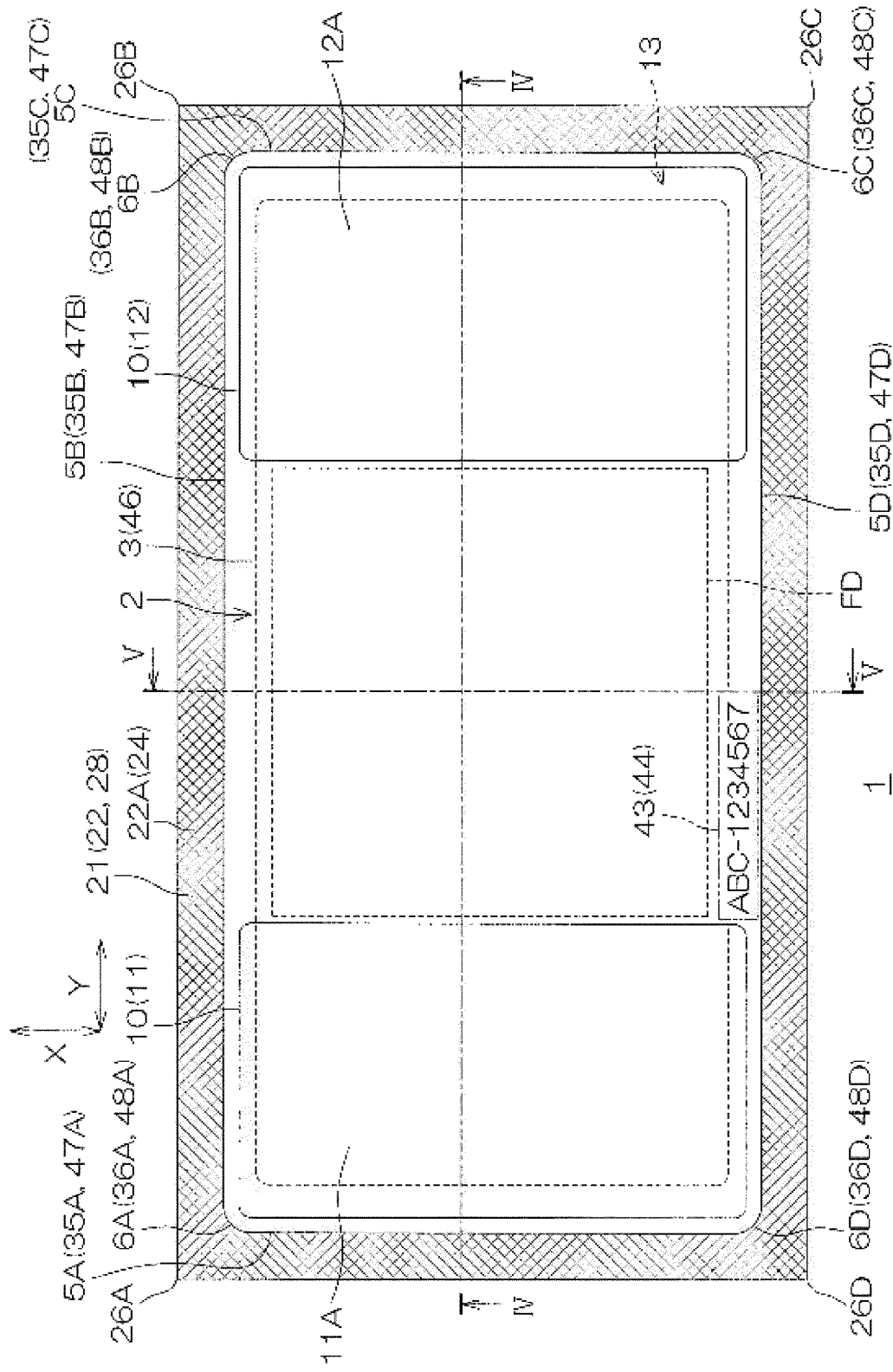
FIG. 3 is a plan view of the chip component illustrated in FIG. 1.

FIG. 1 is a perspective view of a chip component 1 according to a first embodiment as viewed from one angle. FIG. 2 is a perspective view illustrating a chip main body 2 with an external surface resin 21 removed from FIG. 1. FIG. 3 is a plan view of the chip component 1 illustrated in FIG. 1.

Figure 4:
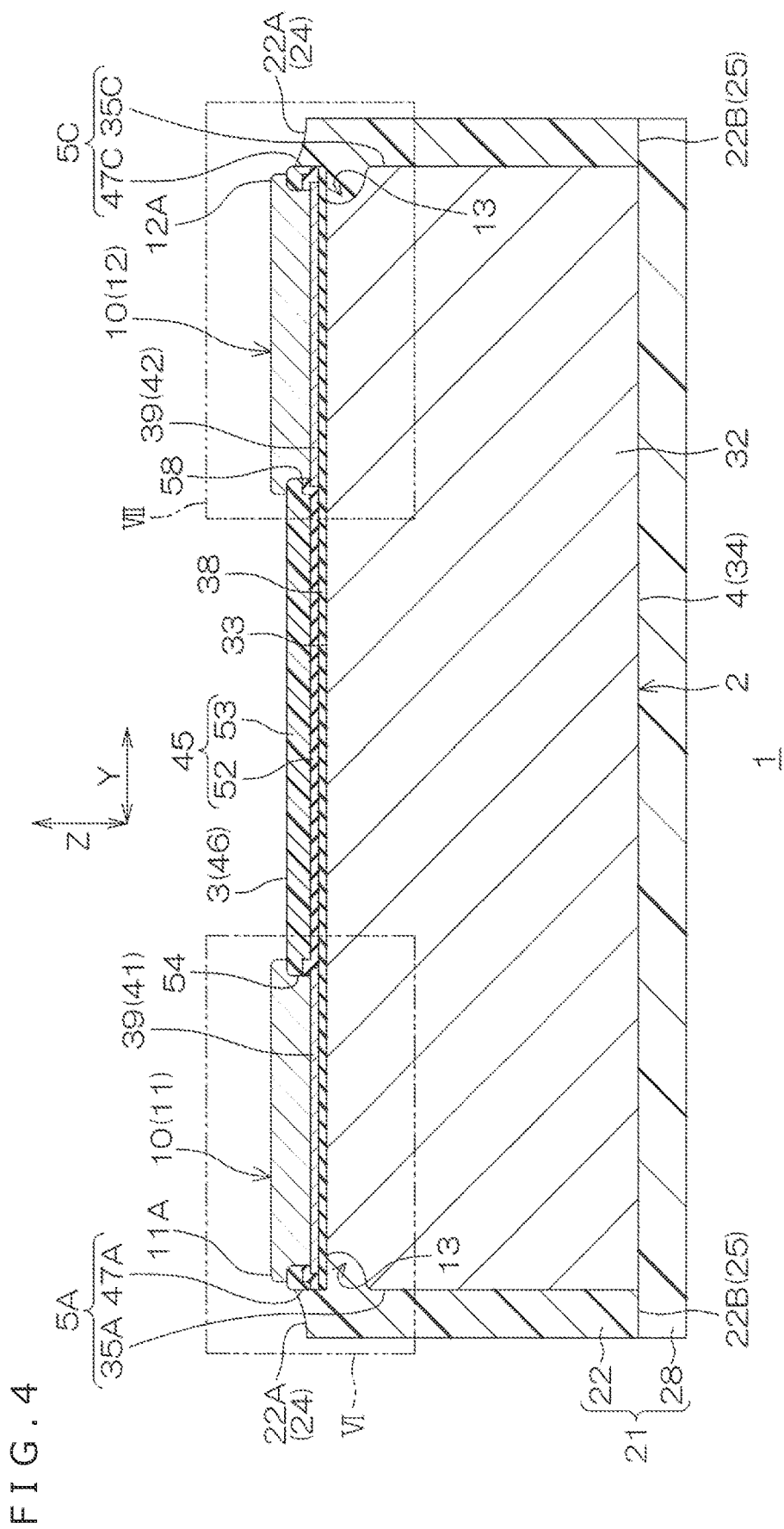
FIG. 4 is a sectional view taken along a line IV-IV illustrated in FIG. 3.
Figure 5:
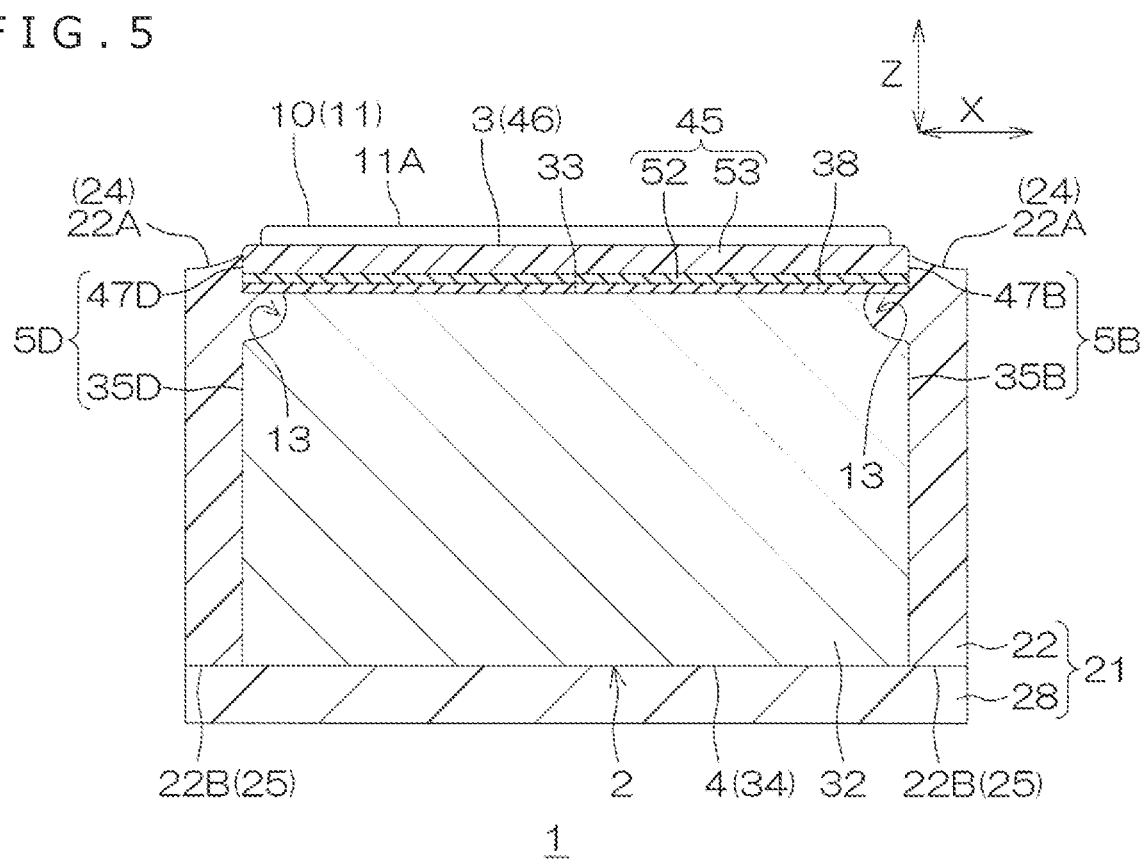
FIG. 5 is a sectional view taken along a line V-V illustrated in FIG. 3.
Figure 6:
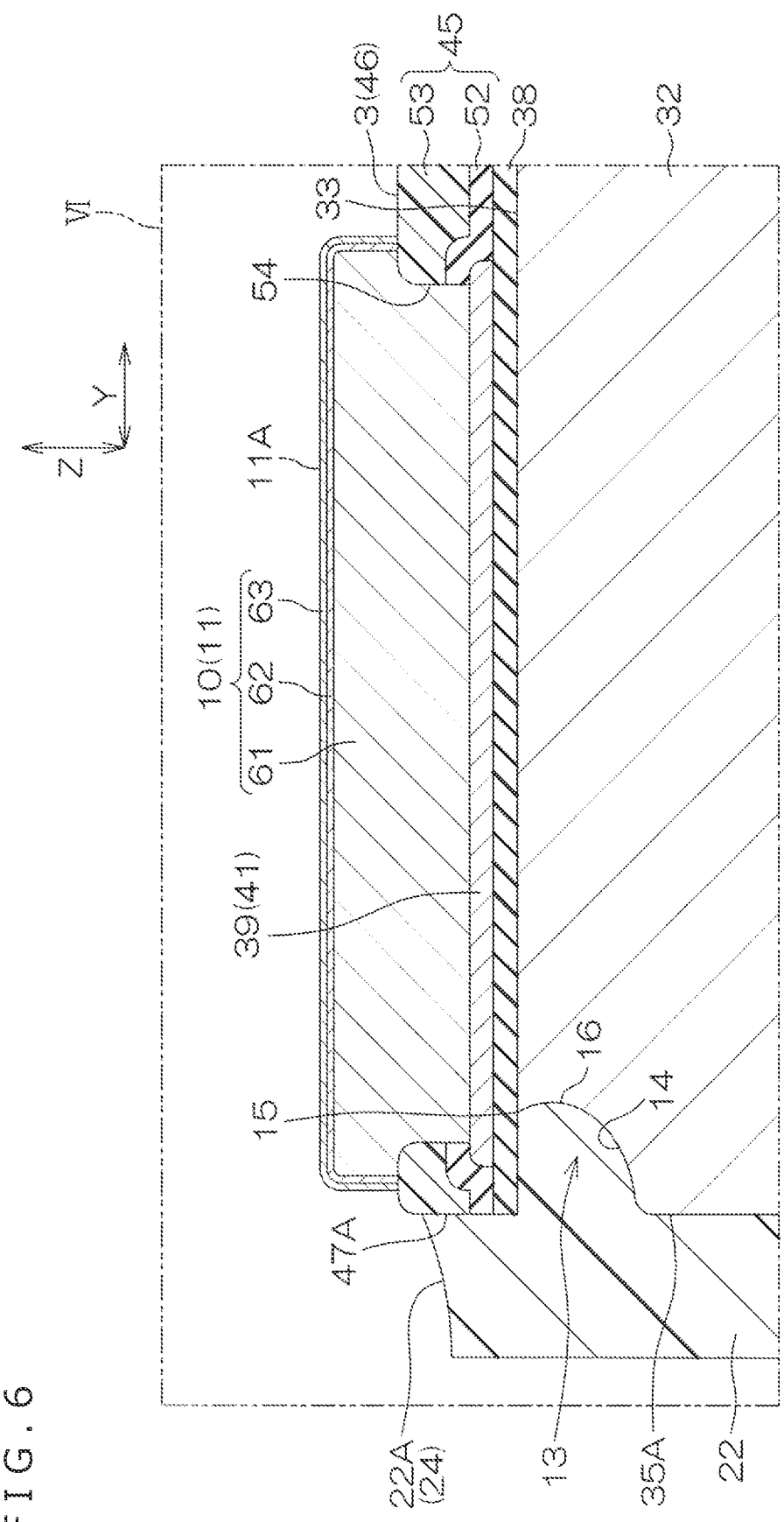
FIG. 6 is an enlarged view of a region VI illustrated in FIG. 4.
Figure 7:
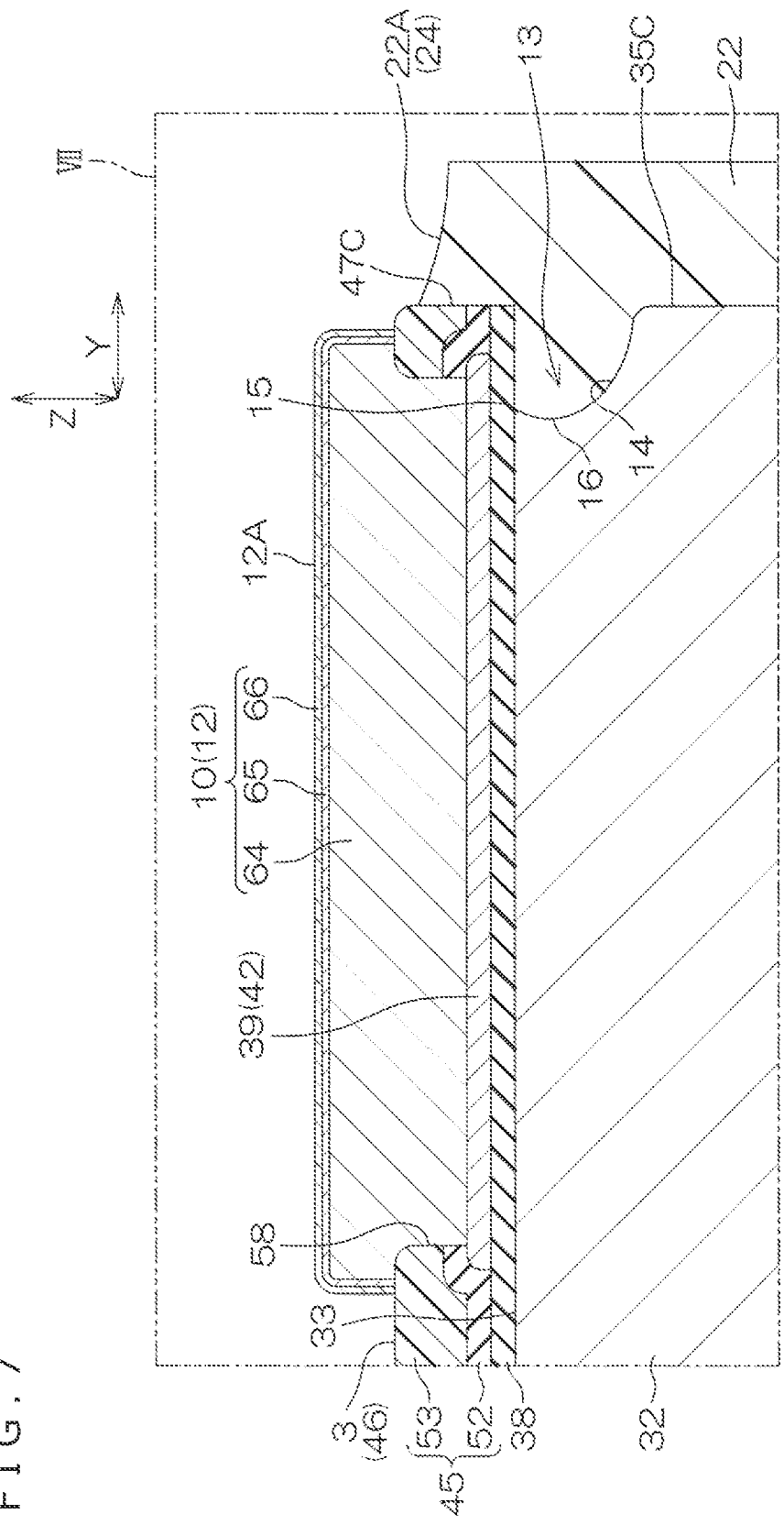
FIG. 7 is an enlarged view of a region VII illustrated in FIG. 4.
Figure 8:
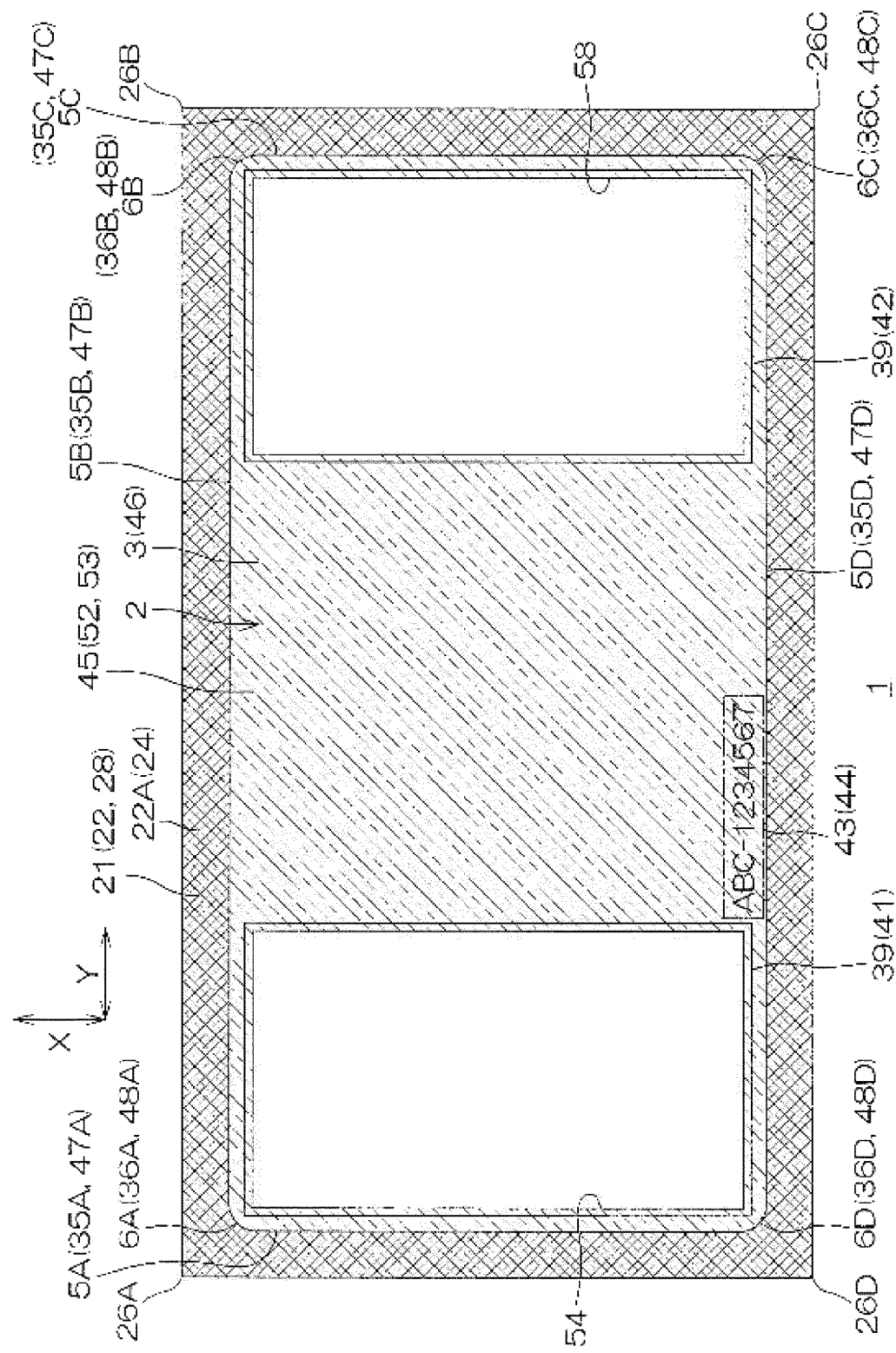
FIG. 8 is a plan view illustrating a structure of an insulating layer with a structure on the insulating layer removed from FIG. 3.

FIG. 4 is a sectional view taken along a line IV-IV illustrated in FIG. 3. FIG. 5 is a sectional view taken along a line V-V illustrated in FIG. 3. FIG. 6 is an enlarged view of a region VI illustrated in FIG. 4. FIG. 7 is an enlarged view of a region VII illustrated in FIG. 4. FIG. 8 is a plan view illustrating a structure of an insulating layer 45 with a structure on the insulating layer 45 removed from FIG. 3.

The chip component 1 is a small electronic component referred to as a 1608 (1.6 mm×0.8 mm) chip, a 1005 (1.0 mm×0.5 mm) chip, a 0603 (0.6 mm×0.3 mm) chip, a 0402 (0.4 mm×0.2 mm) chip, a 03015 (0.3 mm×0.15 mm) chip, or other small chips.

Referring to FIG. 1 and FIG. 2, the chip component 1 includes the chip main body 2 in a rectangular parallelepipedic shape. The chip main body 2 includes a first chip principal surface 3 on one side, a second chip principal surface 4 on another side, and chip side surfaces 5A, 5B, 5C, and 5D connecting the first chip principal surface 3 and the second chip principal surface 4 to each other.

The first chip principal surface 3 and the second chip principal surface 4 are preferably formed in a quadrangular shape (rectangular shape in this example) as viewed in plan from a normal direction Z of the first chip principal surface 3 and the second chip principal surface 4 (hereinafter expressed simply as "as viewed in plan"). The chip side surfaces 5A to 5D extend along the normal direction Z.

The first chip principal surface 3 is a connecting surface, which is a mounting surface configured to be mounted to a connection target and faces the intended connection target such as a mounting board when the first chip principal surface 3 is connected to the connection target. The second chip principal surface 4 is a non-connecting surface or a non-mounting surface on an opposite side from the connecting surface. The second chip principal surface 4 is formed by a ground surface having grinding traces.

The chip side surface 5A and the chip side surface 5C extend along a first direction X and face each other in a second direction Y intersecting the first direction X. The second direction Y is more specifically orthogonal to the first direction X. The chip side surface 5A and the chip side surface 5C form short sides of the chip main body 2. The chip side surface 5B and the chip side surface 5D extend along the second direction Y and face each other in the first direction X. The chip side surface 5B and the chip side surface 5D form long sides of the chip main body 2.

The chip main body 2 includes chip corner portions 6A, 6B, 6C, and 6D that connect the chip side surfaces 5A to 5D to one another. The chip corner portion 6A connects the chip side surface 5A and the chip side surface 5B to each other. The chip corner portion 6B connects the chip side surface 5B and the chip side surface 5C to each other. The chip corner portion 6C connects the chip side surface 5C and the chip side surface 5D to each other. The chip corner portion 6D connects the chip side surface 5D and the chip side surface 5A to each other.

The chip corner portions 6A to 6D in this example are formed, preferably with chamfers, in a protrudingly curved shape facing the outside of the chip main body 2. The chip corner portions 6A to 6D may be C-chamfered or R-chamfered. The chip corner portions 6A to 6D may optionally be angulated.

"0603," "0402," "03015," and the like described above are defined by the length of the long sides of the chip main body 2 and the length of the short sides of the chip main body 2. The length of the long sides of the chip main body 2 may be 0.1 to 2 mm both inclusive. The length of the long sides of the chip main body 2 may be 0.1 to 0.2 mm both inclusive, 0.2 to 0.4 mm both inclusive, 0.4 to 0.6 mm both inclusive, 0.6 to 0.8 mm both inclusive, 0.8 to 1 mm both inclusive, 1 to 1.2 mm both inclusive, 1.2 to 1.4 mm both inclusive, 1.4 to 1.6 mm both inclusive, 1.6 to 1.8 mm both inclusive, or 1.8 to 2 mm both inclusive.

The length of the short sides of the chip main body 2 may be 0.05 to 1 mm both inclusive. The length of the short sides of the chip main body 2 may be 0.05 to 0.1 mm both inclusive, 0.1 to 0.2 mm both inclusive, 0.2 to 0.3 mm both inclusive, 0.3 to 0.4 mm both inclusive, 0.4 to 0.5 mm both inclusive, 0.5 to 0.6 mm both inclusive, 0.6 to 0.7 mm both inclusive, 0.7 to 0.8 mm both inclusive, 0.8 to 0.9 mm both inclusive, or 0.9 to 1 mm both inclusive.

A thickness TC of the chip main body 2 may be 50 to 700 μm both inclusive. The thickness TC may be 50 to 100 μm both inclusive, 100 to 150 μm both inclusive, 150 to 200 μm both inclusive, 200 to 250 μm both inclusive, 250 to 300 μm both inclusive, 300 to 350 μm both inclusive, 350 to 400 μm both inclusive, 400 to 450 μm both inclusive, 450 to 500 μm both inclusive, 500 to 550 μm both inclusive, 550 to 600 μm both inclusive, 600 to 650 μm both inclusive, or 650 to 700 μm both inclusive. The thickness TC is preferably 50 to 350 μm both inclusive.

The chip main body 2 includes a functional device FD. The functional device FD is formed by using a first principal surface 33 of a substrate 32. The functional device FD may include an active device or a passive device. The functional device FD may include at least one of a diode D, a resistance R, a capacitor C, and a coil L. Here, for the convenience of description, the functional device FD is illustrated in a simplified manner by using a broken line in FIG. 3, and a concrete structure of the functional device FD is not illustrated.

The chip main body 2 includes terminal electrodes 10 exposed from the first chip principal surface 3. In this example, a plurality of terminal electrodes 10 are exposed from the first chip principal surface 3. The plurality of terminal electrodes 10 include a first terminal electrode 11 and a second terminal electrode 12. The first terminal electrode 11 and the second terminal electrode 12 are electrically connected to the functional device FD. One of the first terminal electrode 11 and the second terminal electrode 12 supplies a high potential to the functional device FD. The other terminal electrode supplies a low potential to the functional device FD.

The first terminal electrode 11 is exposed from a region on the chip side surface 5A side in the first chip principal surface 3. The first terminal electrode 11 is preferably formed in a rectangular shape extending along the first direction X. The second terminal electrode 12 is exposed from the first chip principal surface 3 at a distance from the first terminal electrode 11. The second terminal electrode 12 is exposed from a region on the chip side surface 5C side in the first chip principal surface 3. The second terminal electrode 12 is preferably formed in a rectangular shape extending along the first direction X.

The first terminal electrode 11 has a first electrode surface 11A to be connected to the connection target. The second terminal electrode 12 has a second electrode surface 12A to be connected to the connection target. Each of the electrode surfaces 11A and 12A extends along the first chip principal surface 3. The first terminal electrode 11 and the second terminal electrode 12 in this example protrude from the first chip principal surface 3 to an opposite side from the second chip principal surface 4. Thus, each of the electrode surfaces 11A and 12A is separated from the first chip principal surface 3 to the opposite side from the second chip principal surface 4.

Referring to FIGS. 1 to 8, the chip component 1 includes the external surface resin 21 that covers the chip main body 2. In FIGS. 1 to 3 and FIG. 8, the external surface resin 21 is represented by hatching for clarification. The external surface resin 21 exposes the first chip principal surface 3 of the chip main body 2 and covers the external surface of the chip main body 2.

The external surface resin 21 is preferably formed in a film shape so as to conform to the external surface of the chip main body 2. The external surface resin 21 in a film shape suppresses an increase in size of the chip component 1 while protecting the chip main body 2. The external surface resin 21 exposes the first terminal electrode 11 and the second terminal electrode 12 from the first chip principal surface 3. The external surface resin 21 is formed at a distance from the first terminal electrode 11 and the second terminal electrode 12.

The external surface resin 21 includes a side surface covering portion 22 as an example of a first part in the embodiment. The side surface covering portion 22 covers the chip side surfaces 5A to 5D of the chip main body 2. The side surface covering portion 22 passes the chip corner portions 6A to 6D and covers the chip side surfaces 5A to 5D en bloc. Thus, the side surface covering portion 22 is preferably formed in an annular shape (more specifically, an endless shape) enclosing the first chip principal surface 3 as viewed in plan.

The side surface covering portion 22 is preferably formed in a film shape so as to conform to the chip side surfaces 5A to 5D. The side surface covering portion 22 has a flat external surface. The external surface of the side surface covering portion 22 extends in parallel with the chip side surfaces 5A to 5D. The external surface of the side surface covering portion 22 in this example is a ground surface having grinding traces.

The side surface covering portion 22 has a first end portion 22A on the first chip principal surface 3 side and a second end portion 22B on the second chip principal surface 4 side. The first end portion 22A is located in a region on the second chip principal surface 4 side with respect to each of the electrode surfaces 11A and 12A. The first end portion 22A in this example is located in a region on the second chip principal surface 4 side with respect to the first chip principal surface 3.

The first end portion 22A may have an inclined surface 24 inclined with respect to the first chip principal surface 3.

More specifically, the inclined surface 24 is inclined downward from the chip main body 2 to the outside. The inclined surface 24 in this example is inclined in a recessed curved shape recessed from the first chip principal surface 3 toward the second chip principal surface 4.

The first end portion 22A may rise, sink, or meander as viewed from a side from the normal direction of the chip side surfaces 5A to 5D (hereinafter expressed simply as "as viewed from the side"). The first end portion 22A may include a rising portion rising from the second chip principal surface 4 toward the first chip principal surface 3 as viewed from the side. The first end portion 22A may include a sinking portion that sinks from the first chip principal surface 3 toward the second chip principal surface 4 as viewed from the side. The first end portion 22A may include a rising portion and a sinking portion as viewed from the side.

The second end portion 22B may be continuous or have a gradually formed surface with the second chip principal surface 4. More specifically, the second end portion 22B has an end surface 25 formed flush with the second chip principal surface 4. The end surface 25 of the second end portion 22B in this example is a ground surface having grinding traces. The grinding traces of the end surface 25 may be continuous with the grinding traces of the second chip principal surface 4.

A thickness TS of the side surface covering portion 22 may be 10 to 100 μm both inclusive. The thickness TS is a thickness along the normal direction of the chip side surfaces 5A to 5D in the side surface covering portion 22. The thickness TS may be 10 to 20 μm both inclusive, 20 to 30 μm both inclusive, 30 to 40 μm both inclusive, 40 to 50 μm both inclusive, 50 to 60 μm both inclusive, 60 to 70 μm both inclusive, 70 to 80 μm both inclusive, 80 to 90 μm both inclusive, or 90 to 100 μm both inclusive. The thickness TS is preferably 20 to 50 μm both inclusive.

The external surface resin 21 includes resin corner portions 26A, 26B, 26C, and 26D. The resin corner portions 26A to 26D cover the chip corner portions 6A to 6D of the chip main body 2. The resin corner portions 26A to 26D are parts where the side surface covering portion 22 is continuous at the chip corner portions 6A to 6D. Unlike the chip corner portions 6A to 6D, the resin corner portions 26A to 26D are angulated. The resin corner portions 26A to 26D are preferably not chamfered. However, the resin corner portions 26A to 26D may be C-chamfered or R-chamfered.

Parts of the first end portion 22A which parts form the resin corner portions 26A to 26D may sink to the second chip principal surface 4 side as compared with parts of the first end portion 22A which parts form regions outside the resin corner portions 26A to 26D.

The external surface resin 21 includes a principal surface covering portion 28 as an example of a second part in the embodiment of the present disclosure. The principal surface covering portion 28 covers the second chip principal surface 4 of the chip main body 2. More specifically, the principal surface covering portion 28 fills the grinding traces and covers the second chip principal surface 4 en bloc.

The principal surface covering portion 28 is preferably formed in a film shape so as to conform to the second chip principal surface 4. The principal surface covering portion 28 has a flat principal surface extending along the second chip principal surface 4. The principal surface of the principal surface covering portion 28 extends in parallel with the second chip principal surface 4. Unlike the side surface covering portion 22, the principal surface of the principal surface covering portion 28 in this example is not a ground surface but is a smooth surface.

The principal surface covering portion 28 covers the side surface covering portion 22. More specifically, the principal surface covering portion 28 covers the second end portion 22B of the side surface covering portion 22. Even more specifically, the principal surface covering portion 28 fills the grinding traces and covers the end surface 25 of the second end portion 22B.

The principal surface covering portion 28 may be integral with the side surface covering portion 22. A peripheral end surface of the principal surface covering portion 28 preferably is continuous with the external surface of the side surface covering portion 22. The peripheral end surface of the principal surface covering portion 28 forms a ground surface together with the external surface of the side surface covering portion 22.

The principal surface covering portion 28 may be integral with the side surface covering portion 22 in a manner in which a boundary between the principal surface covering portion 28 and the side surface covering portion 22 disappears. The principal surface covering portion 28 may be integral with the side surface covering portion 22 in a manner in which the boundary between the principal surface covering portion 28 and the side surface covering portion 22 can visually be recognized in section.

A thickness TM of the principal surface covering portion 28 may be 10 to 100 μm both inclusive. The thickness TM is a thickness along the normal direction of the second chip principal surface 4 in the principal surface covering portion 28. The thickness TM may be 10 to 20 μm both inclusive, 20 to 30 μm both inclusive, 30 to 40 μm both inclusive, 40 to 50 μm both inclusive, 50 to 60 μm both inclusive, 60 to 70 μm both inclusive, 70 to 80 μm both inclusive, 80 to 90 μm both inclusive, or 90 to 100 μm both inclusive. The thickness TM is preferably 20 to 50 μm both inclusive.

The thickness TM of the principal surface covering portion 28 may be equal to the thickness TS of the side surface covering portion 22 or may be different from the thickness TS of the side surface covering portion 22. The thickness TM may exceed the thickness TS. The thickness TM may be less than the thickness TS.

Thus, the chip main body 2 preferably is housed in a resin case in a bottomed angular tube shape demarcated by the external surface resin 21. The resin case includes the principal surface covering portion 28 forming a bottom wall and the side surface covering portion 22 demarcating an opening and forming a side wall. The chip main body 2 is housed in the resin case in an attitude in which the second chip principal surface 4 is opposed to the bottom wall.

The external surface resin 21 may include an opaque resin. The external surface resin 21 may include a thermosetting resin. The external surface resin 21 may include an epoxy resin or a phenolic resin as an example of the thermosetting resin. The external surface resin 21 (thermosetting resin) may include carbon black and be thus colored in black.

The principal surface covering portion 28 may include a same kind of resin material as the side surface covering portion 22, or the principal surface covering portion 28 and the side surface covering portion 22 may include kinds of resin materials different from each other. A resin filler of the principal surface covering portion 28 may have a particle diameter different from that of a resin filler of the side surface covering portion 22.

Referring to FIG. 2, the chip main body 2 includes the substrate 32. More specifically, the substrate 32 includes the first principal surface 33 on one side, a second principal surface 34 on another side, and side surfaces 35A, 35B, 35C, and 35D as an example of a third surface in the embodiment of the present disclosure, the side surfaces 35A, 35B, 35C, and 35D connecting the first principal surface 33 and the second principal surface 34 to each other. The first principal surface 33 and the second principal surface 34 are formed in a quadrangular shape (rectangular shape in this example) as viewed in plan. The side surfaces 35A to 35D extend along the normal direction Z.

The first principal surface 33 of the substrate 32 is a device formation surface on which the functional device FD is formed. The functional device FD is formed on a surface portion of the first principal surface 33 and/or the first principal surface 33. The second principal surface 34 forms the second chip principal surface 4 of the chip main body 2. That is, the second principal surface 34 of the substrate 32 is formed by a ground surface having grinding traces.

The side surfaces 35A to 35D respectively form parts of the chip side surfaces 5A to 5D of the chip main body 2. The substrate 32 includes corner portions 36A, 36B, 36C, and 36D connecting the side surfaces 35A to 35D to one another. The corner portions 36A to 36D respectively form parts of the chip corner portions 6A to 6D of the chip main body 2.

A recessed portion 13 is formed in end portions in the side surfaces 35A to 35D of the substrate 32, where the end portions are closer to the first principal surface 33 than to the second principal surface 34. As illustrated in FIG. 2 and FIG. 3, the recessed portion 13 is preferably formed integrally over the entire perimeter of the side surfaces 35A to 35D. Thus, the recessed portion 13 is preferably formed in an annular shape enclosing the first principal surface 33 of the substrate 32 as viewed in plan.

The recessed portion 13 may have a recessed surface 14 continuous from the first principal surface 33 of the substrate 32. As illustrated in FIG. 6 and FIG. 7, the recessed surface 14 bulges toward the inside of the substrate 32 from an end edge 15 of the first principal surface 33 of the substrate 32 as viewed in section. Thus, the recessed surface 14 has a vertex portion 16 located in a more inward region of the substrate 32 than the end edge 15 of the first principal surface 33 of the substrate 32.

A thickness Tsub of the substrate 32 may be 10 to 650 μm both inclusive. The thickness Tsub may be 10 to 50 μm both inclusive, 50 to 100 μm both inclusive, 100 to 150 μm both inclusive, 150 to 200 μm both inclusive, 200 to 250 μm both inclusive, 250 to 300 μm both inclusive, 300 to 350 μm both inclusive, 350 to 400 μm both inclusive, 400 to 450 μm both inclusive, 450 to 500 μm both inclusive, 500 to 550 μm both inclusive, 550 to 600 μm both inclusive, or 600 to 650 μm both inclusive. The thickness Tsub is preferably 30 to 500 μm both inclusive.

The chip main body 2 may include a principal surface insulating layer 38 that covers the first principal surface 33 of the substrate 32. A peripheral edge portion of the principal surface insulating layer 38 projects from the end edge 15 of the first principal surface 33 of the substrate 32 to the outside. The peripheral edge portion of the principal surface insulating layer 38 in this example projects in a flange shape from the annular end edge 15. Thus, the recessed portion 13 is covered by the peripheral edge portion of the principal surface insulating layer 38. Accordingly, the recessed portion 13 may be defined as a hollow portion demarcated (for example, surrounded) by the recessed surface 14 and the peripheral edge portion of the principal surface insulating layer 38. In addition, the peripheral edge portion of the principal surface insulating layer 38 may form parts of the chip side surfaces 5A to 5D of the chip main body 2.

The principal surface insulating layer 38 may have a single layer structure including a silicon oxide layer or a silicon nitride layer. The principal surface insulating layer 38 may have a laminated structure including a silicon oxide layer and a silicon nitride layer laminated in any order. The principal surface insulating layer 38 in this example has a single layer structure formed of a silicon oxide layer.

The chip main body 2 includes an internal electrode 39 formed on the principal surface insulating layer 38. The internal electrode 39 includes a first pad electrode 41 and a second pad electrode 42. The first pad electrode 41 and the second pad electrode 42 are electrically connected to the functional device FD.

The first pad electrode 41 is located in a region on the chip side surface 5A side. The first pad electrode 41 is formed in a rectangular shape extending along the first direction X. The second pad electrode 42 is formed in a region on the chip side surface 5C side at a distance from the first pad electrode 41. The second pad electrode 42 is formed in a rectangular shape extending along the first direction X.

The first pad electrode 41 may include at least one kind among aluminum, copper, an aluminum alloy, and a copper alloy. The first pad electrode 41 may include at least one kind among an Al—Si—Cu alloy, an Al—Si alloy, and an Al—Cu (aluminum-copper) alloy.

The second pad electrode 42 may include at least one kind among aluminum, copper, an aluminum alloy, and a copper alloy. The second pad electrode 42 may include at least one kind among an Al—Si—Cu alloy, an Al—Si alloy, and an Al—Cu (aluminum-copper) alloy.

The second pad electrode 42 may include a same kind of conductive material as the first pad electrode 41 or may include a conductive material different from that of the first pad electrode 41. The second pad electrode 42 in this example is formed of a same kind of conductive material as the first pad electrode 41.

The chip main body 2 may include a marking 43 formed on the principal surface insulating layer 38. The marking 43 is formed in any region on the principal surface insulating layer 38. The marking 43 is preferably formed at a distance from the functional device FD as viewed in plan. The marking 43 is preferably formed in a region not overlapping the functional device FD as viewed in plan. The marking 43 in this example is formed in a region along the side surface 35D of the substrate 32 as viewed in plan.

FIG. 3 and FIG. 8 illustrate the marking 43 including characters and a symbol "ABC-1234567" for convenience. However, the marking 43 actually illustrates a logotype mark, a picture, characters, symbols, various pieces of information related to specifications of the chip component 1, various pieces of information as a combination thereof, or other indicating symbols.

The various pieces of information related to the specifications of the chip component 1 may include a model number, a size, a shape, a manufacturing date, a rated voltage, a rated current, or other information of the chip component 1. The marking 43 enhances the convenience of the chip component 1. The presence or absence of the marking 43 is selected freely. A chip component 1 having no marking 43 may be employed.

The marking 43 in this example includes a marking conductor layer 44. The marking conductor layer 44 may include at least one kind among aluminum, copper, an aluminum alloy, and a copper alloy. The marking conductor layer 44 may include at least one kind among an Al—Si—

Cu alloy, an Al—Si alloy, and an Al—Cu alloy. The marking conductor layer 44 may include a same kind of conductive material as the first pad electrode 41 and/or the second pad electrode 42.

The chip main body 2 may include the insulating layer 45 formed on the principal surface insulating layer 38. The insulating layer 45 is indicated by hatching in FIG. 8. The insulating layer 45 covers the whole of the marking 43 and covers peripheral edge portions of the internal electrode 39. The insulating layer 45 includes an insulating principal surface 46 and insulating side surfaces 47A, 47B, 47C, and 47D. The insulating principal surface 46 forms the first chip principal surface 3 of the chip main body 2. The insulating side surfaces 47A to 47D respectively form parts of the chip side surfaces 5A to 5D of the chip main body 2.

The insulating principal surface 46 includes insulating corner portions 48A, 48B, 48C, and 48D that connect the insulating side surfaces 47A to 47D to one another. The insulating corner portions 48A to 48D respectively form parts of the chip corner portions 6A to 6D of the chip main body 2.

The insulating side surfaces 47A to 47D may be formed on same planes as the side surfaces 35A to 35D of the substrate 32. The insulating side surfaces 47A to 47D are separated from the side surfaces 35A to 35D of the substrate 32 with the recessed portion 13 interposed therebetween in the thickness direction of the substrate 32. Incidentally, the insulating side surfaces 47A to 47D may be formed in inward regions of the substrate 32 so as to be at a distance from the side surfaces 35A to 35D of the substrate 32. In this case, the first principal surface 33 (principal surface insulating layer 38) of the substrate 32 may be exposed.

The insulating layer 45 is preferably formed by a material that transmits light so that the marking 43 can visually be recognized. The insulating layer 45 may include a transparent insulating material or a translucent insulating material. The insulating layer 45 in this example has a laminated structure including a passivation layer 52 and a resin layer 53.

The passivation layer 52 may have a single layer structure including a silicon oxide layer or a silicon nitride layer. The passivation layer 52 may have a laminated structure including a silicon oxide layer and a silicon nitride layer laminated in any order. The passivation layer 52 in this example has a single layer structure formed of a silicon nitride layer.

The resin layer 53 may include a photosensitive resin of a negative type or a positive type. The resin layer 53 in this example includes polyimide as an example of a negative type photosensitive resin. The resin layer 53 may include polybenzoxazole as an example of a positive type photosensitive resin.

Referring to FIGS. 6 to 8, the insulating layer 45 includes a first pad opening 54. The first pad opening 54 exposes the first pad electrode 41. More specifically, the first pad opening 54 is formed in a quadrangular shape as viewed in plan which quadrangular shape exposes a central portion of the first pad electrode 41.

Referring to FIGS. 6 to 8, the insulating layer 45 includes a second pad opening 58. The second pad opening 58 is formed at a distance from the first pad opening 54, and exposes the second pad electrode 42. More specifically, the second pad opening 58 is formed in a quadrangular shape as viewed in plan which quadrangular shape exposes a central portion of the second pad electrode 42.

Referring to FIG. 6, the above-described first terminal electrode 11 is embedded in the first pad opening 54. The first terminal electrode 11 is electrically connected to the first pad electrode 41 in the first pad opening 54. Thus, an electric signal input to the first terminal electrode 11 is transmitted to the functional device FD via the first pad electrode 41.

The first terminal electrode 11 in this example has a laminated structure including a plurality of electrode layers. The first terminal electrode 11 in this example has a laminated structure including a first nickel (Ni) layer 61, a first palladium (Pd) layer 62, and a first gold (Au) layer 63 laminated in this order from the chip main body 2 side.

The first Ni layer 61 refills the first pad opening 54 and protrudes above the insulating layer 45 (the insulating principal surface 46, the first chip principal surface 3). The first Pd layer 62 covers the external surface of the first Ni layer 61. The first Pd layer 62 is preferably formed in a film shape so as to conform to the external surface of the first Ni layer 61. The first Pd layer 62 is in contact with the insulating layer 45 at a peripheral edge portion of the first Ni layer 61.

The first Au layer 63 covers the external surface of the first Pd layer 62. The first Au layer 63 is preferably formed in a film shape so as to conform to the external surface of the first Pd layer 62. The first Au layer 63 is in contact with the insulating layer 45 at a peripheral edge portion of the first Pd layer 62. The first Au layer 63 forms the first electrode surface 11A of the first terminal electrode 11.

Referring to FIG. 7, the above-described second terminal electrode 12 is embedded in the second pad opening 58. The second terminal electrode 12 is electrically connected to the second pad electrode 42 in the second pad opening 58. Thus, an electric signal input to the second terminal electrode 12 is transmitted to the functional device FD via the second pad electrode 42.

The second terminal electrode 12 in this example has a laminated structure including a plurality of electrode layers. The second terminal electrode 12 in this example has a laminated structure including a second nickel (Ni) layer 64, a second palladium (Pd) layer 65, and a second gold (Au) layer 66 laminated in this order from the chip main body 2 side.

The second Ni layer 64 refills the second pad opening 58 and protrudes above the insulating layer 45 (the insulating principal surface 46, the first chip principal surface 3). The second Pd layer 65 covers the external surface of the second Ni layer 64. The second Pd layer 65 is preferably formed in a film shape so as to conform to the external surface of the second Ni layer 64. The second Pd layer 65 is in contact with the insulating layer 45 at a peripheral edge portion of the second Ni layer 64.

The second Au layer 66 covers the external surface of the second Pd layer 65. The second Au layer 66 is preferably formed in a film shape so as to conform to the external surface of the second Pd layer 65. The second Au layer 66 is in contact with the insulating layer 45 at a peripheral edge portion of the second Pd layer 65. The second Au layer 66 forms the second electrode surface 12A of the second terminal electrode 12.

The above-described external surface resin 21 covers the substrate 32. More specifically, the external surface resin 21 covers the side surfaces 35A to 35D of the substrate 32 and the insulating side surfaces 47A to 47D of the insulating layer 45.

In addition, the external surface resin 21 is embedded in the recessed portion 13 in the side surfaces 35A to 35D of the substrate 32. More specifically, the side surface covering portion 22 of the external surface resin 21 straddles a part on the first chip principal surface 3 side (upper side) (the principal surface insulating layer 38 and the insulating layer 45 in this example) and the side surfaces 35A to 35D of the substrate 32 on the second chip principal surface 4 side (lower side) with the recessed portion 13 interposed therebetween in the thickness direction of the substrate 32. Thus, the side surface covering portion 22 is embedded in the recessed portion 13 between the part on the first chip principal surface 3 side and the side surfaces 35A to 35D of the substrate 32 on the second chip principal surface 4 side. In addition, the side surface covering portion 22 is in direct contact with the side surfaces 35A to 35D of the substrate 32 and is preferably formed in a film shape so as to conform to the side surfaces 35A to 35D. In addition, referring to FIG. 6 and FIG. 7, the first end portion 22A of the side surface covering portion 22 is located closer to the first chip principal surface 3 side than the recessed portion 13, and the side surface covering portion 22 covers the insulating side surfaces 47A to 47D of the insulating layer 45.

The external surface resin 21 may cover the passivation layer 52 of the insulating layer 45. The external surface resin 21 may cover the passivation layer 52 and the resin layer 53 of the insulating layer 45.

The principal surface covering portion 28 of the external surface resin 21 covers the second principal surface 34 of the substrate 32 and the second end portion 22B of the side surface covering portion 22 en bloc. The principal surface covering portion 28 of the external surface resin 21 fills the grinding traces and covers the second principal surface 34 of the substrate 32 and the second end portion 22B of the side surface covering portion 22 en bloc.

Thus, the opaque external surface resin 21 is preferably formed in an annular shape that has an endless shape enclosing the transparent insulating layer 45 as viewed in plan. Hence, visibility of the marking 43 is not impaired by the external surface resin 21.

As described above, according to the chip component 1, the chip main body 2 can be protected by the external surface resin 21 while connecting portions of the chip main body 2 for the connection target are secured. It is thereby possible to provide the chip component 1 that can protect the chip main body 2 appropriately while utilizing advantages as a small electronic component.

In addition, the recessed portion 13 is formed in the end portions on the first chip principal surface 3 side in the side surfaces 35A to 35D of the substrate 32, and the external surface resin 21 is embedded in the recessed portion 13. Thus, even when a joining material such as solder or other joining material wets up to the side surfaces 35A to 35D of the substrate 32 during mounting of the chip component 1, the external surface resin 21 embedded in the recessed portion 13 can prevent contact between the substrate 32 and the joining material. It is thereby possible to provide the chip component 1 having improved reliability. In particular, because the recessed portion 13 is formed in an annular shape enclosing the first principal surface 33 of the substrate 32, contact between the substrate 32 and the joining material due to the wetting up can be prevented even when the joining material wets up in any direction from the periphery of the chip component 1.

Incidentally, a size in a substrate thickness direction of this recessed portion is preferably equal to or more than 1 μm.

Figure 9:
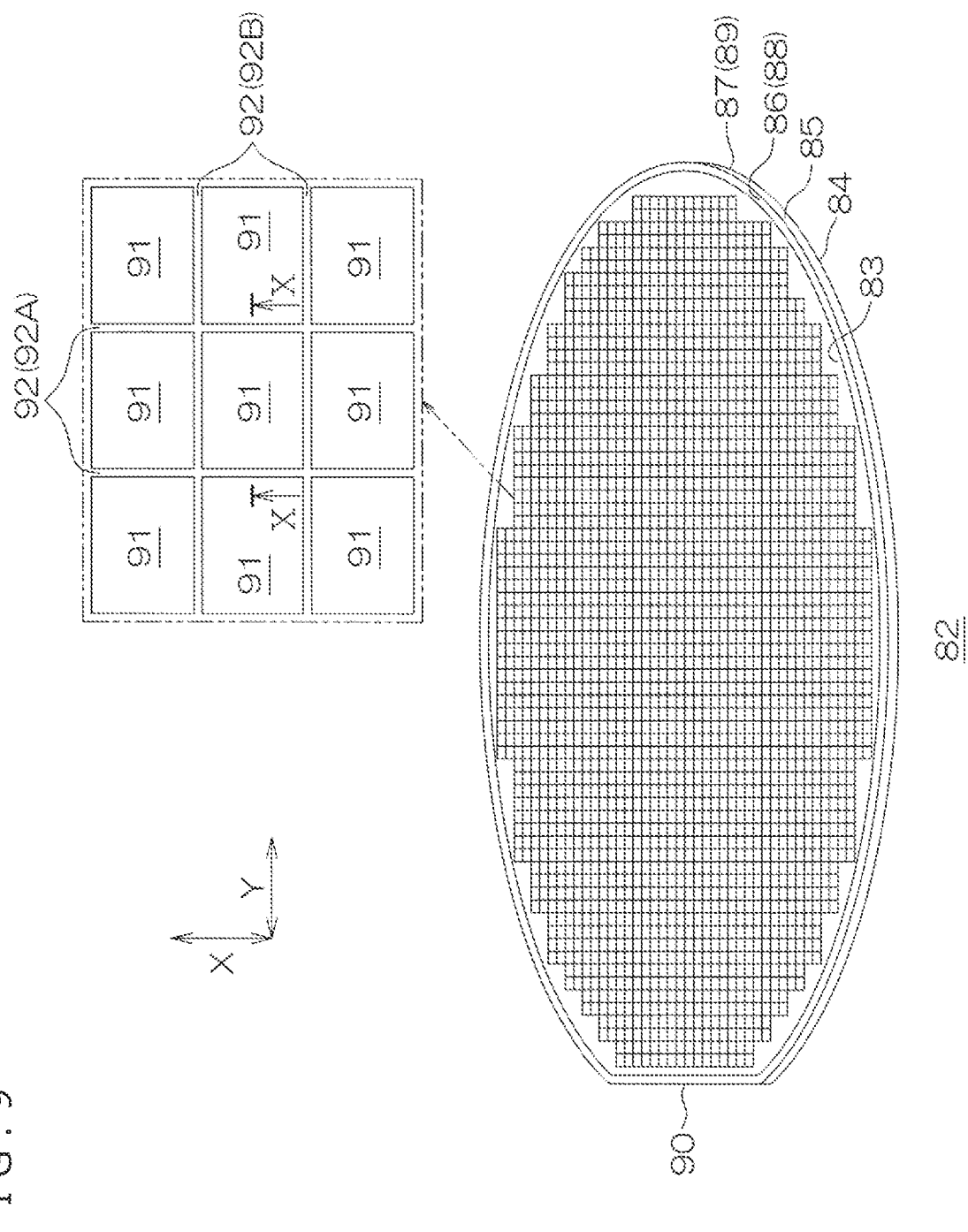
FIG. 9 is a perspective view illustrating a wafer used to manufacture the chip component illustrated in FIG. 1.

FIG. 9 is a perspective view illustrating a wafer 82 used to manufacture the chip component 1 illustrated in FIG. 1.

The wafer 82 as an example of a base substrate is used to manufacture the chip component 1. The wafer 82 is a base member of the chip main body 2. The wafer 82 is formed in a plate shape or a disk shape. The wafer 82 may be formed in a disk shape.

The wafer 82 has a first wafer principal surface 83 on one side, a second wafer principal surface 84 on another side, and a wafer side surface 85 connecting the first wafer principal surface 83 and the second wafer principal surface 84 to each other. The first wafer principal surface 83 and the second wafer principal surface 84 of the wafer 82 respectively correspond to the first principal surface 33 and the second principal surface 34 of the substrate 32.

A thickness TW of the wafer 82 exceeds the thickness Tsub of the substrate 32 (Tsub<TW). The thickness TW of the wafer 82 is adjusted to the thickness Tsub of the substrate 32 by grinding. The thickness TW may be 300 to 750 μm both inclusive. The thickness TW may be 300 to 350 μm both inclusive, 350 to 400 μm both inclusive, 400 to 450 μm both inclusive, 450 to 500 μm both inclusive, 500 to 550 μm both inclusive, 550 to 600 μm both inclusive, 600 to 650 μm both inclusive, 650 to 700 μm both inclusive, or 700 to 750 μm both inclusive.

The wafer 82 includes a first wafer corner portion 86 and a second wafer corner portion 87. The first wafer corner portion 86 connects the first wafer principal surface 83 and the wafer side surface 85 to each other. The second wafer corner portion 87 connects the second wafer principal surface 84 and the wafer side surface 85 to each other.

The first wafer corner portion 86 preferably has a first chamfered portion 88 inclined downward from the first wafer principal surface 83 to the wafer side surface 85. The first chamfered portion 88 may be formed in a protrudingly curved shape. The second wafer corner portion 87 has a second chamfered portion 89 inclined upward from the second wafer principal surface 84 to the wafer side surface 85. The second chamfered portion 89 may be formed in a protrudingly curved shape. The first chamfered portion 88 and the second chamfered portion 89 suppress cracks in the wafer 82.

A notch portion 90 as a mark for positioning may be formed in the wafer side surface 85. The notch portion 90 in this example linearly extends along the first direction X. A notch portion 90 extending along the first direction X and a notch portion 90 extending along the second direction Y may be formed in the wafer side surface 85 of the wafer 82.

A plurality of chip forming regions 91 each corresponding to the chip main body 2 are set in the first wafer principal surface 83. The plurality of chip forming regions 91 are set in a matrix manner at intervals along the first direction X and the second direction Y.

The plurality of chip forming regions 91 are each demarcated by planned cutting lines 92 extending in a lattice manner along the first direction X and the second direction Y. The planned cutting lines 92 include a plurality of first planned cutting lines 92A and a plurality of second planned cutting lines 92B.

The plurality of first planned cutting lines 92A each extend along the first direction X. The plurality of second planned cutting lines 92B each extend along the second direction Y. The wafer 82 is cut along the planned cutting lines 92 after a predetermined structure is formed in the plurality of chip forming regions 91. Consequently, a plurality of chip components 1 are cut out from one wafer 82.

Figure 10B:
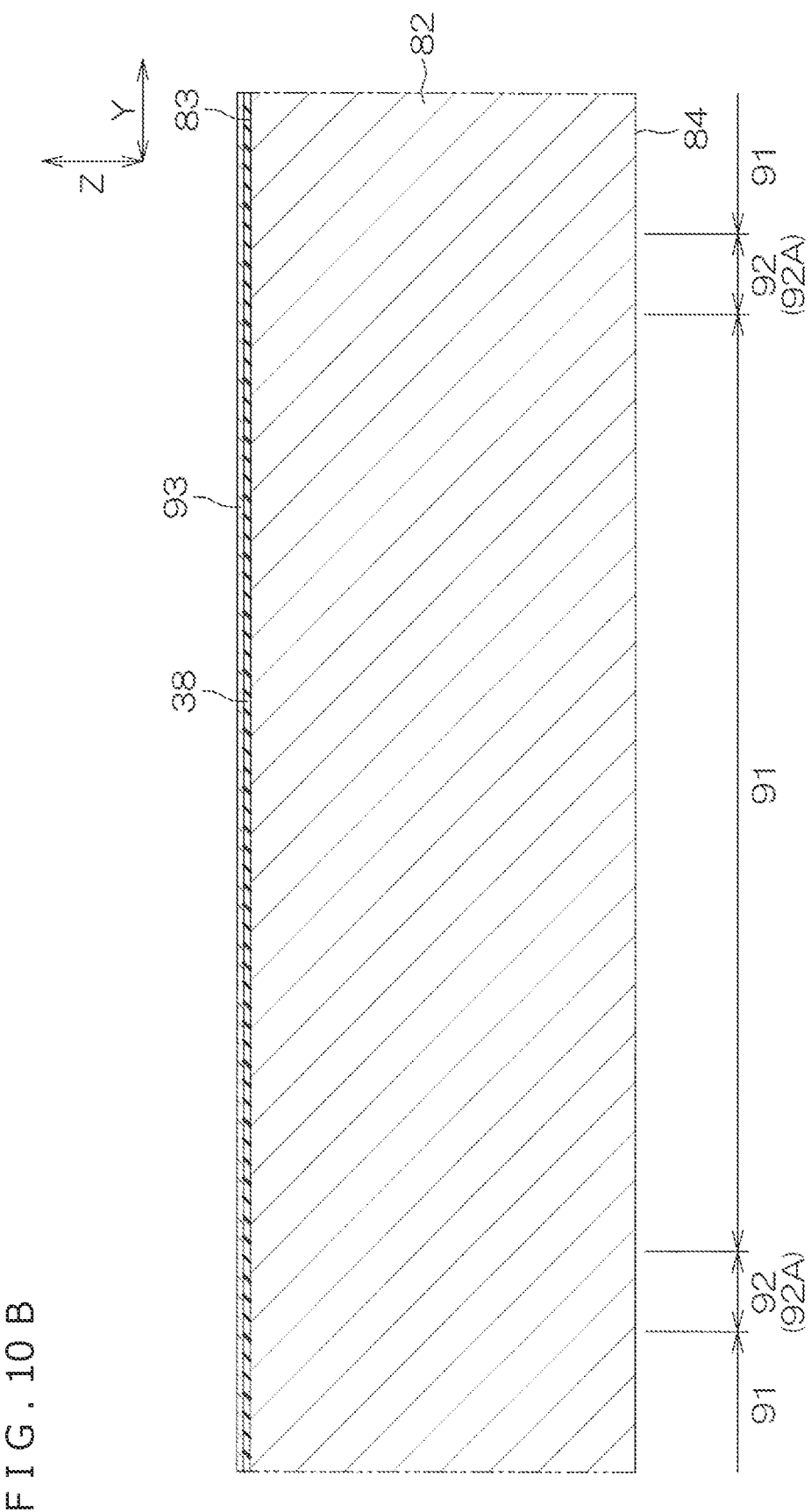
FIG. 10B is a sectional view for explaining a process after FIG. 10A.
Figure 10D:
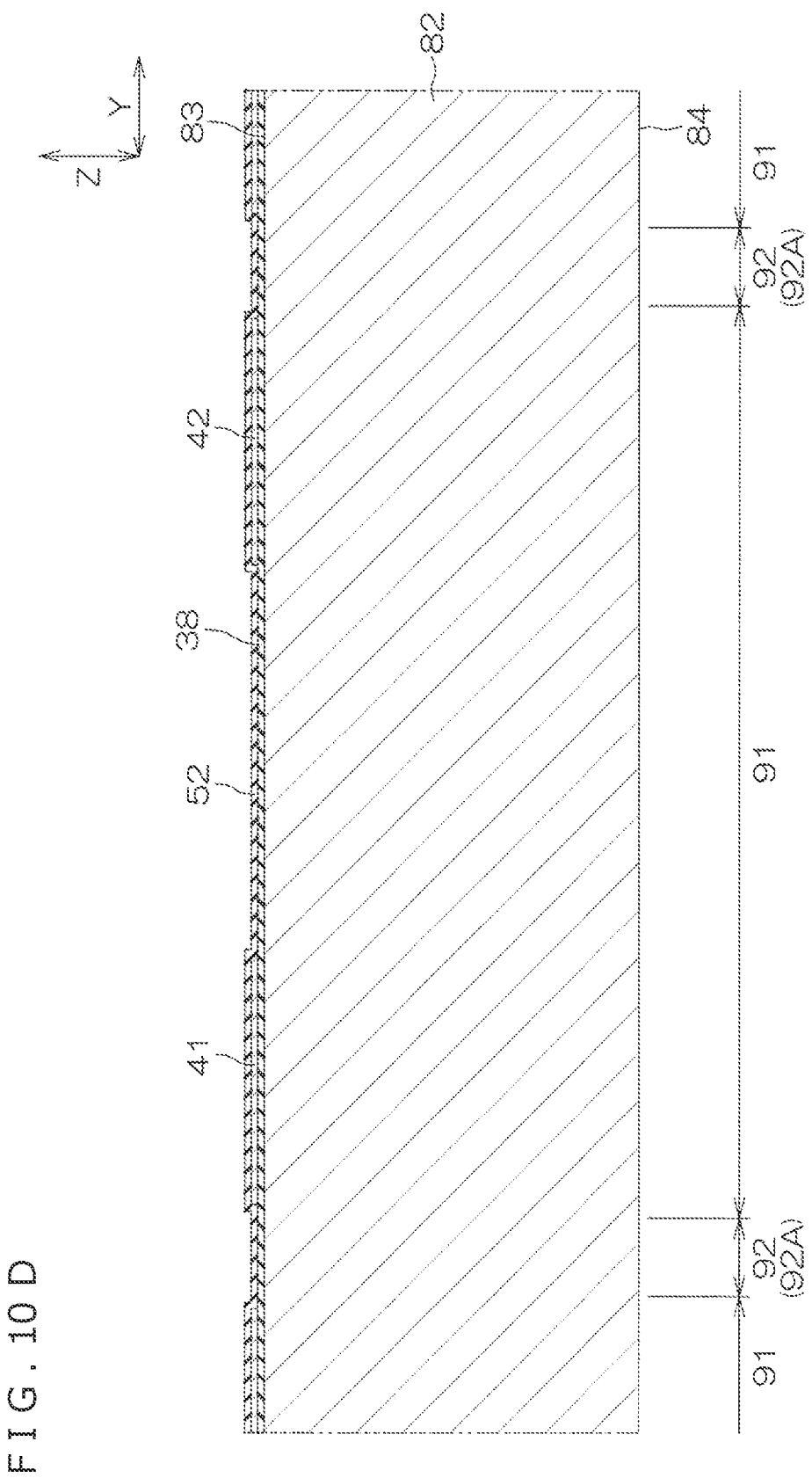
FIG. 10D is a sectional view for explaining a process after FIG. 10C.
Figure 10E:
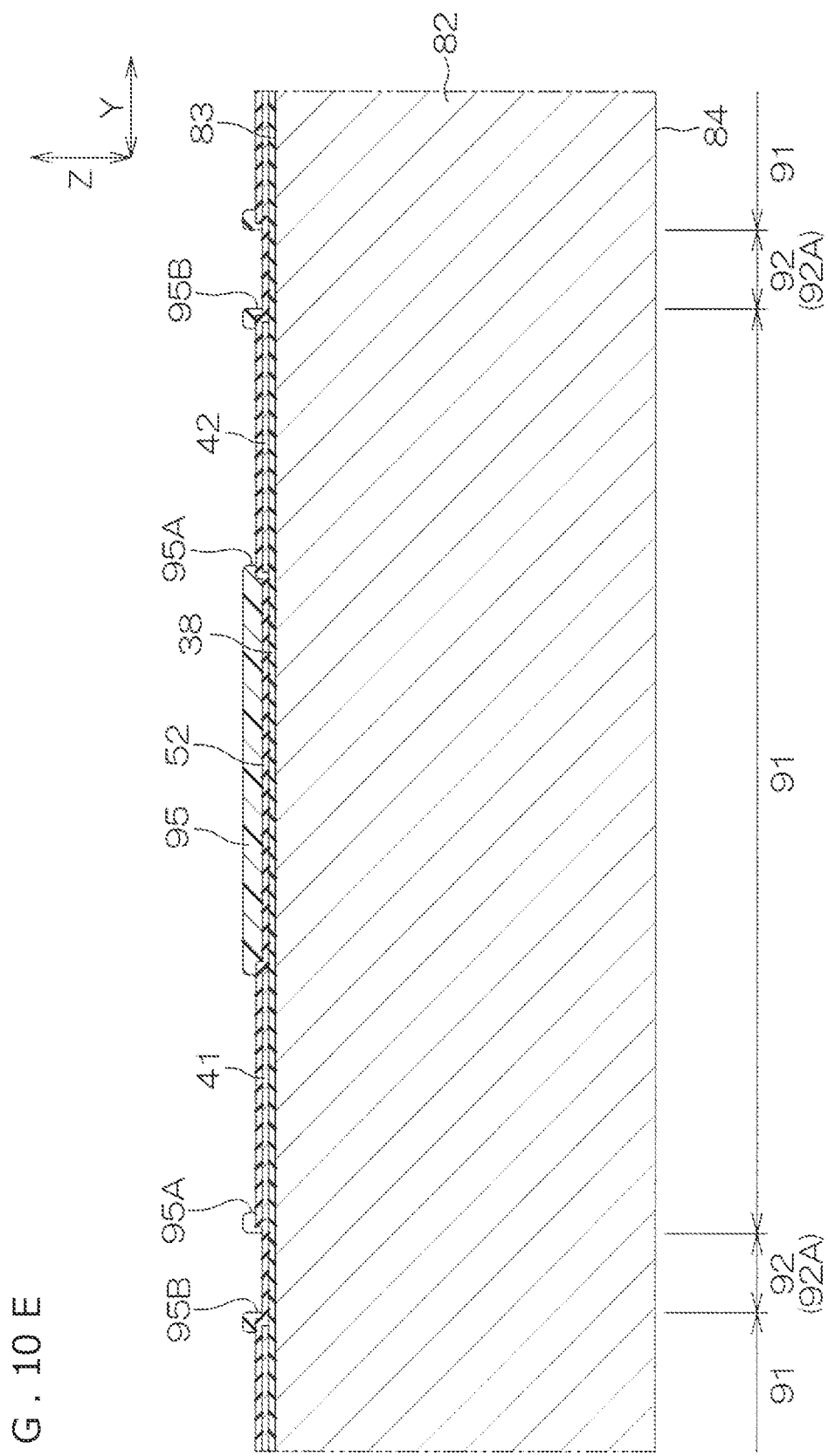
FIG. 10E is a sectional view for explaining a process after FIG. 10D.
Figure 10F:
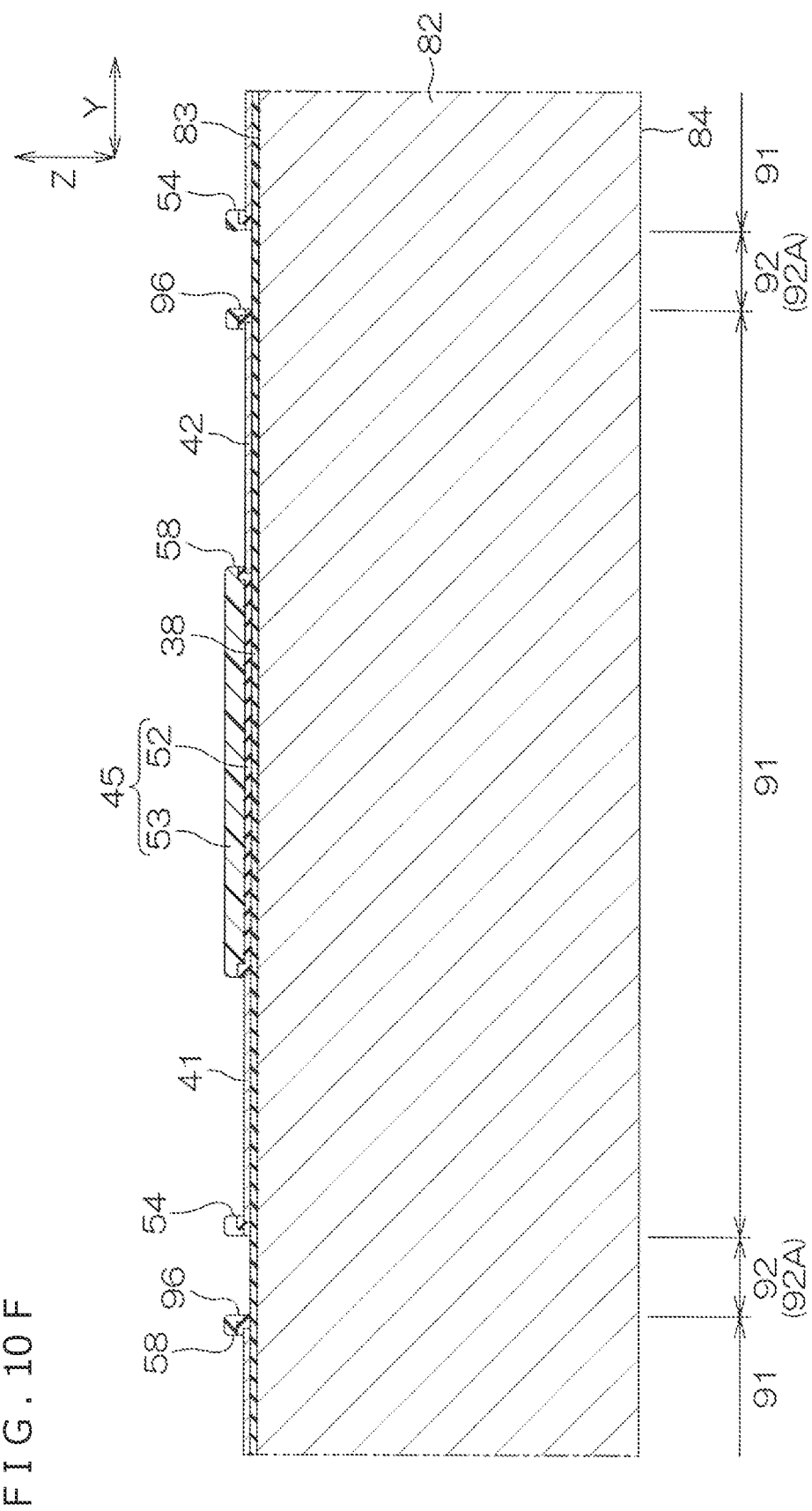
FIG. 10F is a sectional view for explaining a process after FIG. 10E.
Figure 10G:
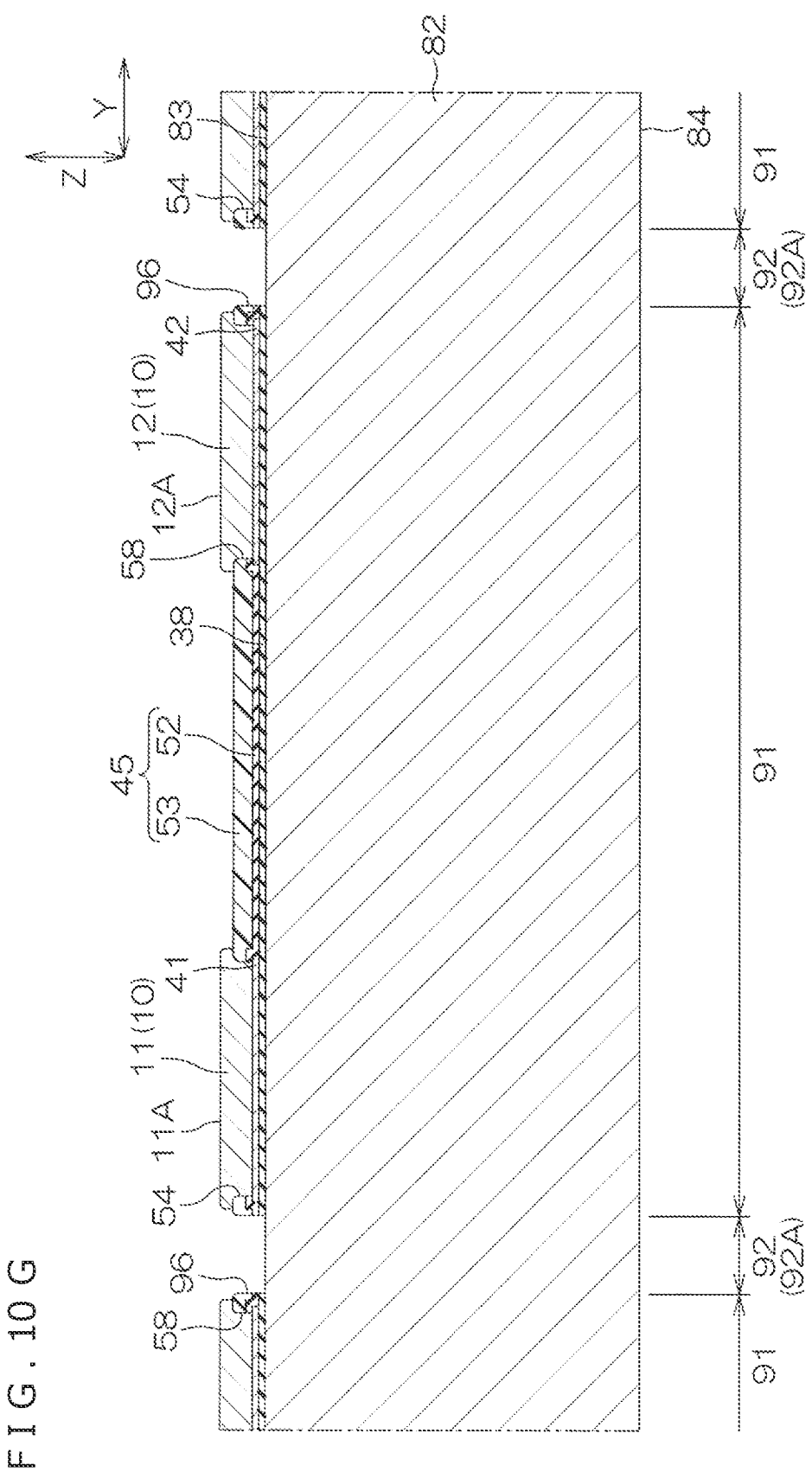
FIG. 10G is a sectional view for explaining a process after FIG. 10F.
Figure 10I:
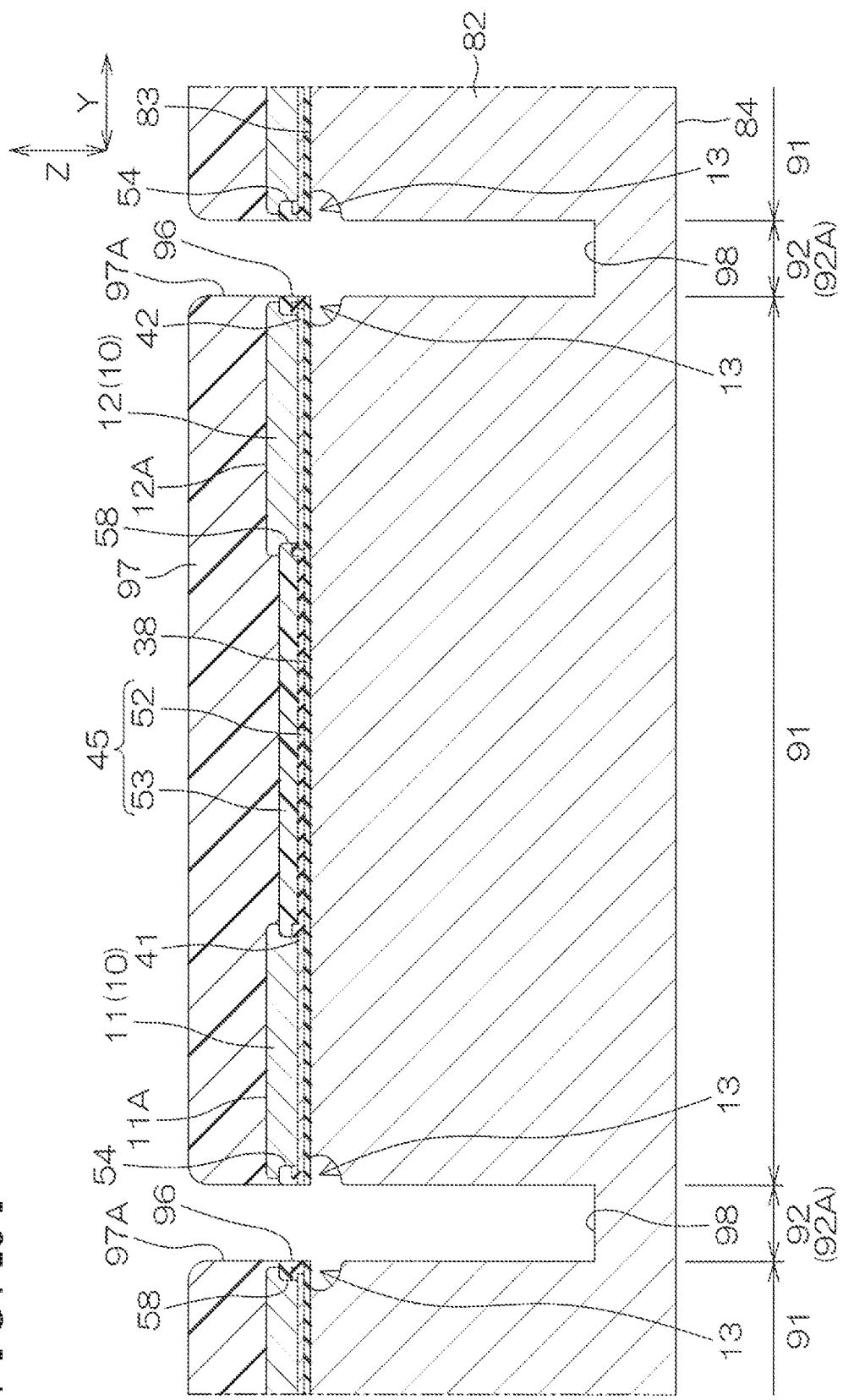
FIG. 10I is a sectional view for explaining a process after FIG. 10H.
Figure 10J:
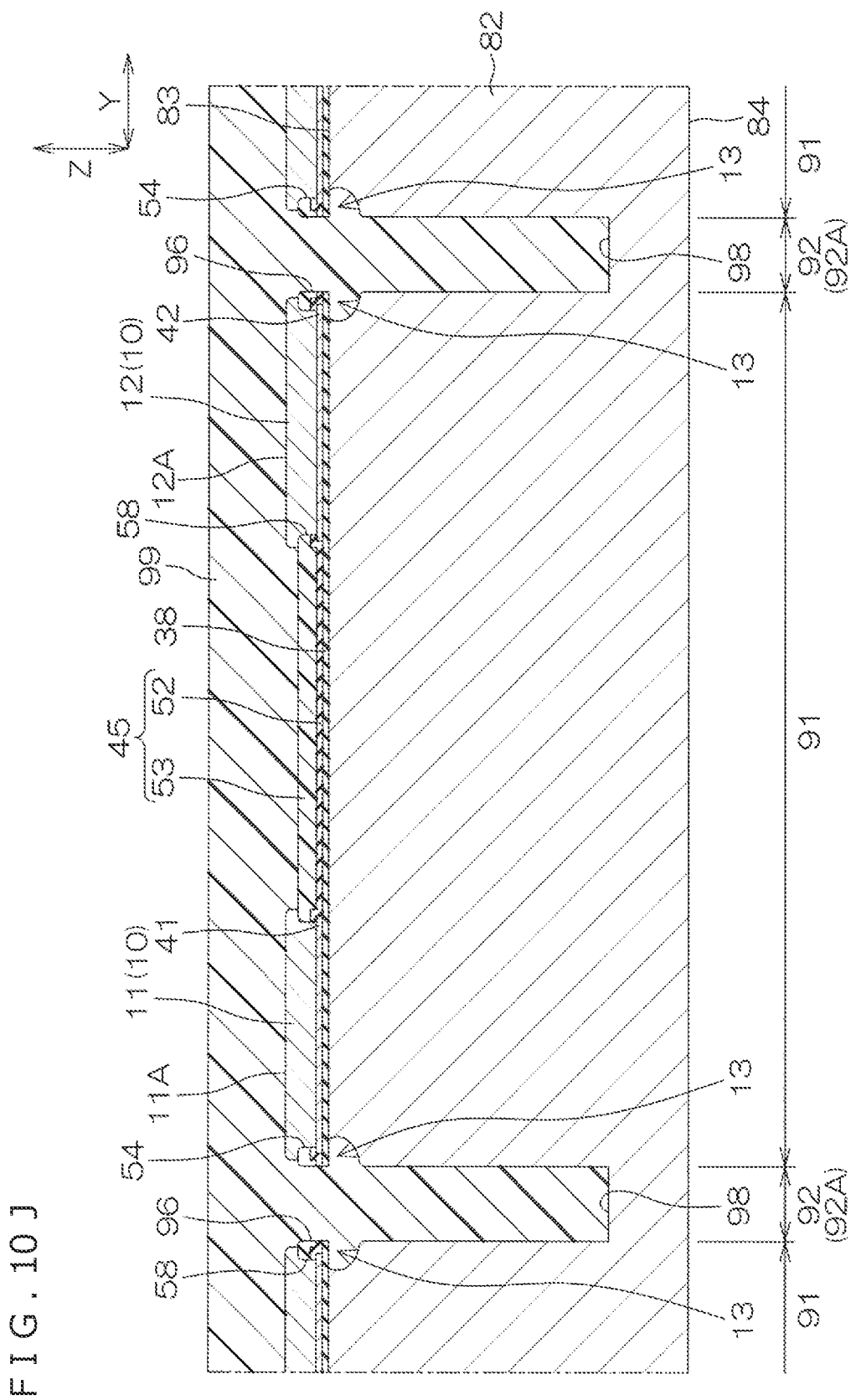
FIG. 10J is a sectional view for explaining a process after FIG. 10I.
Figure 10K:
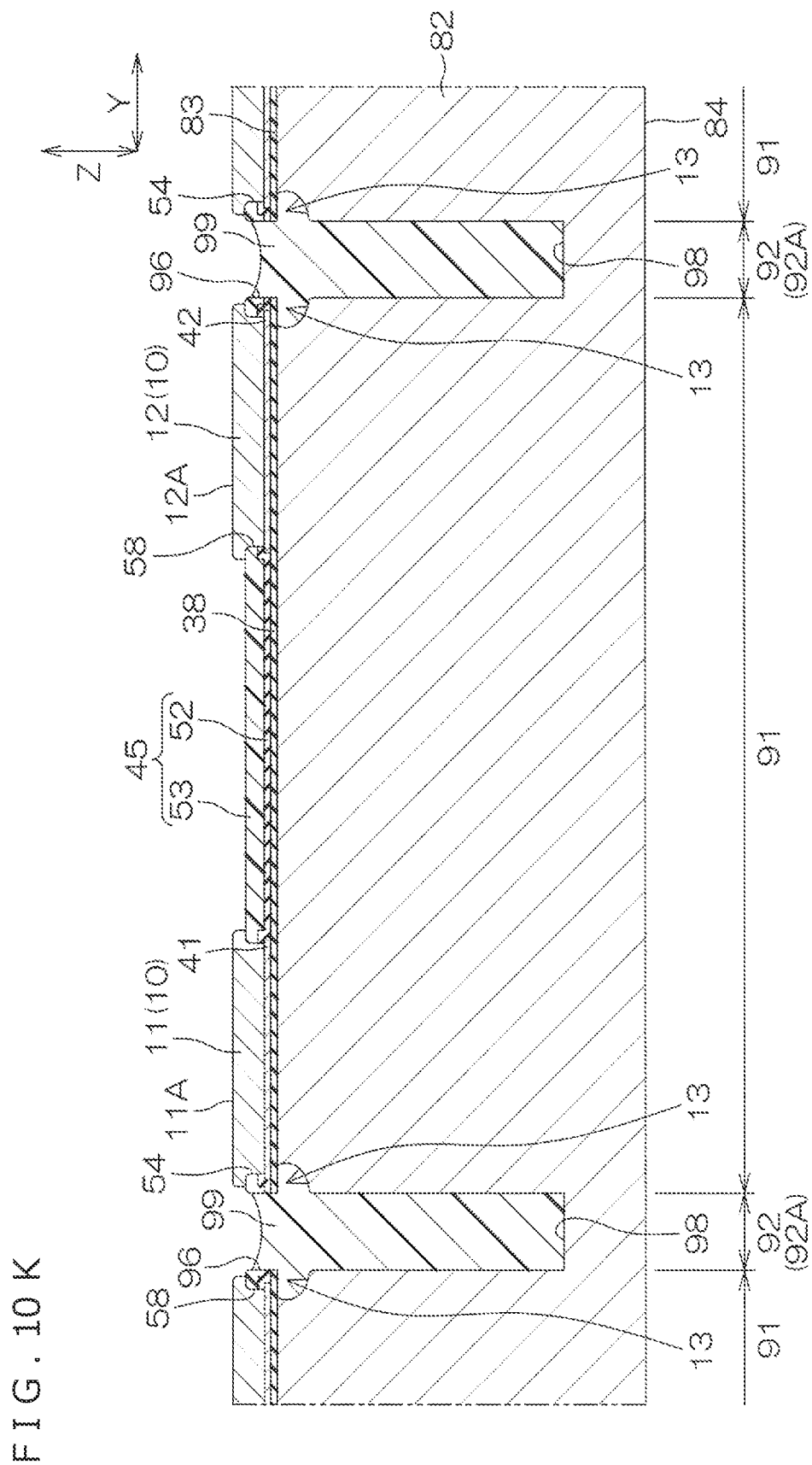
FIG. 10K is a sectional view for explaining a process after FIG. 10J.
Figure 10L:
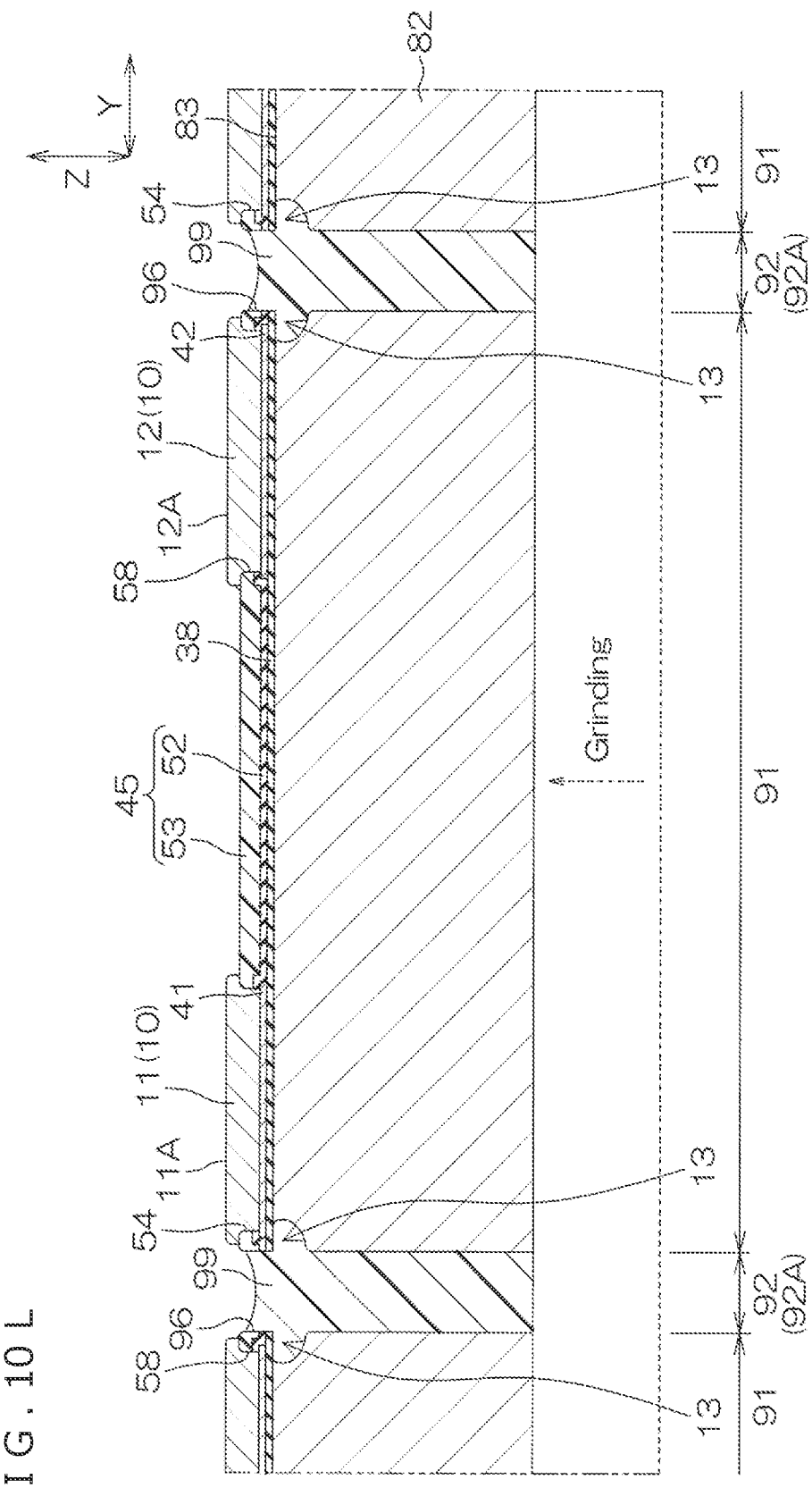
FIG. 10L is a sectional view for explaining a process after FIG. 10K.
Figure 10M:
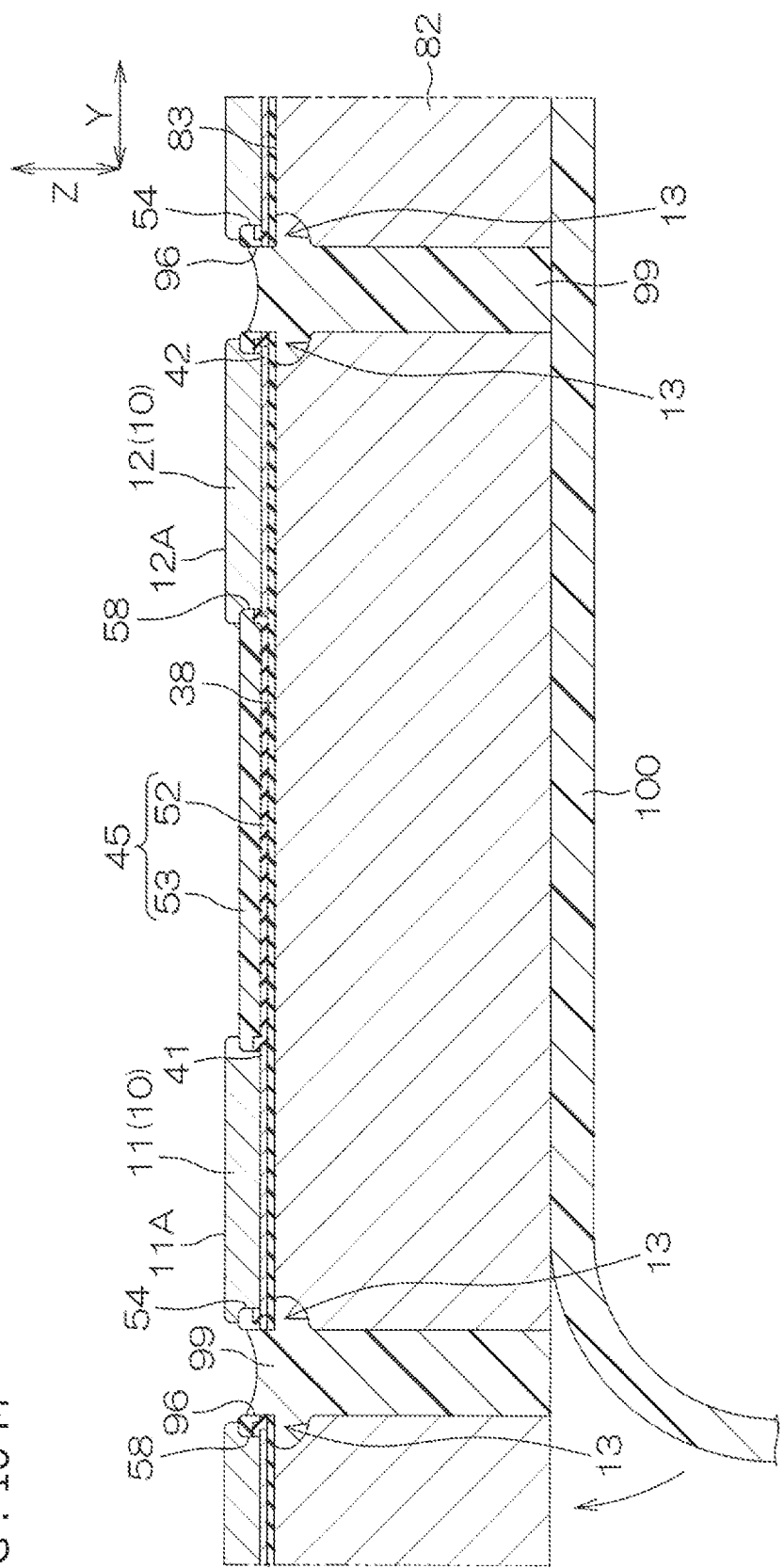
FIG. 10M is a sectional view for explaining a process after FIG. 10L.
Figure 10N:
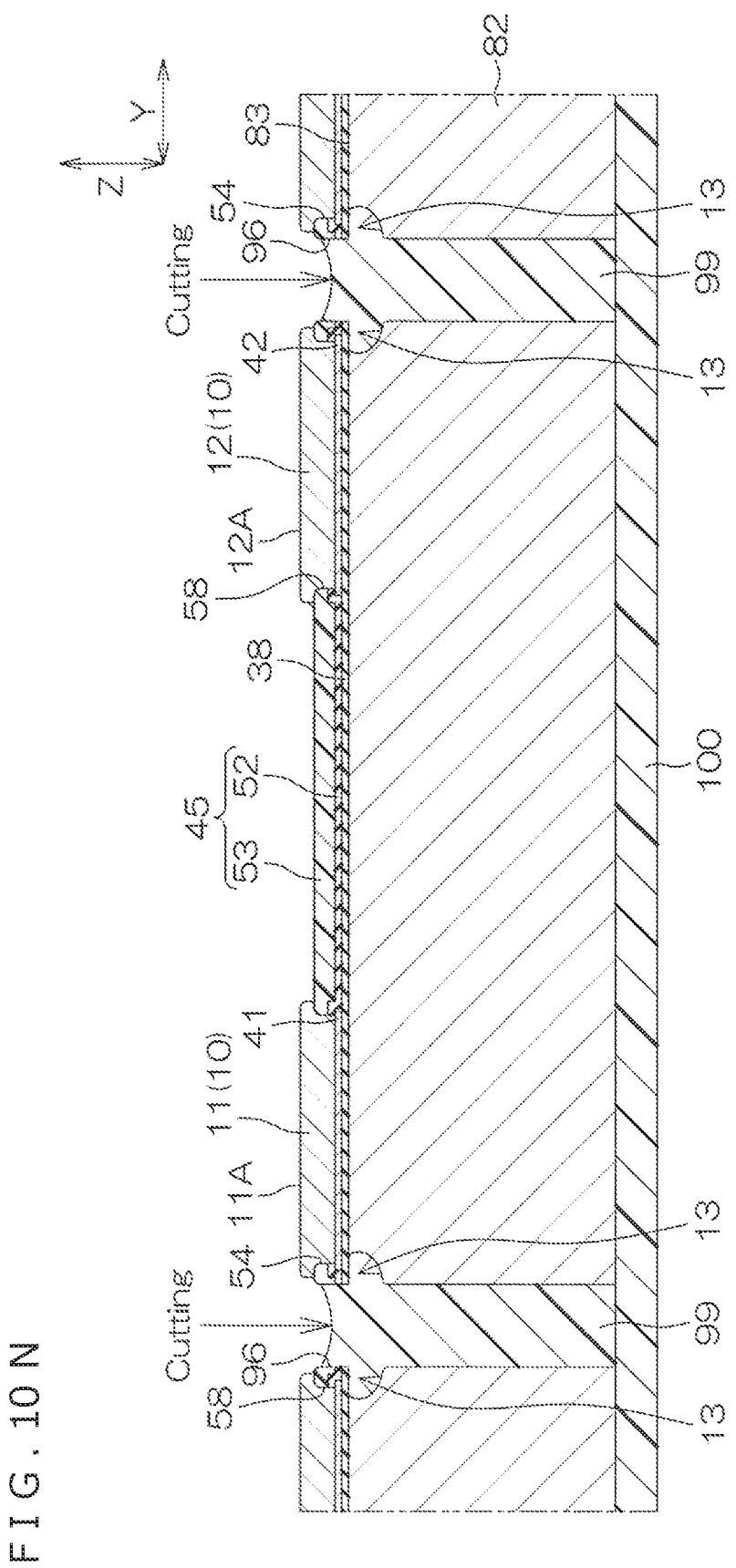
FIG. 10N is a sectional view for explaining a process after FIG. 10M.

FIGS. 10A to 10N are sectional views taken along a line X-X illustrated in FIG. 9 and are sectional views for explaining an example of a method of manufacturing the chip component 1 illustrated in FIG. 1. In the following, the functional device FD and processes of forming the functional device FD are any of the functional devices and their processes that are known to those of skill in the art and will be omitted in order to simplify the description.

Referring to FIG. 10A, in manufacturing the chip component 1, the wafer 82 (see FIG. 9) is prepared first. Next, the principal surface insulating layer 38 is formed on the first wafer principal surface 83 of the wafer 82. The principal surface insulating layer 38 may be formed by an oxidation processing method (for example, a thermal oxidation processing method). The principal surface insulating layer 38 may be formed by a chemical vapor deposition (CVD) method.

Next, referring to FIG. 10B, a base electrode layer 93 serving as a base for the first pad electrode 41, the second pad electrode 42, and the marking 43 is formed on the principal surface insulating layer 38. The base electrode layer 93 may be formed by a sputtering method or an evaporation method.

Next, referring to FIG. 10C, a mask 94 having a predetermined pattern is formed on the base electrode layer 93. The mask 94 has a plurality of openings 94A that cover a region in which to form the first pad electrode 41, a region in which to form the second pad electrode 42, and a region in which to form the marking 43, and expose regions other than these regions.

Next, unnecessary parts of the base electrode layer 93 are removed by an etching method via the mask 94. The etching method may be a wet etching method. The first pad electrode 41, the second pad electrode 42, and the marking 43 are consequently formed. The mask 94 is thereafter removed.

Next, referring to FIG. 10D, the passivation layer 52 is formed on the principal surface insulating layer 38. The passivation layer 52 may be formed by a CVD method. The passivation layer 52 covers the first pad electrode 41, the second pad electrode 42, and the marking 43.

Next, referring to FIG. 10E, a resin layer 95 having a predetermined pattern and serving as a base for the resin layer 53 is formed on the passivation layer 52. More specifically, the resin layer 95 has a plurality of openings 95A corresponding to the first pad opening 54 and the second pad opening 58 and openings 95B along the planned cutting lines 92.

In this process, a photosensitive resin is first applied onto the passivation layer 52. Next, the photosensitive resin is exposed via a photomask (not illustrated) having a predetermined pattern. The photomask (not illustrated) more specifically has a pattern corresponding to the first pad opening 54, the second pad opening 58, and the planned cutting lines 92. Next, the photosensitive resin is immersed in a developer. Consequently, the resin layer 95 having a predetermined pattern is formed.

Next, referring to FIG. 10F, unnecessary parts of the passivation layer 52 are removed by an etching method using the resin layer 95 as a mask. More specifically, parts of the passivation layer 52 which parts are exposed from the openings 95A and 95B of the resin layer 95 are removed. The etching method may be a wet etching method.

The plurality of openings 95A of the resin layer 95 become the first pad opening 54 and the second pad opening 58. The openings 95B of the resin layer 95 become dicing streets 96 along the planned cutting lines 92. The insulating layer 45 including the passivation layer 52 and the resin layer 53 is thus formed.

Next, referring to FIG. 10G, the first terminal electrode 11 is formed within the first pad opening 54, and the second terminal electrode 12 is formed within the second pad opening 58. The second terminal electrode 12 is preferably formed at the same time as the first terminal electrode 11.

The process of forming the first terminal electrode 11 includes a process of forming the first Ni layer 61, the first Pd layer 62, and the first Au layer 63 in this order on the first pad electrode 41. The first Ni layer 61, the first Pd layer 62, and the first Au layer 63 may each be formed by a plating method. The plating method may be an electroless plating method.

The process of forming the second terminal electrode 12 includes a process of forming the second Ni layer 64, the second Pd layer 65, and the second Au layer 66 in this order on the second pad electrode 42. The second Ni layer 64, the second Pd layer 65, and the second Au layer 66 may each be formed by a plating method. The plating method may be an electroless plating method.

Next, referring to FIG. 10H, a mask 97 having a predetermined pattern is formed above the first wafer principal surface 83 of the wafer 82. The mask 97 has openings 97A that expose the dicing streets 96 according to planned cutting lines 92.

Next, unnecessary parts of the wafer 82 are removed by an etching method via the mask 97. The etching method may be a wet etching method. Consequently, the wafer 82 is isotropically etched from the first wafer principal surface 83 exposed from the dicing streets 96 (per planned cutting lines 92), and the recessed portion 13 bulging to the outside of the dicing streets 96 (inside of each chip forming region 91) is formed. That is, because of the isotropic etching that etches the wafer 82 not only in a thickness direction but also in a horizontal direction orthogonal to the thickness direction, the width of the formed recessed portion 13 is larger than the width of the openings 97A.

Next, referring to FIG. 10I, a bottom portion of the recessed portion 13 is further etched in the thickness direction of the wafer 82 by an etching method via the mask 97. The etching method may be a dry etching method (for example, a reactive ion etching method). Consequently, the wafer 82 is dug down with a width smaller than the recessed portion 13 along the dicing streets 96 (planned cutting lines 92), and a groove 98 integrated with the recessed portion 13 is formed. The groove 98 demarcates a chip forming region 91. The mask 97 is thereafter removed.

Next, referring to FIG. 10J, a first base resin layer 99 serving as a base for the external surface resin 21 (side surface covering portion 22) is formed. In this example process, a solvent including a thermosetting resin (for example, an epoxy resin) is supplied over the first wafer principal surface 83 of the wafer 82.

The solvent preferably has a color different from that of each of the electrode surfaces 11A and 12A. The solvent preferably has a darker color than each of the electrode surfaces 11A and 12A. The solvent in this example includes carbon black and is thus colored in black. The solvent is filled into the recessed portion 13 and the groove 98 and covers the chip forming region 91.

Next, the solvent is cured by heating. The solvent is preferably semi-cured. The first base resin layer 99 that fills the recessed portion 13 and the groove 98 and covers the chip forming region 91 is consequently formed.

Next, referring to FIG. 10K, unnecessary parts of the first base resin layer 99 are removed. In this process, a part of the first base resin layer 99 which part covers the chip forming region 91 is removed such that parts of the first base resin layer 99 which parts are buried in the recessed portion 13 and the groove 98 remain.

The unnecessary parts of the first base resin layer 99 may be removed by grinding, peeling, or wiping. A cloth material or a grinding member may be used to remove the unnecessary parts of the first base resin layer 99. According to the first base resin layer 99 in a semi-cured state, the unnecessary parts can be removed easily.

In this process, the unnecessary parts of the first base resin layer 99 are wiped away, for example, by a cloth material. In this case, an opening side end portion of the first base resin layer 99 remaining in the groove 98 is recessed so as to form a recessed curved surface toward the bottom wall of the groove 98. In addition, the opening side end portion of the first base resin layer 99 is formed so as to rise and/or sink along the planned cutting lines 92.

The opening width of the groove 98 increases at an intersection portion of a first planned cutting line 92A and a second planned cutting line 92B. Hence, an amount of removal of the first base resin layer 99 at the intersection portion in the groove 98 is larger than an amount of removal of the first base resin layer 99 in regions outside the intersection portion in the groove 98.

Consequently, the opening side end portion of the first base resin layer 99 remaining at the intersection portion in the groove 98 sinks more toward the bottom wall side of the groove 98 than the opening side end portion of the first base resin layer 99 remaining in the regions outside the intersection portion. The first base resin layer 99 buried in the groove 98 is thereafter fully cured by heating.

Next, referring to FIG. 10L, the second wafer principal surface 84 of the wafer 82 is ground. The second wafer principal surface 84 may be ground by a chemical mechanical polishing (CMP) method. The second wafer principal surface 84 is ground until the first base resin layer 99 buried in the groove 98 is exposed.

Consequently, one flat surface constituted of the second wafer principal surface 84 and the first base resin layer 99 is formed. In addition, grinding traces are formed on the second wafer principal surface 84 and the first base resin layer 99. In this process, the plurality of chip forming regions 91 are separated as a plurality of chip main bodies 2. The plurality of chip main bodies 2 are supported by the fixed first base resin layer 99.

Next, referring to FIG. 10M, a second base resin layer 100 serving as a base for the external surface resin 21 (principal surface covering portion 28) is formed on the second wafer principal surface 84 of the wafer 82. In this process, first, a resin tape including a thermosetting resin (for example, an epoxy resin) may be affixed onto the second wafer principal surface 84.

The resin tape covers the second wafer principal surface 84 and the first base resin layer 99 en bloc. Next, the resin tape is cured by heating. Consequently, the second base resin layer 100 integrated with the first base resin layer 99 is formed.

As with the first base resin layer 99, the second base resin layer 100 may be formed by using a solvent including a thermosetting resin (for example, an epoxy resin). In this case, first, the solvent is supplied onto the second wafer principal surface 84 of the wafer 82. Next, the solvent is cured by heating. Consequently, the second base resin layer 100 integrated with the first base resin layer 99 is formed.

Next, referring to FIG. 10N, the wafer 82 is cut along the planned cutting lines 92. More specifically, the first base resin layer 99 is cut such that a part of the first base resin layer 99 which part covers the side wall of the groove 98 remains. The second base resin layer 100 is cut together with the first base resin layer 99. Consequently, a plurality of chip components 1 are cut out of one wafer 82. The chip components 1 are manufactured through processes including the above.

Figure 11:
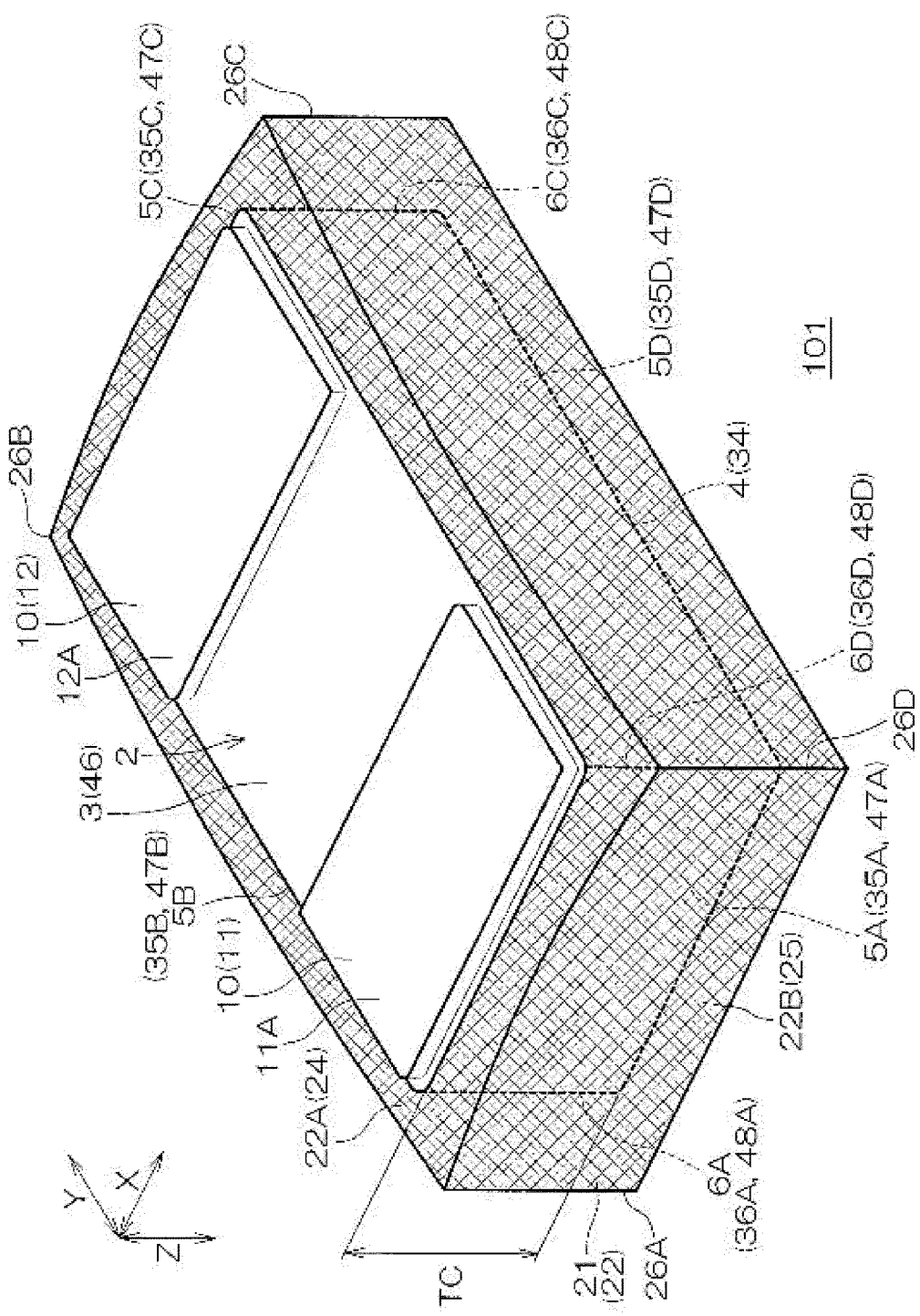
FIG. 11 is a perspective view of a chip component according to a second embodiment as viewed from one angle.
Figure 12:
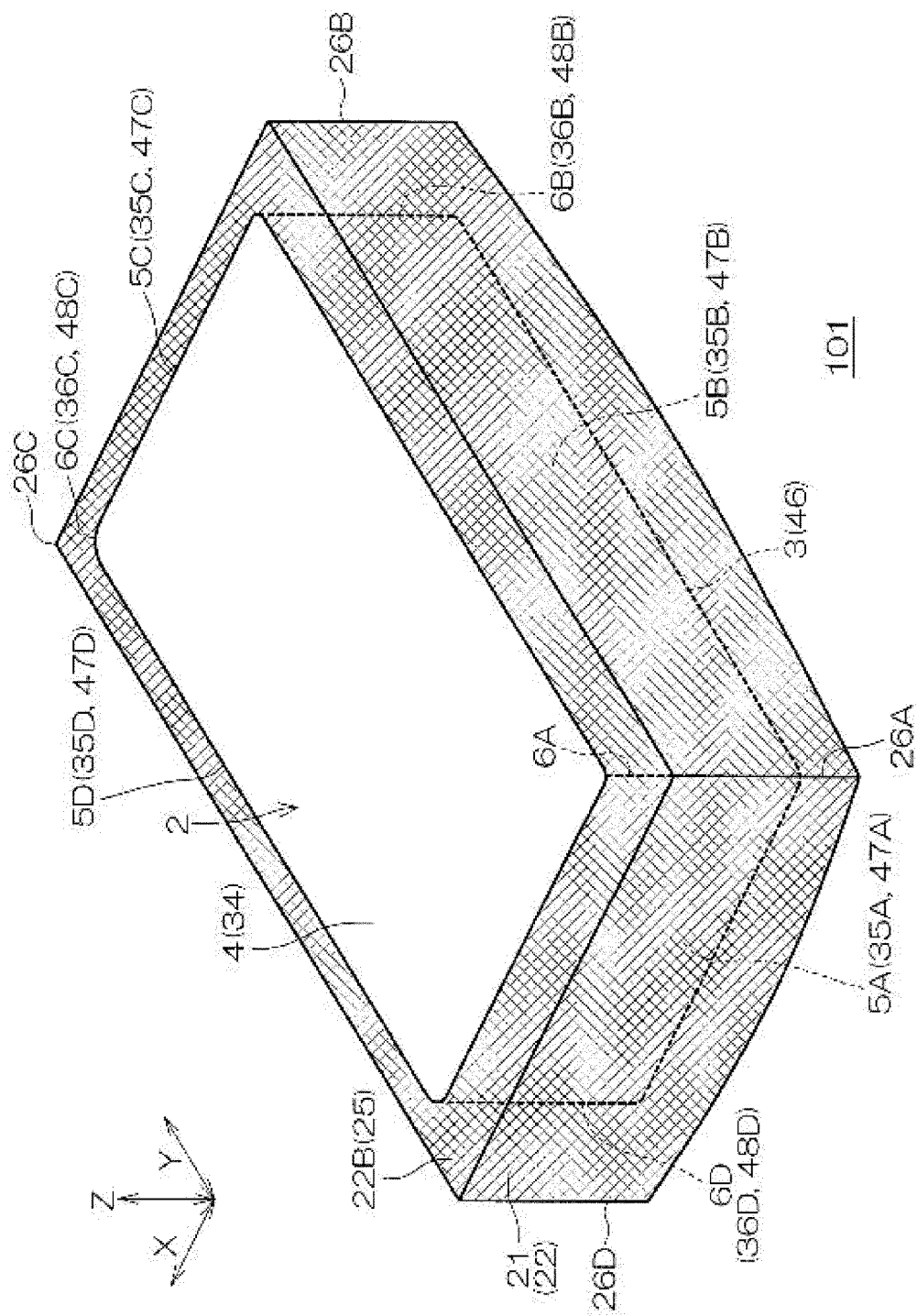
FIG. 12 is a perspective view of the chip component illustrated in FIG. 11 as viewed from another angle.

FIG. 11 is a perspective view of a chip component 101 according to a second embodiment of the present disclosure as viewed from one angle. FIG. 12 is a perspective view of the chip component 101 illustrated in FIG. 11 as viewed from another angle. In the following, structures corresponding to the structures described for the chip component 1 are identified by the same reference signs, and description thereof will be omitted.

The external surface resin 21 of the above-described chip component 1 includes the side surface covering portion 22 and the principal surface covering portion 28. On the other hand, the external surface resin 21 of the chip component 101 includes only the side surface covering portion 22. The external surface resin 21 of the chip component 101 does not have the principal surface covering portion 28. The external surface resin 21 exposes the second principal surface 34 of the substrate 32.

The second end portion 22B of the side surface covering portion 22 is preferably continuous with the second principal surface 34 of the substrate 32. Consequently, the second principal surface 34 of the substrate 32 and the second end portion 22B of the side surface covering portion 22 form one flat surface (ground surface).

The chip component 101 having such a structure is manufactured by omitting the process of forming the second base resin layer 100 (see FIG. 10M) in the processes of manufacturing the chip component 1 (see FIGS. 10A to 10N). From the above, the chip component 101 can also produce effects similar to effects described for the chip component 1.

Figure 13:
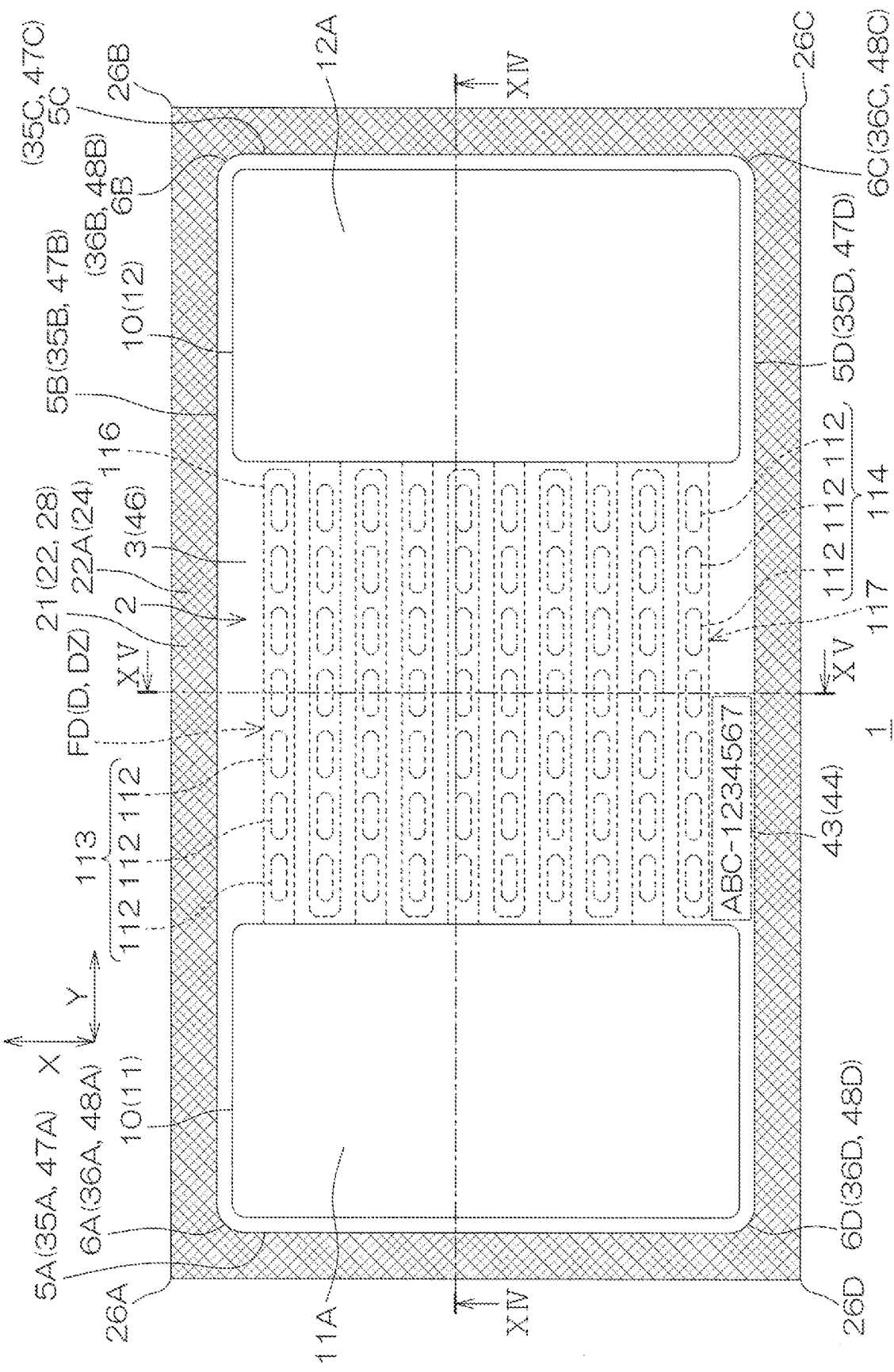
FIG. 13 is a plan view corresponding to FIG. 3 and is a plan view for explaining a functional device (diode in this example) according to a first example, the functional device being incorporated in a chip component.
Figure 14:
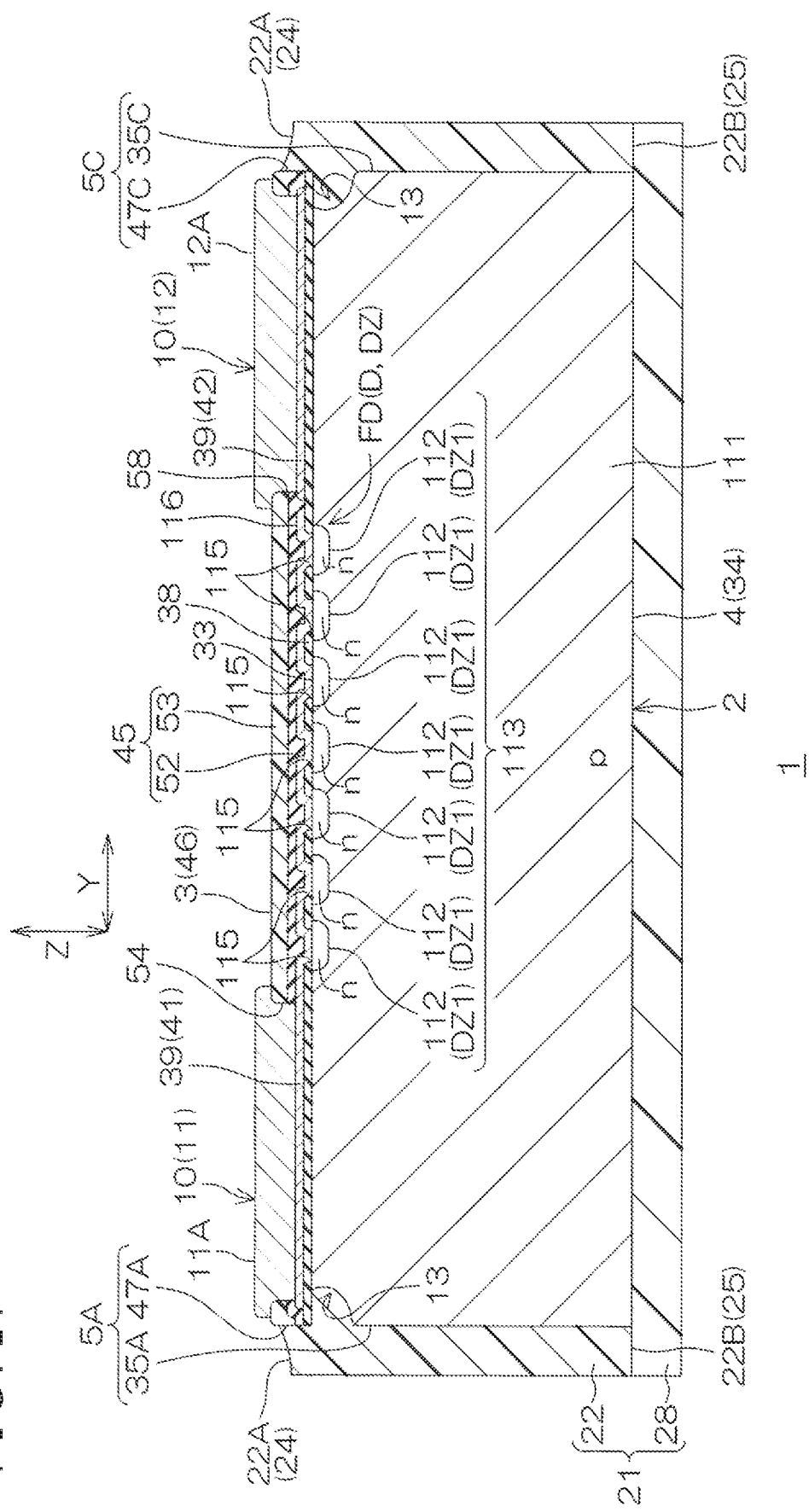
FIG. 14 is a sectional view taken along a line XIV-XIV illustrated in FIG. 13.

FIG. 13 is a plan view corresponding to FIG. 3 and is a plan view for explaining a functional device FD, such as diode D, according to a first example, the functional device being incorporated in the chip component 1. FIG. 14 is a sectional view taken along a line XIV-XIV illustrated in FIG. 13.

Figure 15:
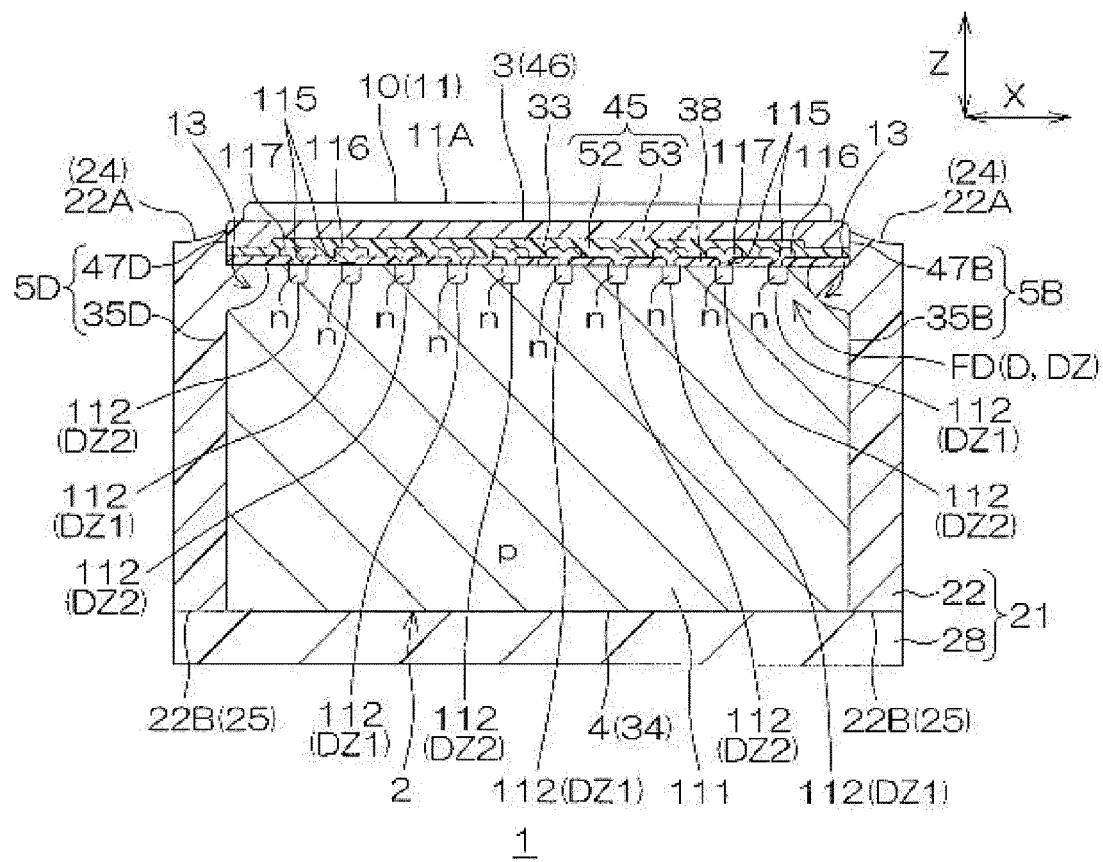
FIG. 15 is a sectional view taken along a line XV-XV illustrated in FIG. 13.
Figure 16:
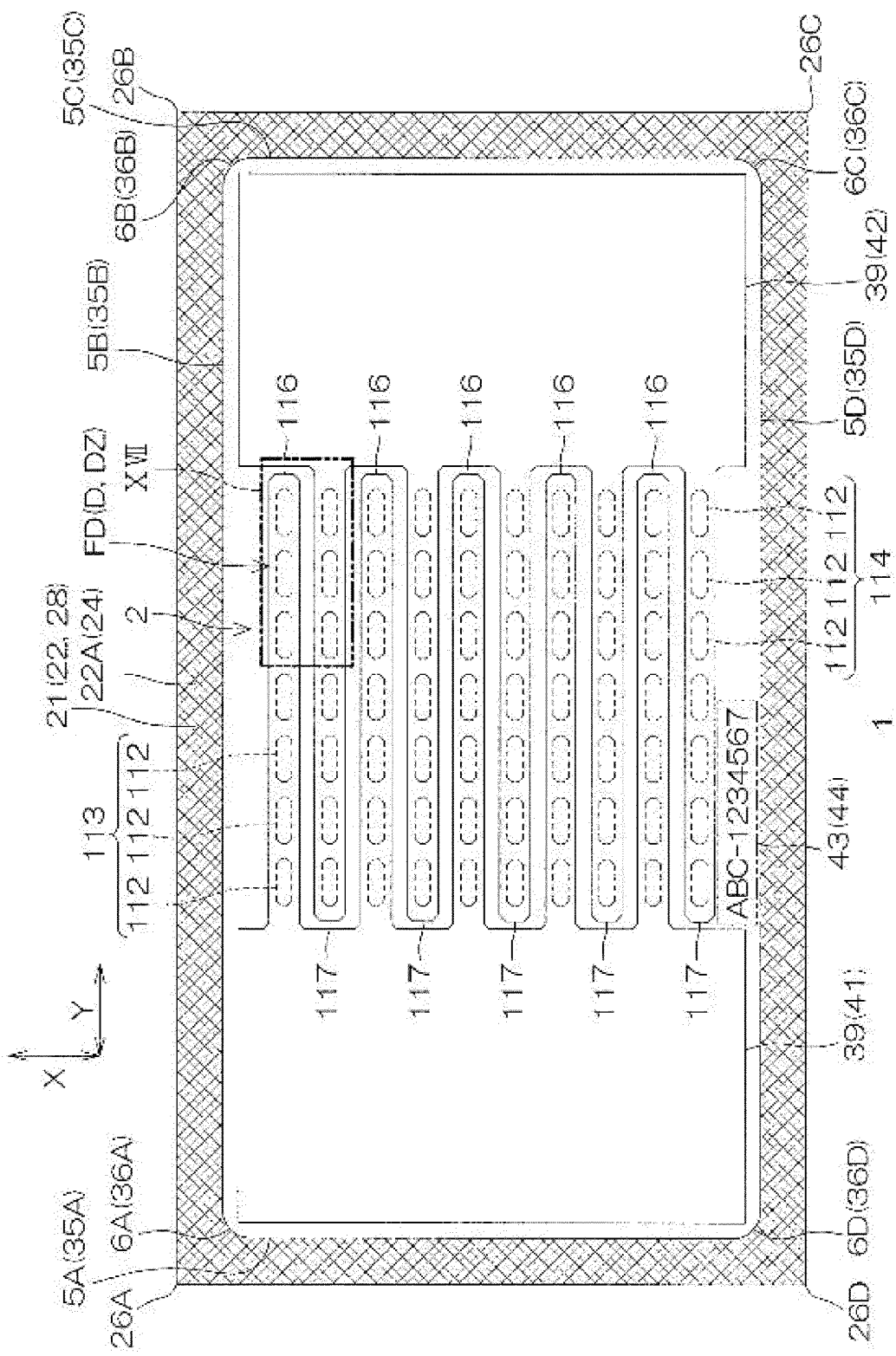
FIG. 16 is a plan view for explaining a structure of an internal electrode with a structure on the internal electrode removed from FIG. 13.
Figure 17:
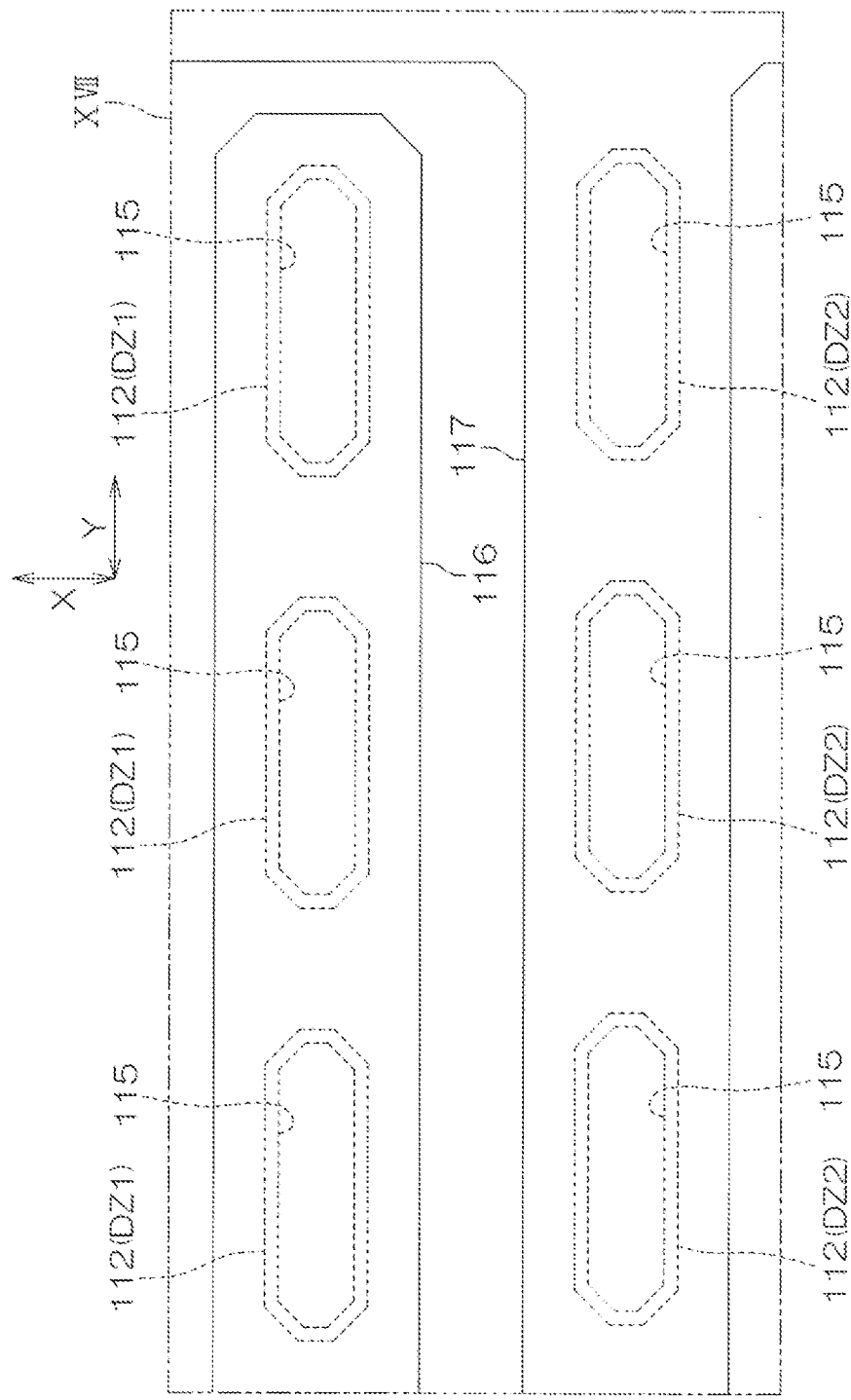
FIG. 17 is an enlarged view of a region XVII illustrated in FIG. 16.

FIG. 15 is a sectional view taken along a line XV-XV illustrated in FIG. 13. FIG. 16 is a plan view for explaining a structure of the internal electrode 39 with a structure on the internal electrode 39 removed from FIG. 13. FIG. 17 is an enlarged view of a region XVII illustrated in FIG. 16. In the following, structures corresponding to structures described for the chip component 1 are identified by the same reference signs, and description thereof will not be repeated.

Referring to FIGS. 13 to 17, the functional device FD according to the first example includes a diode D. The functional device FD in this example includes a bidirectional Zener diode DZ as an example of the diode D. The bidirectional Zener diode DZ includes a plurality of Zener diodes DZ1 and DZ2 connected in series with each other in opposite directions.

A p-type base region 111 is formed in a surface portion of the first principal surface 33 of the substrate 32. The base region 111 in this example is formed from the first principal surface 33 to the second principal surface 34 of the substrate 32. Thus, the substrate 32 is formed as a p-type semiconductor region.

A specific resistance psub of the substrate 32 may be 1 to 10 mΩ·cm both inclusive. The specific resistance psub may be 1 to 2 mΩ·cm both inclusive, 2 to 4 mΩ·cm both inclusive, 4 to 6 mΩ·cm both inclusive, 6 to 8 mΩ·cm both inclusive, or 8 to 10 mΩ·cm both inclusive.

A plurality of n-type impurity regions 112 are formed in the surface portion of the base region 111. The plurality of impurity regions 112 are exposed from the first principal surface 33 of the substrate 32. The plurality of impurity regions 112 are formed in a central portion of the first principal surface 33 of the substrate 32 as viewed in plan. More specifically, the plurality of impurity regions 112 are formed in a region interposed between the first terminal electrode 11 and the second terminal electrode 12 as viewed in plan.

The plurality of impurity regions 112 are arranged in a matrix manner at intervals along the first direction X and the second direction Y. The plurality of impurity regions 112 face one another in the first direction X. The plurality of impurity regions 112 face one another in the second direction Y.

The plurality of impurity regions 112 in this example are each formed in a band shape extending along the second direction Y as viewed in plan. The plurality of impurity regions 112 in this example are formed in a rectangular shape whose four corners are cut off (rectangular shape whose corners are rounded) as viewed in plan. The plurality of impurity regions 112 are formed in equal shape and equal area as viewed in plan.

The plurality of impurity regions 112 each have an equal thickness. The plurality of impurity regions 112 each have an equal n-type impurity concentration. The n-type impurity concentration of the plurality of impurity regions 112 may be $1.0 \times 10^{19}$ cm$^{-3}$ to $1.0 \times 10^{21}$ cm$^{-3}$ both inclusive. According to the plurality of impurity regions 112 having such a structure, it is possible to suppress variations in electrical characteristics produced from each of the impurity regions 112.

The plurality of impurity regions 112 form a pn junction with the base region 111. Thus, a plurality of Zener diodes DZ1 and DZ2 having the base region 111 as an anode and having the impurity regions 112 as a cathode are formed.

More specifically, the plurality of impurity regions 112 include a plurality of first impurity region groups 113 (two or more first impurity region groups 113, and five first impurity region groups 113 in this example) and a plurality of second impurity region groups 114 (two or more second impurity region groups 114, and five second impurity region groups 114 in this example). The plurality of first impurity region groups 113 are electrically connected to the first terminal electrode 11. The plurality of second impurity region groups 114 are electrically connected to the second terminal electrode 12.

A first impurity region group 113 includes a plurality of impurity regions 112 (two or more impurity regions 112, or six impurity regions 112 in this example) formed at intervals along the second direction Y. The plurality of first impurity region groups 113 are formed at intervals from each other along the first direction X. The plurality of impurity regions 112 included in the first impurity region groups 113 each form a first Zener diode DZ1.

A second impurity region group 114 includes a plurality of impurity regions 112 (two or more impurity regions 112, and six impurity regions 112 in this example) formed at intervals along the second direction Y. The plurality of second impurity region groups 114 are formed at intervals from each other along the first direction X. The plurality of second impurity region groups 114 in this example are arranged alternately with the plurality of first impurity region groups 113 along the first direction X. The plurality of impurity regions 112 included in the second impurity region groups 114 each form a second Zener diode DZ2.

The second Zener diode DZ2 is electrically connected to the first Zener diode DZ1 via the base region 111. More specifically, the anode of the second Zener diode DZ2 is electrically connected to the anode of the first Zener diode DZ1. Thus, a bidirectional Zener diode DZ including the second Zener diode DZ2 reverse-bias connected to the first Zener diode DZ1 is formed.

In this example, description has been made of an example in which the plurality of impurity regions 112 include the plurality of first impurity region groups 113 and the plurality of second impurity region groups 114. However, the plurality of impurity regions 112 may be constituted of one first impurity region group 113 and one second impurity region group 114.

In addition, the plurality of impurity regions 112 may be formed in a pattern in which impurity regions 112 electrically connected to the first terminal electrode 11 and impurity regions 112 electrically connected to the second terminal electrode 12 are alternately arranged in one column along the first direction X.

The plurality of impurity regions 112 may be constituted of two impurity regions 112 facing each other in the first direction X. In this case, one impurity region 112 is electrically connected to the first terminal electrode 11, and the other impurity region 112 is electrically connected to the second terminal electrode 12.

The forms and values of the plurality of impurity regions 112 such as planar shape, planar area, thickness, and n-type impurity concentration are selected freely and are not limited to particular forms and values. The specifications of the plurality of impurity regions 112 can adopt various forms and values according to electrical characteristics to be achieved.

Referring to FIG. 14, FIG. 15, and FIG. 17, the above-described principal surface insulating layer 38 is formed on the first principal surface 33 of the substrate 32. A plurality of contact holes 115 are formed in the principal surface insulating layer 38. The plurality of contact holes 115 expose the corresponding impurity regions 112 in one-to-one correspondence relation. Each of the contact holes 115 in this example has a planar area less than the planar area of the corresponding impurity region 112. Each of the contact holes 115 exposes an inward region of the corresponding impurity region 112 other than the periphery of the corresponding impurity region 112.

Referring to FIG. 17, the above-described internal electrode 39 is formed on the principal surface insulating layer 38. The internal electrode 39 in this example includes a plurality of first lead-out electrodes 116 and a plurality of second lead-out electrodes 117 in addition to the first pad electrode 41 and the second pad electrode 42 described above.

The plurality of first lead-out electrodes 116 are led out from the first pad electrode 41 toward the second pad electrode 42 and cover the corresponding first impurity region groups 113 in one-to-one correspondence relation. The plurality of first lead-out electrodes 116 are formed preferably in a comb-tooth shape as viewed in plan. The plurality of first lead-out electrodes 116 are entered in the corresponding contact holes 115 and are electrically connected to the corresponding impurity regions 112.

The plurality of first lead-out electrodes 116 may each include at least one kind among aluminum, copper, an aluminum alloy, and a copper alloy. The plurality of first lead-out electrodes 116 may each include at least one kind among an Al—Si—Cu alloy, an Al—Si alloy, and an Al—Cu alloy. The plurality of first lead-out electrodes 116 may include a same kind of conductive material as the first pad electrode 41 and/or the second pad electrode 42.

The plurality of second lead-out electrodes 117 are led out from the second pad electrode 42 toward the first pad electrode 41 and cover the corresponding second impurity region groups 114 in one-to-one correspondence relation. The plurality of second lead-out electrodes 117 are formed preferably in a comb-tooth shape meshing with the plurality of first lead-out electrodes 116 as viewed in plan. The plurality of second lead-out electrodes 117 are entered in the corresponding contact holes 115 and are electrically connected to the corresponding impurity regions 112.

The plurality of second lead-out electrodes 117 may each include at least one kind among aluminum, copper, an aluminum alloy, and a copper alloy. The plurality of second lead-out electrodes 117 may each include at least one kind among an Al—Si—Cu alloy, an Al—Si alloy, and an Al—Cu alloy. The plurality of second lead-out electrodes 117 may include a same kind of conductive material as the first pad electrode 41 and/or the second pad electrode 42.

The other structures are similar to the structures described in the foregoing first embodiment. From the above, also when the functional device FD includes the example diode D, effects similar to the effects described for the chip component 1 can be produced. The functional device FD (diode D) according to the first example may be incorporated in the chip component 101 according to the second embodiment.

Figure 18:
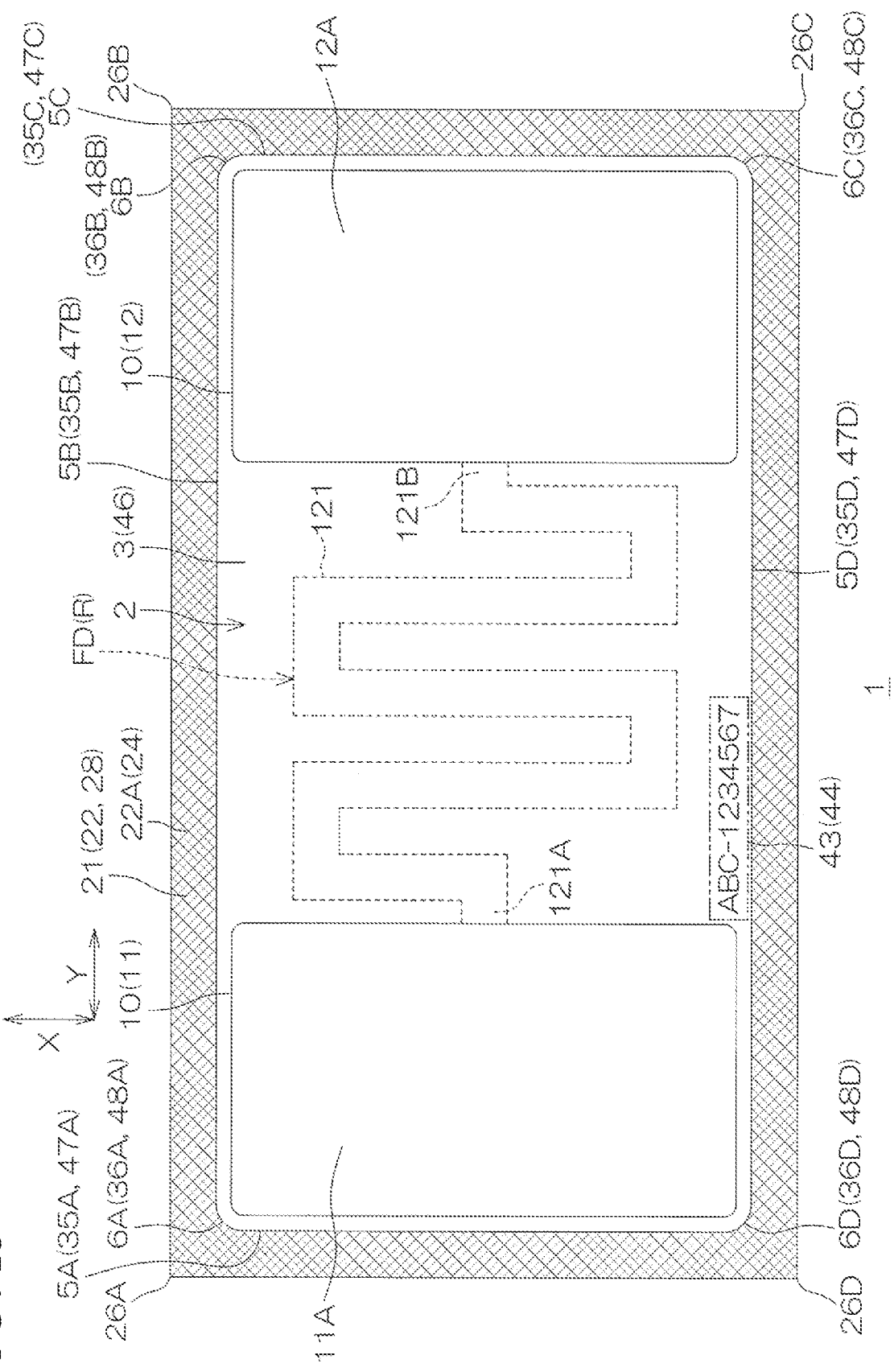
FIG. 18 is a plan view corresponding to FIG. 3 and is a plan view for explaining a functional device (resistance in this example) according to a second example, the functional device being incorporated in a chip component.
Figure 19:
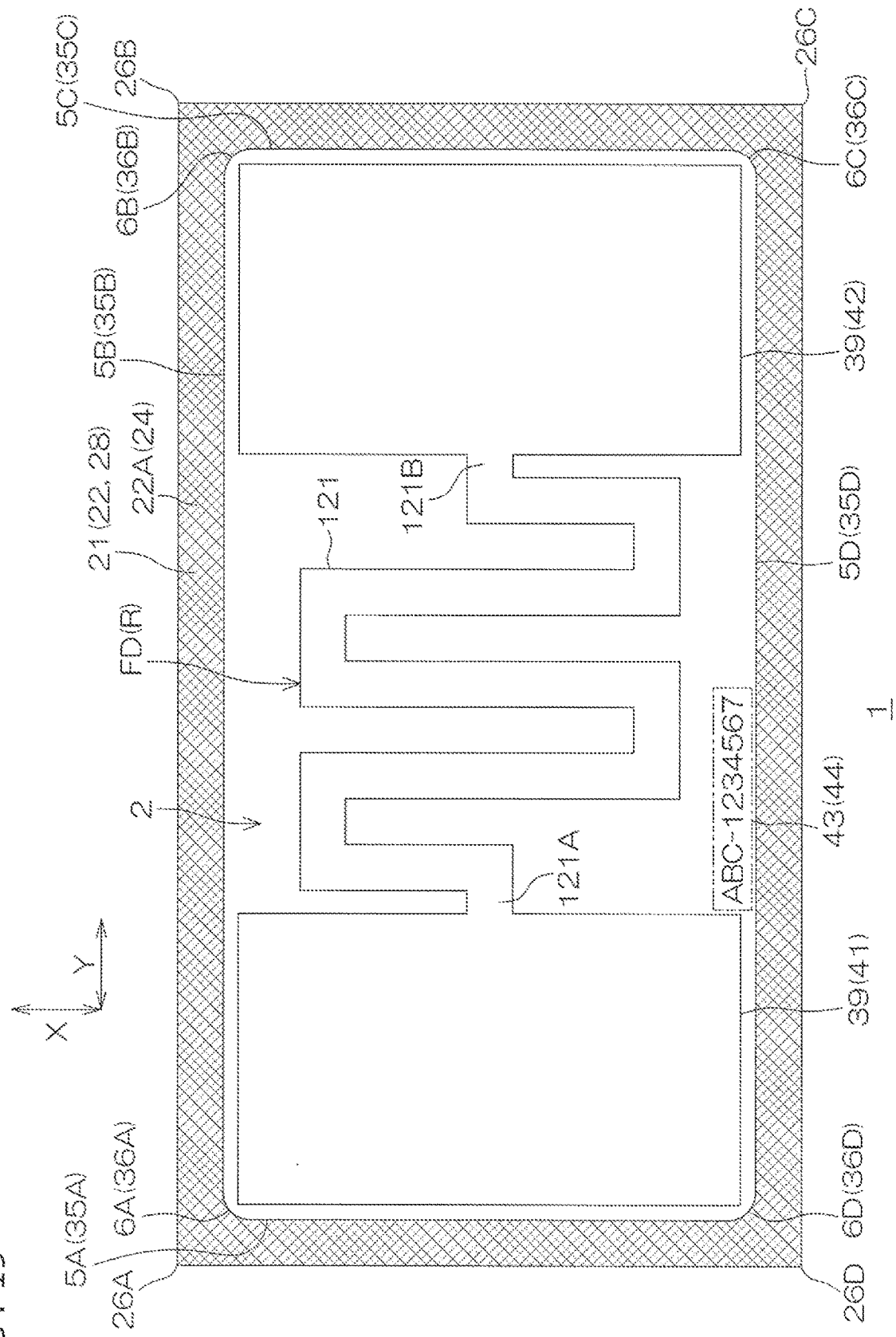
FIG. 19 is a plan view for explaining a structure of an internal electrode with a structure on the internal electrode removed from FIG. 18.

FIG. 18 is a plan view corresponding to FIG. 3 and is a plan view for explaining a functional device FD having resistance R according to a second example, the functional device being incorporated in the chip component 1. FIG. 19 is a plan view for explaining a structure of the internal electrode 39 with a structure on the internal electrode 39 removed from FIG. 18. In the following, structures corresponding to the structures described for the chip component 1 are identified by the same reference signs, and description thereof will be omitted.

Referring to FIG. 18 and FIG. 19, the functional device FD according to the second example includes a resistance R. The internal electrode 39 in this example includes a resistance conductor layer 121 in addition to the first pad electrode 41 and the second pad electrode 42. The resistance conductor layer 121 is selectively routed in a region between the first pad electrode 41 and the second pad electrode 42 on the principal surface insulating layer 38.

The resistance conductor layer 121 extends in a band shape in the region between the first pad electrode 41 and the second pad electrode 42. The resistance conductor layer 121 in this example is routed in a zigzag manner. The resistance conductor layer 121 may linearly extend in the region between the first pad electrode 41 and the second pad electrode 42.

The resistance conductor layer 121 includes a first end portion 121A on one side and a second end portion 121B on another side. The first end portion 121A of the resistance conductor layer 121 is connected to the first pad electrode 41. The second end portion 121B of the resistance conductor layer 121 is connected to the second pad electrode 42.

The resistance conductor layer 121 is preferably formed by a metallic material having a specific resistance higher than copper. The resistance conductor layer 121 may have a single layer structure including a Ti layer or a TiN layer. The resistance conductor layer 121 may have a laminated structure including a Ti layer and a TiN layer laminated in any order.

The other structures are similar to the structures described in the foregoing first embodiment. From the above, also when the functional device FD includes the resistance R, effects similar to the effects described for the chip component 1 can be produced. The functional device FD having resistance R according to the second example may be incorporated in the chip component 101 according to the second embodiment.

Figure 20:
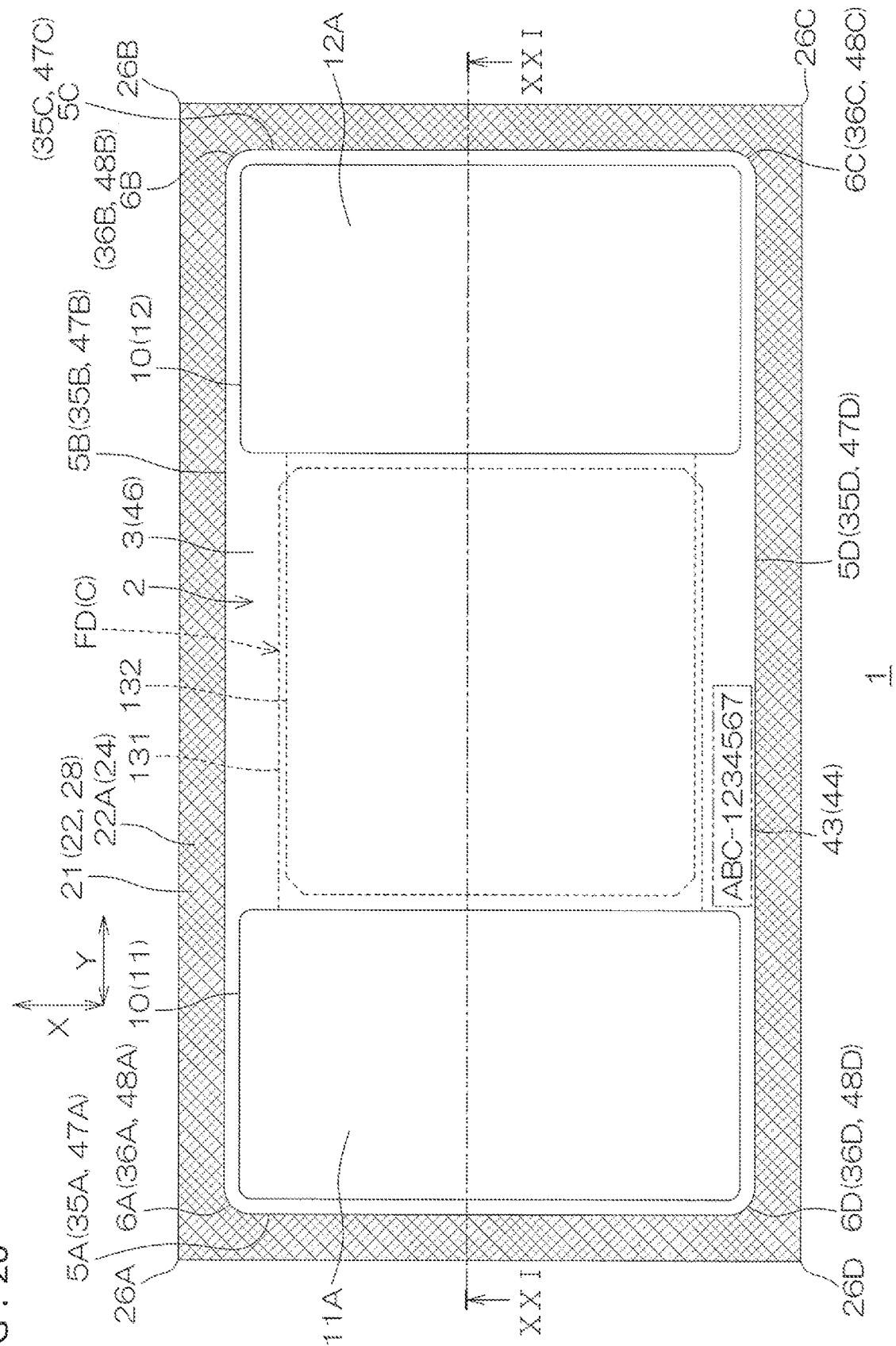
FIG. 20 is a plan view corresponding to FIG. 3 and is a plan view for explaining a functional device (capacitor in this example) according to a third example, the functional device being incorporated in a chip component.
Figure 21:
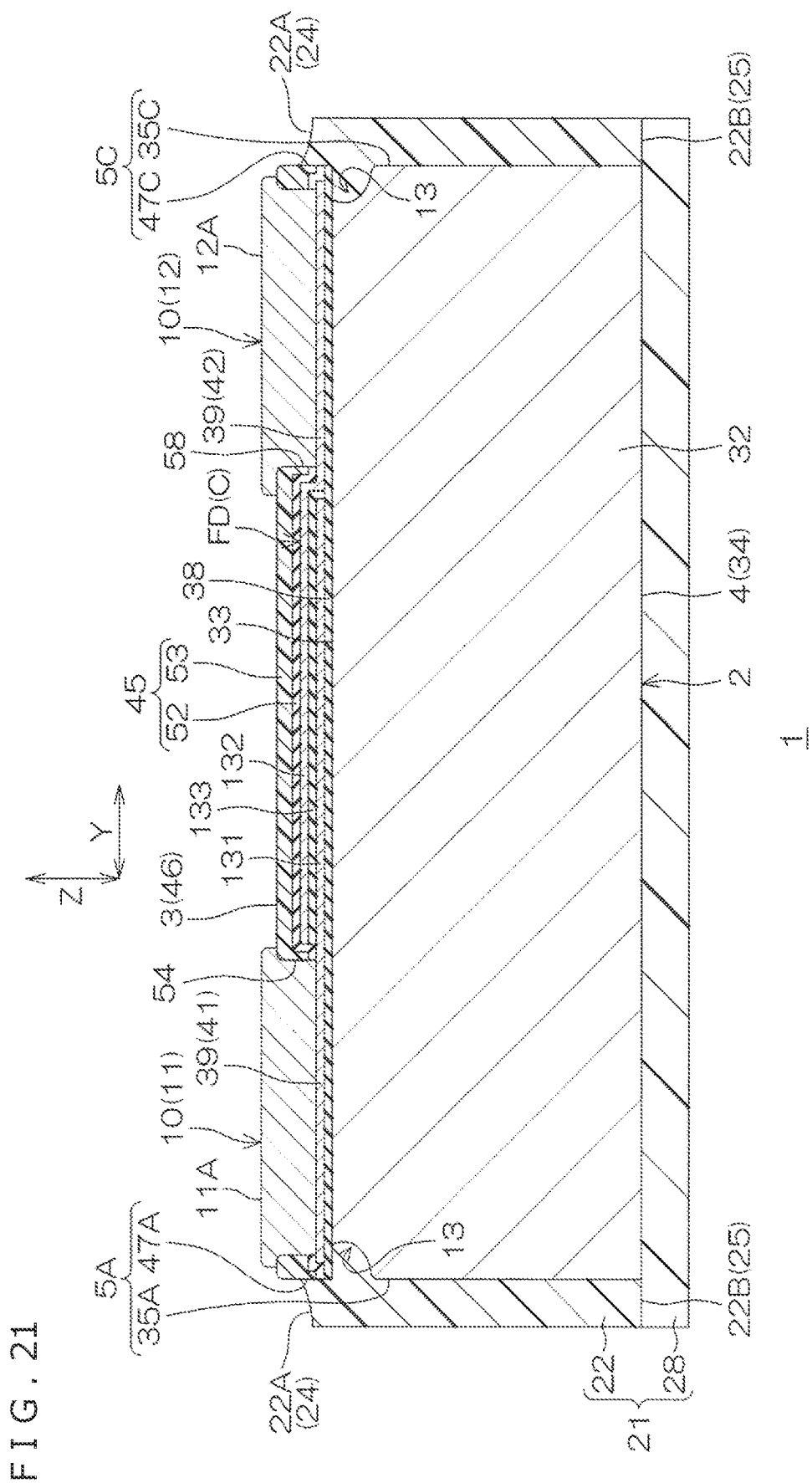
FIG. 21 is a sectional view taken along a line XXI-XXI illustrated in FIG. 20.

FIG. 20 is a plan view corresponding to FIG. 3 and is a plan view for explaining a functional device FD (capacitor C) according to a third example, the functional device being incorporated in the chip component 1. FIG. 21 is a sectional view taken along a line XXI-XXI illustrated in FIG. 20. In the following, structures corresponding to the structures described for the chip component 1 are identified by the same reference signs, and description thereof will be omitted.

Referring to FIG. 20 and FIG. 21, the functional device FD according to the third example includes a capacitor C. The internal electrode 39 in this example includes a first capacitor electrode 131 and a second capacitor electrode 132 in addition to the first pad electrode 41 and the second pad electrode 42. Further, the chip main body 2 in this example includes a dielectric layer 133 interposed between the first capacitor electrode 131 and the second capacitor electrode 132.

The first capacitor electrode 131 is formed on the principal surface insulating layer 38 together with the first pad electrode 41. The first capacitor electrode 131 is led out from the first pad electrode 41 toward the second pad electrode 42. The first capacitor electrode 131 in this example is formed in a quadrangular shape as viewed in plan.

The first capacitor electrode 131 may include at least one kind among aluminum, copper, an aluminum alloy, and a copper alloy. The first capacitor electrode 131 may include at least one kind among an Al—Si—Cu alloy, an Al—Si alloy, and an Al—Cu alloy. The first capacitor electrode 131 may include a same kind of conductive material as the first pad electrode 41 and/or the second pad electrode 42.

The dielectric layer 133 covers the first capacitor electrode 131 on the principal surface insulating layer 38. The dielectric layer 133 may have a single layer structure including a silicon oxide layer or a silicon nitride layer. The dielectric layer 133 may have a laminated structure including a silicon oxide layer and a silicon nitride layer laminated in any order. The dielectric layer 133 may have an ONO structure including a silicon oxide layer, a silicon nitride layer, and a silicon oxide layer laminated in this order from the chip main body 2 side.

The second capacitor electrode 132 is formed on the dielectric layer 133. The second capacitor electrode 132 is led out from the second pad electrode 42 toward the first pad electrode 41. The second capacitor electrode 132 in this example is formed in a quadrangular shape as viewed in plan. The second capacitor electrode 132 faces the first capacitor electrode 131 with the dielectric layer 133 interposed therebetween. A laminated structure of the first capacitor electrode 131, the dielectric layer 133, and the second capacitor electrode 132 forms the capacitor C.

The second capacitor electrode 132 may include at least one kind among aluminum, copper, an aluminum alloy, and a copper alloy. The second capacitor electrode 132 may include at least one kind among an Al—Si—Cu alloy, an Al—Si alloy, and an Al—Cu alloy. The second capacitor electrode 132 may include a same kind of conductive material as the first pad electrode 41 and/or the second pad electrode 42.

The other structures are similar to the structures described in the foregoing first embodiment. From the above, also when the functional device FD includes the capacitor C, effects similar to the effects described for the chip component 1 can be produced. The functional device FD (capacitor C) according to the third example may be incorporated in the chip component 101 according to the second embodiment.

Figure 22:
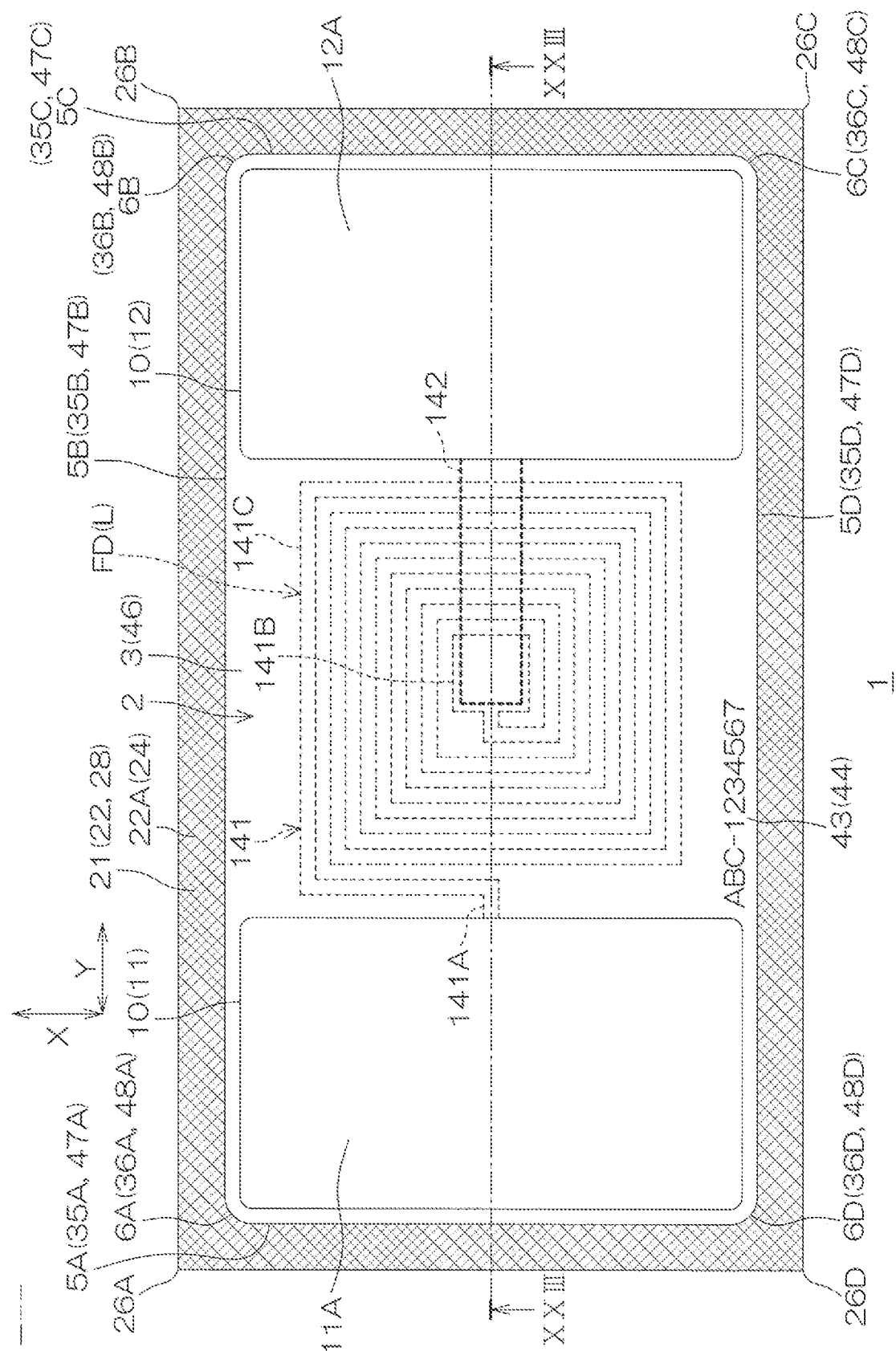
FIG. 22 is a plan view corresponding to FIG. 3 and is a plan view for explaining a functional device (coil in this example) according to a fourth example, the functional device being incorporated in a chip component.
Figure 23:
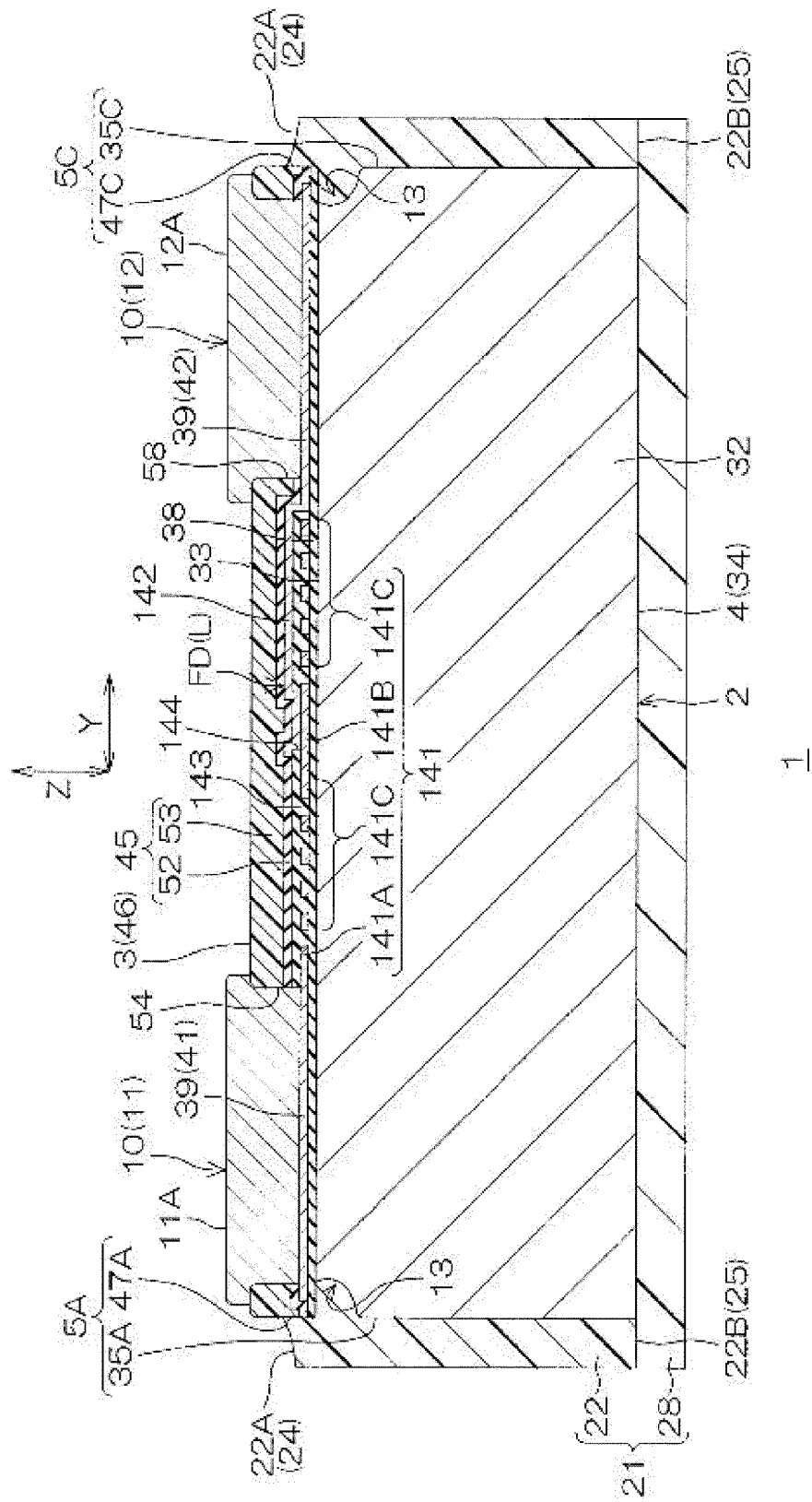
FIG. 23 is a sectional view taken along a line XXIII-XXIII illustrated in FIG. 22.

FIG. 22 is a plan view corresponding to FIG. 3 and is a plan view for explaining a functional device FD (coil L) according to a fourth example, the functional device being incorporated in the chip component 1. FIG. 23 is a sectional view taken along a line XXIII-XXIII illustrated in FIG. 22.

Figure 24:
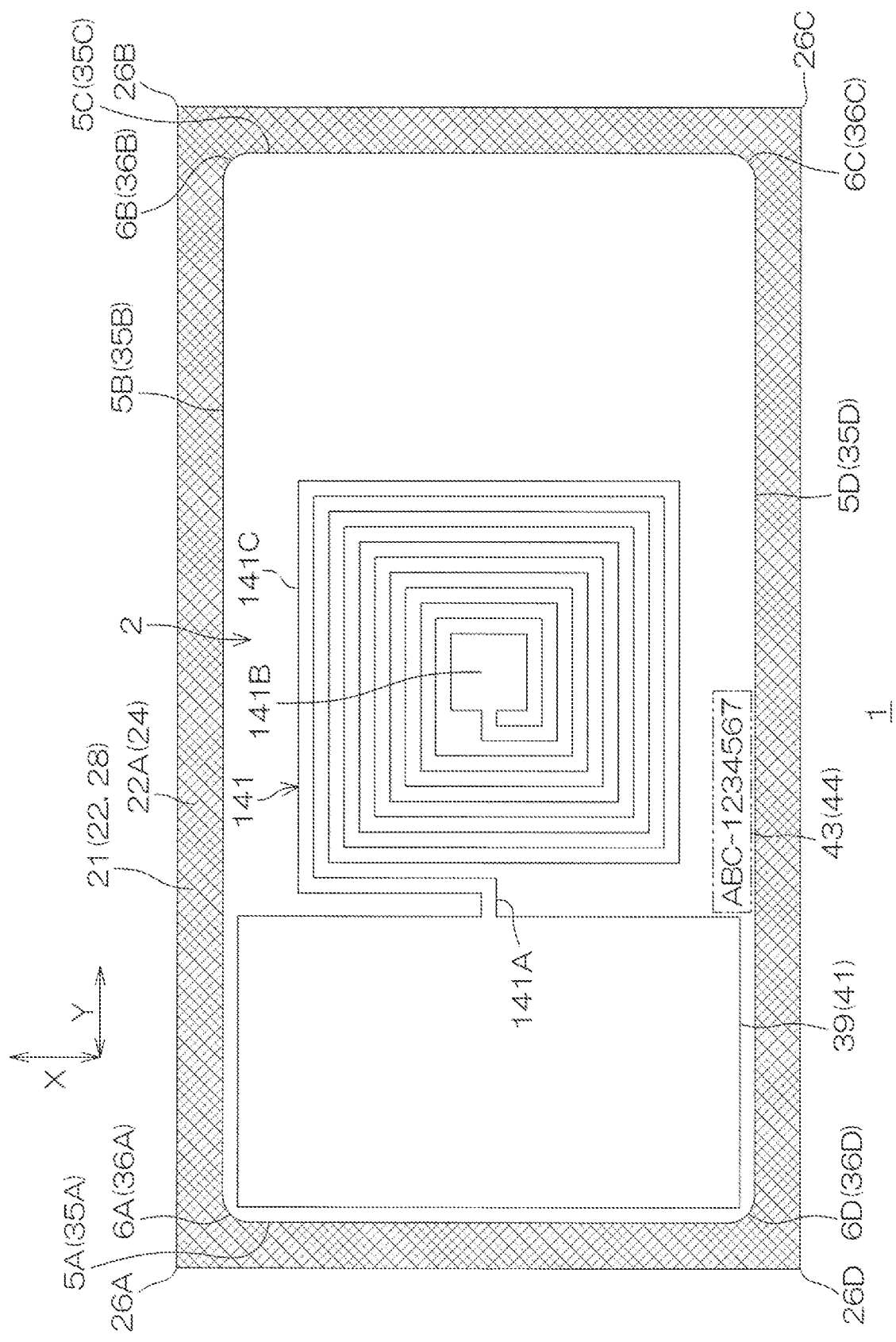
FIG. 24 is a plan view for explaining a structure of a part of an internal electrode with a structure on a first pad electrode removed from FIG. 22.
Figure 25:
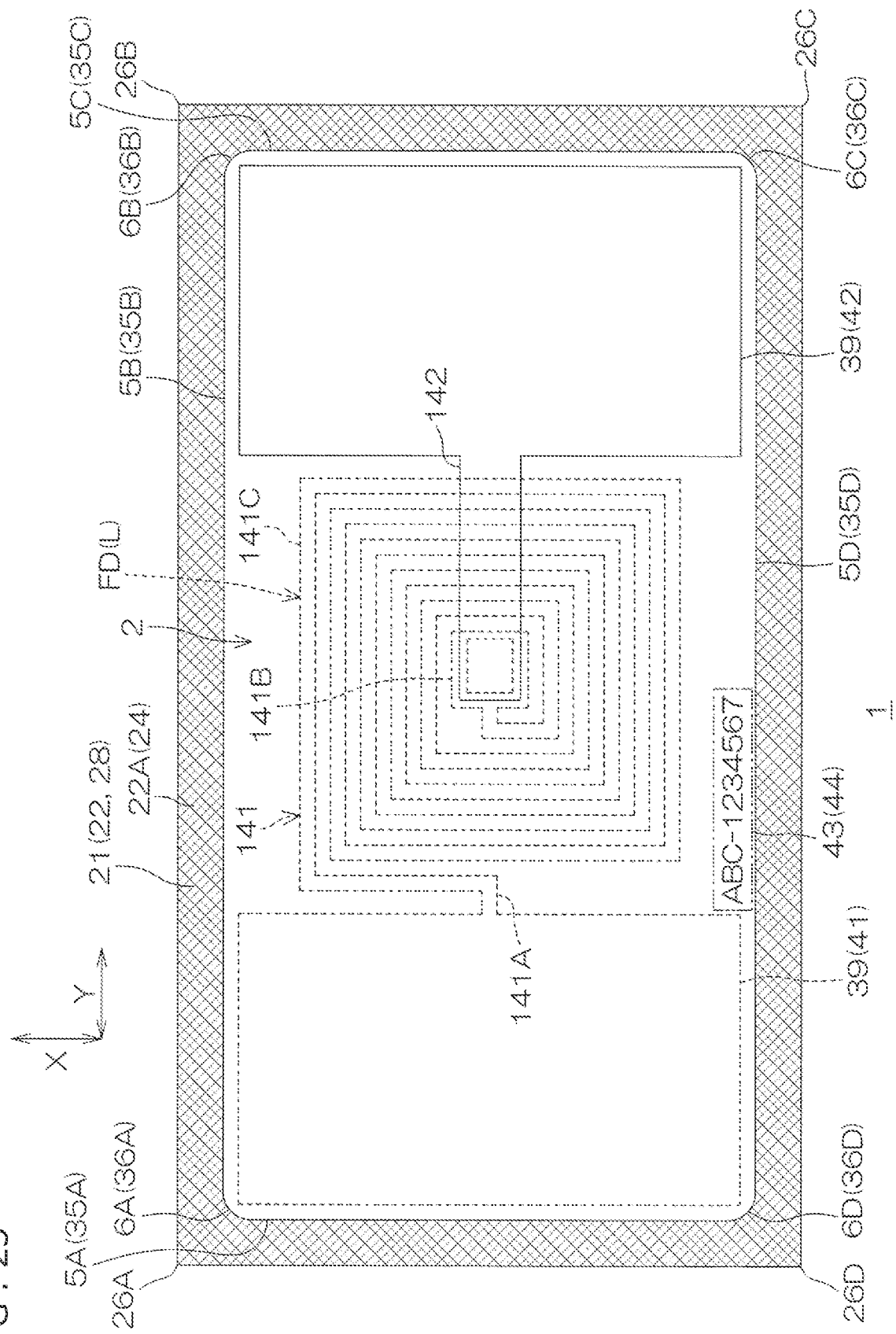
FIG. 25 is a plan view for explaining a structure of a part of the internal electrode with a structure on a second pad electrode removed from FIG. 22.

FIG. 24 is a plan view for explaining a structure of a part of the internal electrode 39 with a structure on the first pad electrode 41 removed from FIG. 22. FIG. 25 is a plan view for explaining a structure of a part of the internal electrode 39 with a structure on the second pad electrode 42 removed from FIG. 22. In the following, structures corresponding to the structures described for the chip component 1 are identified by the same reference signs, and description thereof will be omitted.

Referring to FIGS. 22 to 25, the functional device FD according to the fourth example includes a coil L. The internal electrode 39 in this example includes a coil conductor 141 and a lead-out electrode 142 in addition to the first pad electrode 41 and the second pad electrode 42. Further, the chip main body 2 in this example includes an intermediate insulating layer 143 interposed between the coil conductor 141 and the lead-out electrode 142.

The coil conductor 141 is formed on the principal surface insulating layer 38 together with the first pad electrode 41. The coil conductor 141 is formed in a region between the first terminal electrode 11 and the second terminal electrode 12 as viewed in plan. The coil conductor 141 includes a first coil end 141A on one side, a second coil end 141B on another side, and a spiral portion 141C.

The first coil end 141A of the coil conductor 141 is connected to the first pad electrode 41. The second coil end 141B of the coil conductor 141 is located in an inward region (central portion) of the first principal surface 33 of the substrate 32 as viewed in plan. The second coil end 141B forms a spiral center of the coil conductor 141. The spiral portion 141C is wound inward from the first coil end 141A to the second coil end 141B as viewed in plan.

The coil conductor 141 may include at least one kind among aluminum, copper, an aluminum alloy, and a copper alloy. The coil conductor 141 may include at least one kind among an Al—Si—Cu alloy, an Al—Si alloy, and an Al—Cu alloy. The coil conductor 141 may include a same kind of conductive material as the first pad electrode 41 and/or the second pad electrode 42.

The intermediate insulating layer 143 covers the coil conductor 141 on the principal surface insulating layer 38. The intermediate insulating layer 143 may have a single layer structure including a silicon oxide layer or a silicon nitride layer. The intermediate insulating layer 143 may have a laminated structure including a silicon oxide layer and a silicon nitride layer laminated in any order. A contact hole 144 that exposes the second coil end 141B of the coil conductor 141 is formed in the intermediate insulating layer 143.

The lead-out electrode 142 is formed on the intermediate insulating layer 143. The lead-out electrode 142 is led out from the second pad electrode 42 to the contact hole 144. The lead-out electrode 142 is entered in the contact hole 144. The lead-out electrode 142 is connected to the second coil end 141B of the coil conductor 141 within the contact hole 144.

The lead-out electrode 142 may include at least one kind among aluminum, copper, an aluminum alloy, and a copper alloy. The lead-out electrode 142 may include at least one kind among an Al—Si—Cu alloy, an Al—Si alloy, and an Al—Cu alloy. The lead-out electrode 142 may include a same kind of conductive material as the first pad electrode 41 and/or the second pad electrode 42.

The other structures are similar to the structures described in the foregoing first embodiment. From the above, also when the functional device FD includes the coil L, effects similar to the effects described for the chip component 1 can be produced. The functional device FD such as coil L according to the fourth example may be incorporated in the chip component 101 according to the second embodiment.

Embodiments of the present disclosure have been described above. However, the present disclosure can be carried out in yet other examples.

Figure 26:
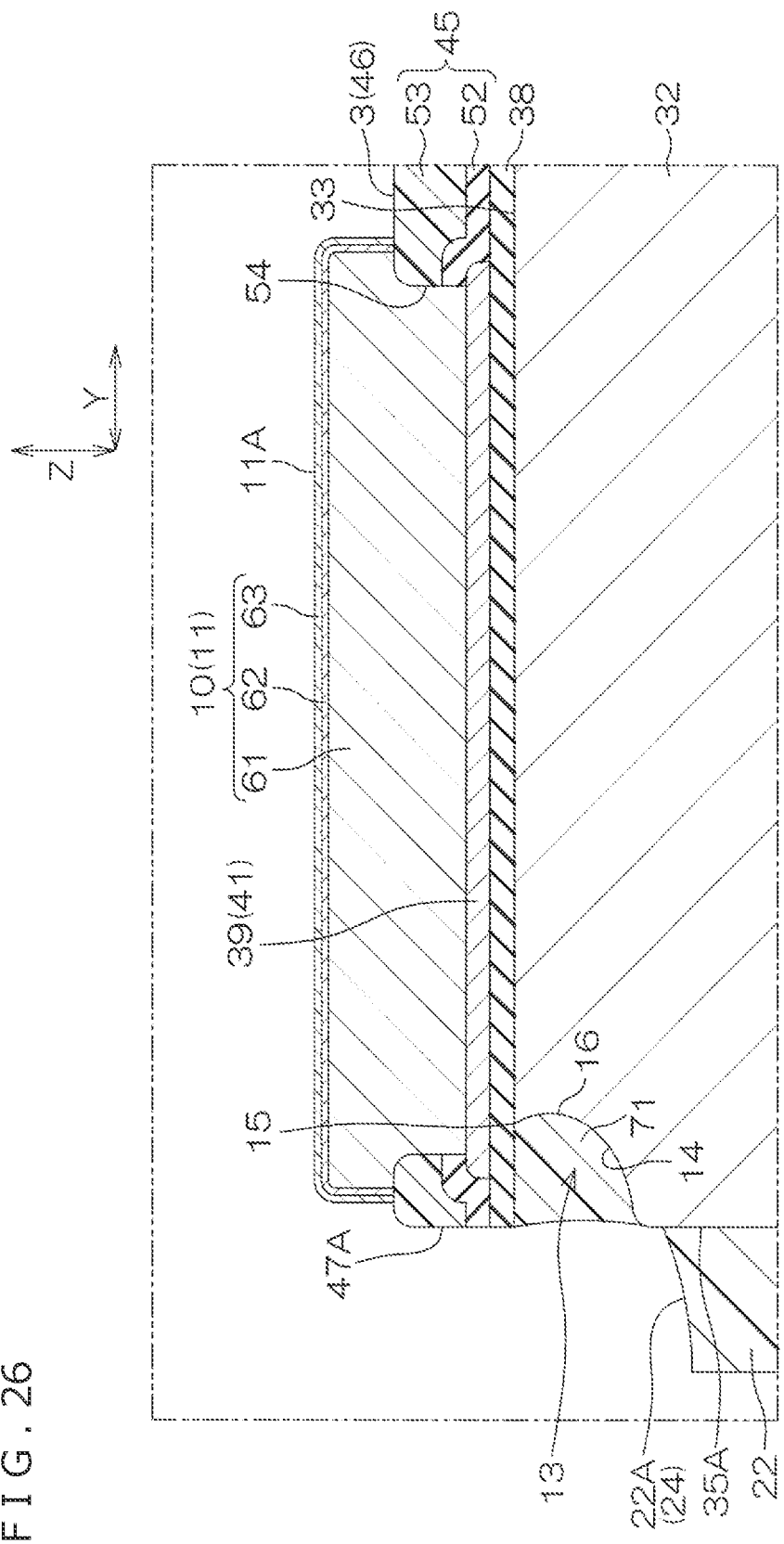
FIG. 26 is a fragmentary enlarged view of a chip component according to a third embodiment of the present disclosure.

For example, in the foregoing embodiments, an embedding material within the recessed portion 13 is preferably an integral part of the external surface resin 21 (side surface covering portion 22). However, as illustrated in FIG. 26, the embedding material within the recessed portion 13 may be an embedding resin 71 separate and distinct from the external surface resin 21. The embedding resin 71 may be formed of a same kind of resin material as the external surface resin 21. The structure of FIG. 26 may occur when the amount of removal of the first base resin layer 99 is large in the process of FIG. 10K, for example. That is, even in a case where the first base resin layer 99 is removed from an upper side (first wafer principal surface 83 side), the first base resin layer 99 within the recessed portion 13 is not removed, but remains as the embedding resin 71, because the recessed portion 13 bulges to the inside of the chip forming region 91. According also to this structure, because the embedding resin 71 is embedded in the recessed portion 13, even when a joining material such as solder wets up to the side surfaces 35A to 35D of the substrate 32 during mounting of the chip component 1, the embedding resin 71 embedded in the recessed portion 13 can prevent contact between the substrate 32 and the joining material.

In addition, in each of the foregoing embodiments, the substrate 32 may be a semiconductor substrate or an insulating substrate. In a case where the chip component 1 includes a functional device FD utilizing the properties of semiconductors (for example, the diode D or another semiconductor device), a semiconductor substrate is employed as the substrate 32. In a case where the chip component 1 includes a functional device FD not utilizing the properties of semiconductors (for example, the resistance R, the capacitor C, the coil L, or another electronic component), a semiconductor substrate or an insulating substrate is employed as the substrate 32.

The substrate 32 may be a silicon substrate, a silicon carbide substrate, or a nitride semiconductor substrate as an example of a semiconductor substrate. The substrate 32 may be a glass substrate, a ceramic substrate, a sapphire substrate, or a resin substrate as an example of an insulating substrate.

In a case where the substrate 32 is formed by a semiconductor substrate, the chip components 1 and 101 can be manufactured by using semiconductor manufacturing processes. Even in a case where the substrate 32 is formed by a semiconductor substrate, performance equivalent to that of an insulating substrate is obtained by forming the principal surface insulating layer 38 on the first principal surface 33. In a case where the substrate 32 is formed by an insulating substrate, the principal surface insulating layer 38 may be omitted. In view of manufacturing cost, the substrate 32 is preferably formed by a silicon substrate excellent in availability and processability irrespective of the properties of the functional device FD.

In each of the foregoing embodiments, the chip components 1 and 101 including a plurality of functional devices FD (the diode D, the resistance R, the capacitor C, or the coil L) according to the first example, the second example, the third example, or the fourth example may be formed.

In each of the foregoing embodiments, the chip components 1 and 101 simultaneously including at least two kinds of functional devices FD (the diode D, the resistance R, the capacitor C, and the coil L) according to the first example, the second example, the third example, and the fourth example may be formed.

Figure 27:
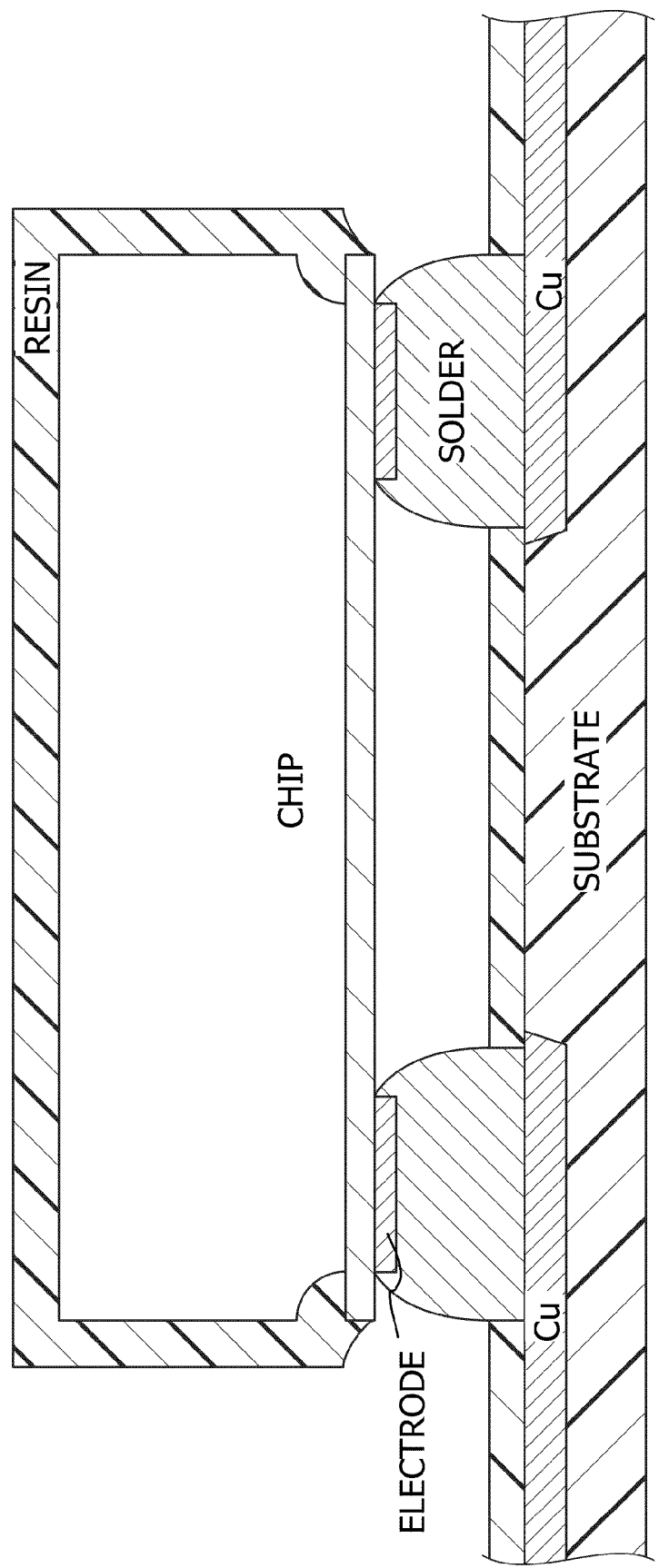
FIG. 27 is a view of a semiconductor chip which is mounted on a connection target.

In addition, as illustrated in FIG. 27, the chip component according to each of the embodiments is configured such that the first principal surface side of the chip main body is opposed to a connection target such, for example, as a printed board when connected to the connection target.

Moreover, the embodiments of the present disclosure can be suitably changed in various manners within the technical scope specified in claims. The foregoing embodiments are examples of the embodiments of the present disclosure, and improved chip component and the features of the present disclosure are not limited to specific details described in the embodiments, the terms used in this specification, or the features described above. Features from one embodiment may be added to another embodiment, and features may be removed from an embodiment or a combination of embodiments, without departing from the spirit of the innovations described in this specification. Particular numerical values, such as 1.0 mm, presented in the specification are mere examples and can naturally be altered to various other numerical values. Various design changes can be made within the scope of matters described in claims.

What is claimed is:

1. A chip component, comprising:
   a substrate having
      a first surface,
      a second surface on an opposite side from the first surface, and
      a third surface that connects the first surface to the second surface;
   an external surface resin that covers at least the third surface of the substrate, wherein
      the external surface resin includes an end portion on a first surface side of the substrate, and
      the end portion of the external surface resin has an inclined surface inclined with respect to the first surface;
   a terminal electrode disposed in the first surface of the substrate and exposed from the external surface resin; and
   a recessed portion formed in an end portion of the third surface of the substrate, wherein
      the end portion of the third surface is on the first surface side,
      the external surface resin is embedded in the recessed portion, and
      the recessed portion has an annular shape enclosing the first surface of the substrate as viewed in plan.

2. The chip component according to claim 1, further comprising an insulating layer that is formed on the first surface of the substrate and covers the recessed portion, wherein the recessed portion has a recessed surface continuous from the first surface of the substrate and the insulating layer.

3. The chip component according to claim 2, wherein the recessed surface bulges toward an inside of the substrate from an end edge of the first surface of the substrate as viewed in section and has a vertex portion located in a more inward region of the substrate than the end edge of the first surface.

4. The chip component according to claim 1, wherein the external surface resin has a shape of a film that is in direct contact with the third surface of the substrate.

5. The chip component according to claim 1, wherein the first surface of the substrate is a connecting surface that is configured to couple with a connection target when the chip component is connected to the connection target.

6. The chip component according to claim 1, wherein the external surface resin further includes a first part that covers the third surface of the substrate.

7. The chip component according to claim 6, wherein the first part of the external surface resin has an end surface located on a second surface side of the substrate with respect to a surface of the terminal electrode.

8. The chip component according to claim 1, wherein the external surface resin further includes a second part that covers the second surface of the substrate.

9. The chip component according to claim 8, wherein
   the second surface of the substrate is a ground surface having a grinding trace, and
   the second part of the external surface resin fills the grinding trace and covers the second surface of the substrate.

10. The chip component according to claim 1, wherein in a substrate thickness direction, a size of the recessed portion is equal to or more than 1 μm and is smaller than a thickness of the substrate.

11. The chip component according to claim 1, further comprising an insulating layer on the first surface of the substrate, wherein a peripheral edge portion of the insulating layer projects from an end edge of the first surface of the substrate and covers the recessed portion.

12. The chip component according to claim 1, wherein
   the third surface extends along a first direction,
   a recessed surface of the recessed portion includes a vertex portion, and
   in a second direction orthogonal to the first direction, the vertex portion is in a more inward region of the substrate than an end edge of the first surface of the substrate.

13. A method of manufacturing a chip component, comprising:
   in a chip forming region of a base substrate having a first surface in which the chip forming region is set and a second surface on an opposite side from the first surface, forming a terminal electrode on the first surface;
   forming, in the first surface of the base substrate, a recessed portion bulging outward beyond a border demarcating the chip forming region by selectively etching the base substrate from the first surface along the border;
   forming a groove integrated with the recessed portion by digging down a bottom portion of the recessed portion with a width smaller than the recessed portion in a thickness direction of the base substrate;
   forming a base resin layer that fills the groove and the recessed portion and covers the chip forming region;

removing an unnecessary part of the base resin layer, the unnecessary part covering the chip forming region, such that a part embedded in the groove and the recessed portion remains;

grinding the second surface of the base substrate until the base resin layer is exposed; and cutting out the chip component from the base substrate by cutting the base resin layer such that a part of the base resin layer, the part covering an inner surface of the groove, remains, wherein the chip component comprises:
- a substrate having
  - a first surface,
  - a second surface on an opposite side from the first surface of the substrate, and
  - a third surface that connects the first surface of the substrate to the second surface of the substrate;
- an external surface resin that covers at least the third surface of the substrate, wherein
  - the external surface resin includes an end portion on a first surface side of the substrate, and
  - the end portion of the external surface resin has an inclined surface inclined with respect to the first surface of the substrate;
- the terminal electrode disposed in the first surface of the substrate and exposed from the external surface resin; and the recessed portion formed in an end portion of the third surface of the substrate, wherein
- the end portion of the third surface is on the first surface side,
- the external surface resin is embedded in the recessed portion, and
- the recessed portion has an annular shape enclosing the first surface of the substrate as viewed in plan.

14. The method according to claim 13, wherein the step of removing the unnecessary part of the base resin layer removes the unnecessary part of the base resin layer by wiping away the unnecessary part of the base resin layer.

15. The chip component manufacturing method according to claim 13, wherein the step of grinding the second surface of the base substrate is performed after the step of removing the unnecessary part of the base resin layer.

16. The method according to claim 13, further comprising: forming a second base resin layer covering the second surface of the base substrate after the step of grinding the second surface of the base substrate and before the step of cutting out the chip component, wherein the step of cutting out the chip component cuts the base resin layer and the second base resin layer.

* * * * *